(12) United States Patent
Schmitt et al.

(10) Patent No.: US 12,025,683 B2
(45) Date of Patent: Jul. 2, 2024

(54) LENGTH DETECTOR WITH MAGNETORESITIVE ELEMENTS

(71) Applicant: Analog Devices International Unlimited Company, Limerick (IE)

(72) Inventors: Jochen Schmitt, Biedenkopf (DE); Jan Kubik, Raheen (IE)

(73) Assignee: Analog Devices International Unlimited Company, Limerick (IE)

( * ) Notice: Subject to any disclaimer, the term of this patent is extended or adjusted under 35 U.S.C. 154(b) by 256 days.

(21) Appl. No.: 17/655,463

(22) Filed: Mar. 18, 2022

(65) Prior Publication Data

US 2022/0206088 A1 Jun. 30, 2022

Related U.S. Application Data

(63) Continuation of application No. 15/466,578, filed on Mar. 22, 2017, now Pat. No. 11,294,003.

(Continued)

(51) Int. Cl.
*G01R 33/09* (2006.01)
*G01D 5/14* (2006.01)
(Continued)

(52) U.S. Cl.
CPC ............. *G01R 33/091* (2013.01); *G01D 5/16* (2013.01); *G01D 5/24438* (2013.01); *G01D 5/145* (2013.01)

(58) Field of Classification Search
CPC .......................... G01R 33/00; G01R 33/0005; G01R 33/0017; G01R 33/0023; G01R 33/0029;
(Continued)

(56) References Cited

U.S. PATENT DOCUMENTS 4,296,447 A 10/1981 Lewis
5,243,403 A 9/1993 Koo
(Continued)

FOREIGN PATENT DOCUMENTS

CN 100367001 C 2/2008
CN 100443914 C 12/2008
(Continued)

OTHER PUBLICATIONS

English machine translation of the description of DE 10 2005 037 036 A1, obtained from the European Patent Office website, obtained on Apr. 17, 2019, 9 pages (Year: 2019).
(Continued)

*Primary Examiner* — Hoai-An D. Nguyen
(74) *Attorney, Agent, or Firm* — Knobbe, Martens, Olson & Bear, LLP

(57) ABSTRACT

Apparatus and methods provide sensing of quadrants, angles, or distance using magnetoresistive elements. A quadrant or angle sensor can have magnetoresistive elements split into multiple angles to generate an output with reduced harmonics. A distance sensor can have magnetoresistive elements split and spaced apart to generate an output with reduced harmonics. A biasing conductor can alternatingly carry different amounts of current (different in at least one of magnitude or direction) for DC offset compensation or cancellation.

19 Claims, 43 Drawing Sheets

Related U.S. Application Data

(60) Provisional application No. 62/312,359, filed on Mar. 23, 2016.

(51) Int. Cl.
  *G01D 5/16* (2006.01)
  *G01D 5/244* (2006.01)

(58) Field of Classification Search
  CPC ........ G01R 33/02; G01R 33/06; G01R 33/09; G01R 33/091; G01R 33/093; G01R 33/095; G01R 33/096; G01R 33/098; G01D 5/00; G01D 5/12; G01D 5/14; G01D 5/145; G01D 5/16; G01D 5/244; G01D 5/24428; G01D 5/24433; G01D 5/24438
  USPC .... 324/200, 207.11, 207.12, 207.13, 207.21, 324/244, 252
  See application file for complete search history.

(56) References Cited

U.S. PATENT DOCUMENTS

| | | | |
|---|---|---|---|
| 5,351,005 | A | 9/1994 | Rouse |
| 5,521,501 | A | 5/1996 | Dettman et al. |
| 5,621,377 | A | 4/1997 | Dettman et al. |
| 6,064,202 | A | 5/2000 | Steiner et al. |
| 6,335,081 | B1 | 1/2002 | Araki et al. |
| 6,373,247 | B1 | 4/2002 | Marx |
| 6,433,545 | B1 | 8/2002 | Kunze et al. |
| 6,727,563 | B1 | 4/2004 | Hohe et al. |
| 6,768,301 | B1 | 7/2004 | Hohe et al. |
| 7,602,176 | B2 | 10/2009 | Butzmann |
| 7,656,630 | B2 | 2/2010 | Bonvalot et al. |
| 7,746,065 | B2 | 6/2010 | Pastre et al. |
| 7,818,890 | B2 | 10/2010 | Duric et al. |
| 7,969,149 | B2 | 6/2011 | Shoji |
| 8,058,864 | B2 | 11/2011 | Sheller et al. |
| 8,125,221 | B2 | 2/2012 | Muthers |
| 8,587,299 | B2 | 11/2013 | van Veldhoven et al. |
| 8,593,134 | B2 | 11/2013 | Haratani et al. |
| 8,664,941 | B2 | 3/2014 | Sebastiano et al. |
| 8,680,850 | B2 | 3/2014 | Zieren et al. |
| 8,680,856 | B2 | 3/2014 | Schmitt |
| 9,170,281 | B2 | 10/2015 | Hayashi et al. |
| 9,261,570 | B2 | 2/2016 | Obana et al. |
| 9,310,446 | B2 | 4/2016 | Kubik |
| 11,187,763 | B2 | 11/2021 | Schmitt et al. |
| 11,294,003 | B2 | 4/2022 | Schmitt et al. |
| 2002/0180431 | A1 | 12/2002 | Torok |
| 2003/0094944 | A1 | 5/2003 | Suzuki |
| 2003/0151406 | A1 | 8/2003 | Wan et al. |
| 2004/0111906 | A1 | 6/2004 | Abe |
| 2008/0088996 | A1 | 4/2008 | Bonvalot et al. |
| 2008/0186635 | A1 | 8/2008 | Takenaga et al. |
| 2009/0051353 | A1 | 2/2009 | Takeya et al. |
| 2009/0189601 | A1 | 7/2009 | Okada |
| 2009/0212771 | A1 | 8/2009 | Cummings et al. |
| 2010/0264909 | A1 | 10/2010 | Sheller et al. |
| 2010/0321010 | A1 | 12/2010 | van Veldhoven et al. |
| 2011/0018533 | A1 | 1/2011 | Cesaretti et al. |
| 2011/0031960 | A1 | 2/2011 | Hohe et al. |
| 2012/0081111 | A1 | 4/2012 | Kim et al. |
| 2012/0165656 | A1 | 6/2012 | Montag |
| 2013/0049748 | A1 | 2/2013 | Sebastiano et al. |
| 2013/0099783 | A1 | 4/2013 | Kubik |
| 2013/0320972 | A1 | 12/2013 | Loreit et al. |
| 2014/0111192 | A1 | 4/2014 | Kubik |
| 2015/0002142 | A1 | 1/2015 | Kubik |
| 2015/0091560 | A1 | 4/2015 | Deak et al. |
| 2015/0285873 | A1 | 10/2015 | Cai |
| 2016/0313411 | A1 | 10/2016 | Koike |
| 2017/0131368 | A1 | 5/2017 | Kubik |
| 2017/0276514 | A1 | 9/2017 | Schmitt et al. |
| 2017/0276740 | A1 | 9/2017 | Schmitt et al. |
| 2017/0322052 | A1 | 11/2017 | Paul |

FOREIGN PATENT DOCUMENTS

| | | | | |
|---|---|---|---|---|
| CN | 102292648 | A | 12/2011 | |
| CN | 102428381 | A | 4/2012 | |
| CN | 102565727 | A | 7/2012 | |
| CN | 103777154 | A | 5/2014 | |
| CN | 105277108 | B | * 9/2019 | ............ G01D 5/145 |
| DE | 4438715 | C1 | 5/1996 | |
| DE | 19648879 | | 11/1996 | |
| DE | 19722834 | | 5/1997 | |
| DE | 19839450 | A1 | 3/2000 | |
| DE | 19701137 | B4 | 1/2004 | |
| DE | 10243645 | | 6/2004 | |
| DE | 102004056384 | | 2/2006 | |
| DE | 102005037036 | | 4/2007 | |
| DE | 102009006144 | A1 | 10/2009 | |
| DE | 112008001024 | B4 | 2/2010 | |
| DE | 112010000890 | T5 | 9/2012 | |
| DE | 102005009923 | B4 | 11/2016 | |
| EP | 0707218 | | 8/1995 | |
| EP | 0628789 | B1 | * 8/1997 | ............ G01D 5/145 |
| EP | 1467218 | A2 | 10/2004 | |
| EP | 1 566 651 | | 8/2005 | |
| EP | 2671091 | B1 | 12/2014 | |
| JP | 2003-511672 | | 3/2003 | |
| JP | 2005-136134 | | 5/2005 | |
| JP | 2005-517937 | | 6/2005 | |
| JP | 2008-503778 | | 2/2008 | |
| JP | 2009-250931 | | 10/2009 | |
| JP | 2010-130325 | | 6/2010 | |
| JP | 2014-085339 | | 5/2014 | |
| JP | 2017102090 | A | * 6/2017 | ............ G01D 5/244 |
| KR | 20040081200 | | 9/2004 | |
| WO | WO 2009058290 | A1 | 5/2009 | |
| WO | WO 2011/136054 | | 11/2011 | |
| WO | WO 2012/103950 | | 8/2012 | |
| WO | WO 2013/129276 | | 9/2013 | |
| WO | WO 2015/011052 | | 1/2015 | |
| WO | WO 2015/175087 | | 11/2015 | |

OTHER PUBLICATIONS

German Exam Report of Apr. 9, 2019, for German Application No. 102017106322.6 filed Mar. 23, 2017, 9 pages.

German Examination Report dated Sep. 19, 2019, in German Patent Application No. 102017106324.2, 7 pages.

AS5030 Datasheet, 44 pages, © 1997-2013; ams AG; printed on Jul. 29, 2013 from: http://www.ams.com/eng/content/download/11929/212604/file/AS5030_Datasheet_v2-4.pdf.

KMA221 Programmable angle sensor product data sheet, Jul. 16, 2013, NXP B.V., downloaded from: http://www.nxp.com/documents/data_sheet/KMA221.pdf.

KMZ43T Magnetic Field Sensor Product data sheet, NXP B.V., Mar. 4, 2009, 8 pages, online, retrieved from the Internet at: <URL: http://www.nxp.com/documents/data_sheet/KMZ43T.pdf>.

AN211 Application Note: Applications of Magnetic Position Sensors, Honeywell Sensor Products, 8 pages, 01-02 Rev. Printed on Jul. 29, 2013. Downloaded from: http://www51.honeywell.com/aero/common/documents/Applications-of-Magnetic-Position-Sensors.pdf.

Magnetic Displacement Sensors, HMC1501/1512, Honeywell, 8 pages, Dec. 2010, downloaded from: http://www51.honeywell.com/aero/common/documents/myaerospacecatalog-documents/Missiles-Munitions/HMC1501-1512.pdf.

Magnetic Field Sensor KMR 360, HLPLANAR Technik, *HL-Planartechnik GmbH* 4 pages, online, retrieved from the Internet at: <URL: http://www.meas-spec.cn/manage/sensortypes/KMR360eng.pdf, May 12, 2003>.

Axel Bartos, Principle of a 360º Measurement Utilizing HL Planar's Sensor KMR360, Hlplanar Technik, Jan. 18, 2005, 10 pages. Originally available from: http://www.hlplanar.de.

(56) References Cited

OTHER PUBLICATIONS

Bilotti et al.; "Monolithic Magnetic Hall Sensor Using Dynamic Quadrature Offset Cancellation;" IEEE Journal of Solid-State Circuits; vol. 32, Issue 6; Jun. 1997; pp. 829-836.
Caruso, et al.; "A New Perspective on magnetic Field Sensing," May 1998, Honeywell, Inc.
Macintyre, Steven A., "Macintyre Electronic Design: Magnetic Field Measurement," Copyright 1999 by CRC Press, LLC.
Patterson, Mark, "Hall Effect and Magnetoresistance," University of Dayton, Feb. 27, 2007 in 9 pages.
European Search Report of Feb. 25, 2014 for European Patent Application No. 13188291.2, 13 pages.
Chinese Office Action of Nov. 4, 2015, for Chinese Application No. 201310486346.2 filed Oct. 17, 2013, 8 pages.
Chinese Office Action of Apr. 25, 2019, for Chinese Application No. 201710179177.6 filed Mar. 23, 2017, 7 pages.
Office Action of Apr. 24, 2019, received in U.S. Appl. No. 15/466,611, filed Mar. 22, 2017.
Office Action received in Chinese Application No. 201710179177.6 filed Mar. 23, 2017, 5 pages, mailed Jan. 19, 2020.

* cited by examiner

LENGTH DETECTOR WITH MAGNETORESITIVE ELEMENTS

CROSS-REFERENCE TO RELATED APPLICATIONS

This application is a continuation of U.S. Non-Provisional Application Ser. No. 15/466,578, filed Mar. 22, 2017, titled "MAGNETIC FIELD DETECTOR," which claims the benefit under 35 U.S.C. § 119(e) of U.S. Provisional Application No. 62/312,359, filed Mar. 23, 2016, titled "MAGNETIC FIELD DETECTOR," the disclosures of each which are hereby incorporated by reference in their entireties herein.

This application is related to an application titled MAGNETIC FIELD DIRECTION DETECTOR, Ser. No. 13/655,059, filed on Oct. 18, 2012, now U.S. Pat. No. 9,310,446, the disclosure of which is hereby incorporated by reference in its entirety herein.

BACKGROUND

Field of the Invention

The invention generally relates to electronics. In particular, the invention relates to magnetic field sensors.

Description of the Related Art

Magnetic field direction detectors, of the type described herein, can be used to resolve the direction of a magnetic field into one of a couple or several sectors. This can be very useful to resolve ambiguity from angular position sensors using magnets to track the rotary motion of an object. Such objects can include, for example, steering wheels, camshafts, crankshafts, wheels/tires, hubs, rotors, and the like. The rotational information can be used for antilock braking systems, for traction control, engine camshaft control, ignition and/or fuel injection timing, and the like.

SUMMARY

A quadrant or angle sensor can have magnetoresistive elements split into multiple angles to generate an output with reduced harmonics. A distance sensor can have magnetoresistive elements split and spaced apart to generate an output with reduced harmonics. A biasing conductor can alternatingly carry different amounts of current in (different in at least one of magnitude or direction) for DC offset compensation or cancellation.

One embodiment includes an apparatus comprising at least one of a magnetic field direction detector or a quadrant detector, wherein the apparatus includes: a first magnetic field detector having a plurality of groups of one or more magnetoresistive elements each, wherein the plurality of groups are arranged in a bridge configuration to generate a first half-bridge output signal and a second half-bridge output signal, the plurality of groups comprising at least a first group, a second group, a third group and a fourth group, wherein the one or more magnetoresistive elements of the first group are configured to carry current in a first current direction that is substantially parallel to a first axis that is at a first angle relative to a reference axis; wherein the one or more magnetoresistive elements of the second group are configured to carry current in a second current direction that is substantially parallel to a second axis that is at a second angle relative to the reference axis, wherein the second angle is different from the first angle; wherein the one or more magnetoresistive elements of the third group are configured to carry current in a third current direction that is substantially parallel to a third axis that is at a third angle relative to the reference axis, wherein the third angle is different from the first angle and the second angle; wherein the one or more magnetoresistive elements of the fourth group are configured to carry current in a fourth current direction that is substantially parallel to a fourth axis that is at a fourth angle relative to the reference axis, wherein the fourth angle is different from the first angle, the second angle, and the third angle; and a perturbation generator configured to generate a magnetic field bias for the first magnetic field detector.

One embodiment includes a method of determining at least one of a direction or quadrant of a magnetic field, wherein the method includes: generating a first half-bridge output signal and a second half-bridge output signal from a plurality of groups of one or more magnetoresistive elements each of a first magnetic field detector, wherein the one or more magnetoresistive elements of the first group are configured to carry current in a first current direction that is substantially parallel to a first axis that is at a first angle relative to a reference axis; wherein the one or more magnetoresistive elements of the second group are configured to carry current in a second current direction that is substantially parallel to a second axis that is at a second angle relative to the reference axis, wherein the second angle is different from the first angle; wherein the one or more magnetoresistive elements of the third group are configured to carry current in a third current direction that is substantially parallel to a third axis that is at a third angle relative to the reference axis, wherein the third angle is different from the first angle and the second angle; wherein the one or more magnetoresistive elements of the fourth group are configured to carry current in a fourth current direction that is substantially parallel to a fourth axis that is at a fourth angle relative to the reference axis, wherein the fourth angle is different from the first angle, the second angle, and the third angle; and generating a magnetic field bias for the first magnetic field detector.

One embodiment includes an apparatus comprising a magnetic field sensor, wherein the apparatus includes: a first magnetic field detector having a plurality of magnetoresistive elements arranged in at least two angles, the first magnetic field detector having a first half bridge output signal; one or more biasing conductors adjacent the magnetoresistive elements; a biasing circuit configured to pass a first amount of current through the one of more biasing conductors for a first phase of a sensing cycle and to pass a second amount of current through the one or more biasing conductors for a second phase of the sensing cycle, wherein the first amount is different from the second amount in at least one of magnitude or direction; and a differencing circuit configured to form a difference between a level of the first half bridge output signal encountered during the first phase and a level of the first half bridge output signal encountered during the second phase.

One embodiment includes a method of sensing a magnetic field with reduced offsets, wherein the method includes: in a first phase of a sensing cycle, generating a first half bridge output signal from a first magnetic field detector while passing a first amount of current via a biasing circuit through one of more biasing conductors, wherein the first magnetic field detector has a plurality of magnetoresistive elements arranged in at least two angles, wherein the one or more biasing conductors are adjacent the magnetoresistive elements; in a second phase of the sensing cycle, generating the first half bridge output signal while passing a second amount of current through the one or more biasing conductors, wherein the first amount is different from the second amount in at least one of magnitude or direction; and via a differencing circuit, forming a difference between a level of the first half bridge output signal encountered during the first phase and a level of the first half bridge output signal encountered during the second phase to sense the magnetic field.

BRIEF DESCRIPTION OF THE DRAWINGS

Embodiments of the present invention will be described, by way of non-limiting example only, with reference to the accompanying drawings, in which.

DETAILED DESCRIPTION OF SPECIFIC EMBODIMENTS

Figure 1:
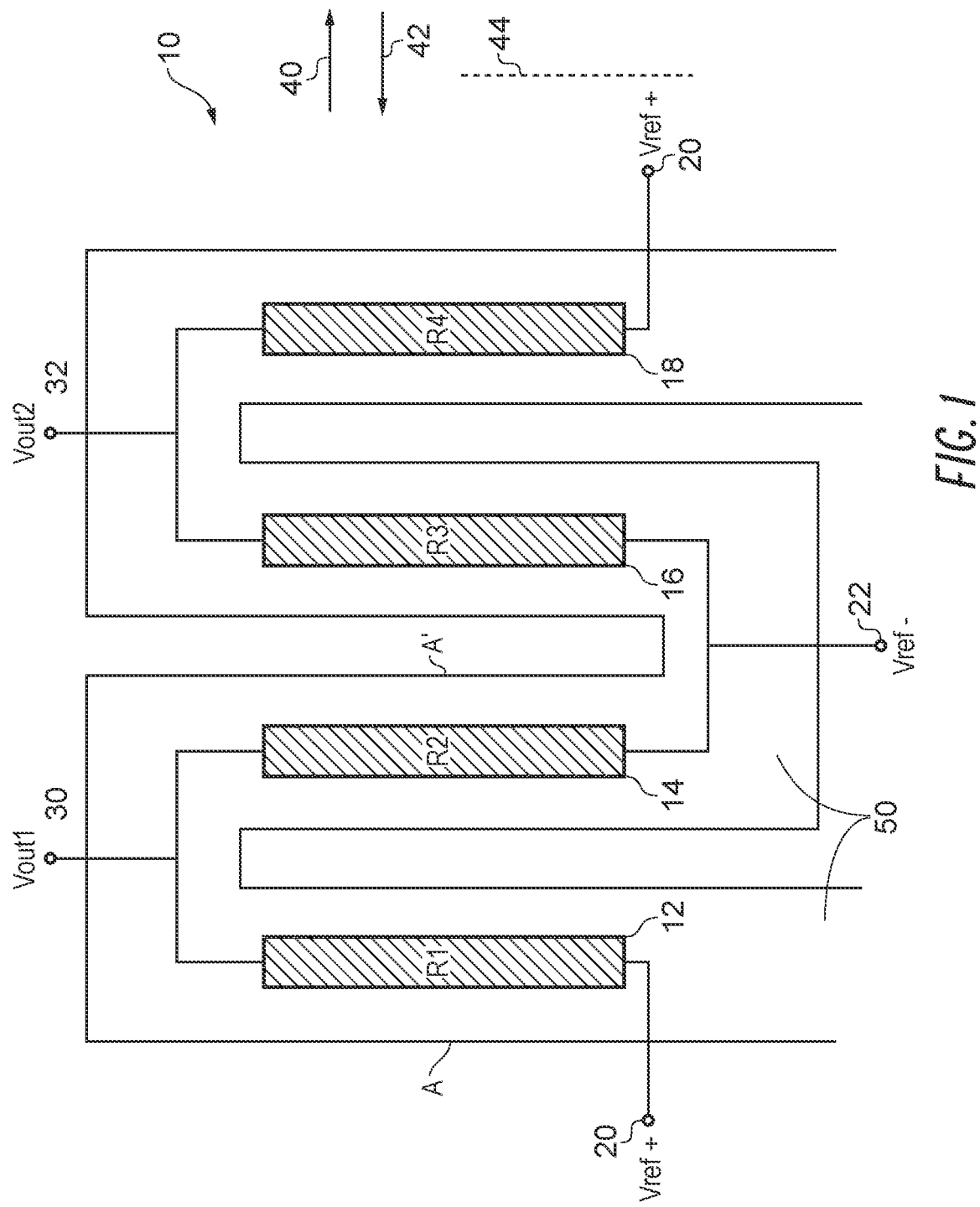
FIG. 1 is a schematic view of an embodiment of a magnetic field direction detector.

Various aspects of the novel systems, apparatuses, and methods are described more fully hereinafter with reference to the accompanying drawings. Aspects of this disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to encompass such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to various systems and technologies, some of which are illustrated by way of example in the figures and in the following description of the preferred aspects. The detailed description and drawings are merely illustrative of the disclosure rather than limiting, the scope of the disclosure being defined by the appended claims and equivalents thereof.

In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a plan view of a first embodiment of a magnetic field direction detector. The magnetic field direction detector 10 comprises first to fourth magneto-resistors 12, 14, 16 and 18 having respective resistances R1 to R4. The first and second magneto-resistors 12 and 14 are connected in series between a first reference node 20 and a second reference node 22. For convenience the first reference node 20 may, in use, be connected to receive a first reference voltage Vref+ and the second reference node may receive a second reference Vref−. These voltages may, advantageously, be provided by stabilized voltage references. Under circumstances where the reference voltages Vref+ and Vref− are well controlled, then a direction detector need only have one of the first and second magneto-resistors 12 and 14. However, for greater immunity to voltage variation, to detector temperature drift and for enhanced sensitivity it is advantageous to provide the third and fourth resistors 16 and 18, so as to form a bridge configuration as shown in FIG. 2.

Figure 2:
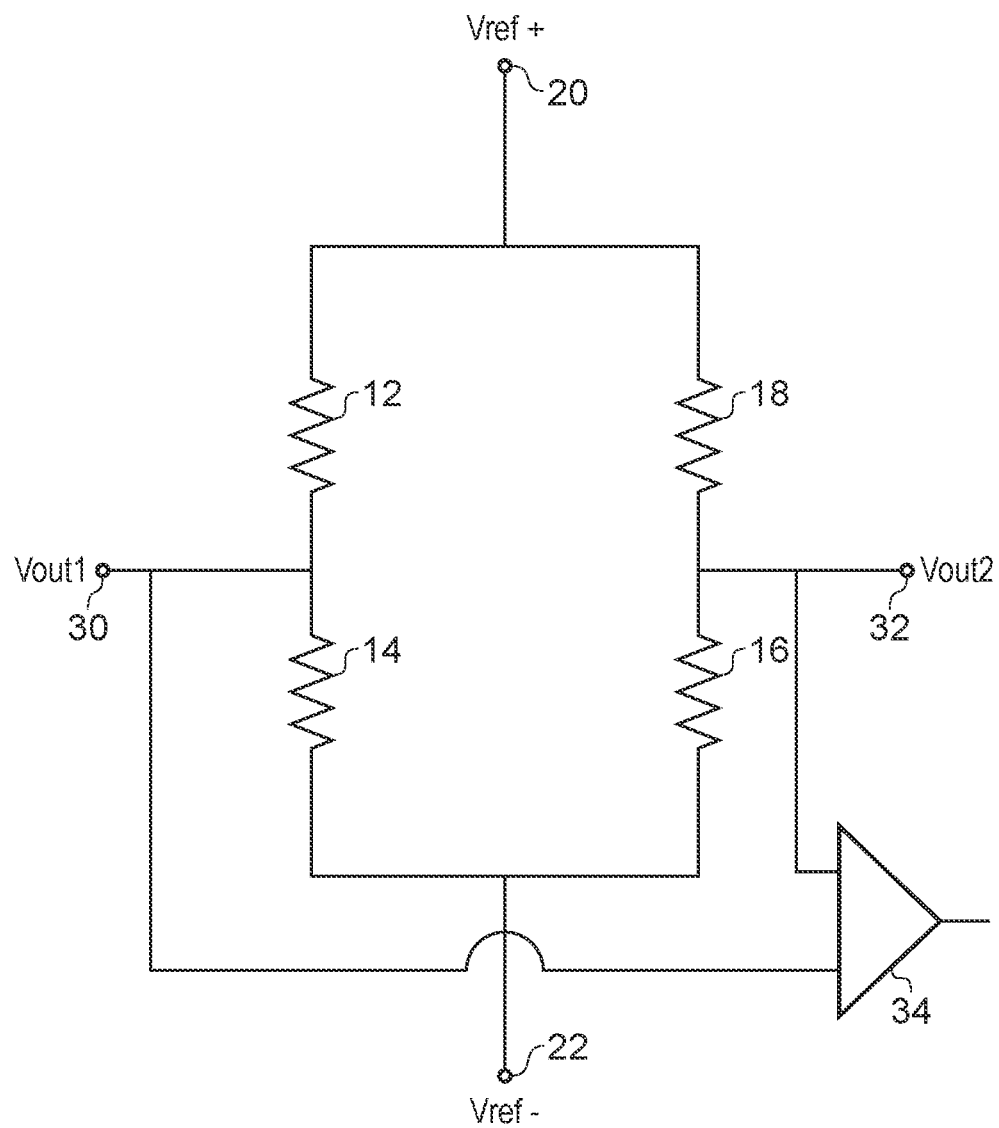
FIG. 2 is an equivalent circuit of the detector illustrated in FIG. 1.

Referring to FIG. 2, the bridge is formed by connecting a first end of the first magneto-resistor 12 to the first reference node 20 and a second end to a first output node 30 and to a first end of the second magneto-resistor 14. A second end of the second magneto-resistor 14 is connected to the second voltage reference node 22.

Similarly, a first end of the fourth resistor 18 is connected to the first reference node 20. A second end of the fourth resistor is connected to a second output node 32 and to a first end of the third magneto-resistor 16. A second end of the third magneto-resistor 16 is connected to the second reference node 22.

In use the output voltages at the first and second output nodes can be compared with each other to determine whether the magnetic field has a component that is in a first direction, designated by arrow 40 (FIG. 1), or a second direction 42 opposed to the first direction 40. Thus the sensor is responsive to the direction of a magnetic field with respect to a detection axis 44 and acts to determine if the magnetic field has a component of field from a first side or a second side of the detection axis. The comparison may be performed by a comparator or differential amplifier 34.

The first to fourth magneto-resistors 12 to 18 are disposed in a first plane that is offset from a second plane which carries a perturbation generator for perturbing the magnetic field at the magneto-resistors. The perturbation generator may be a magnetized piece of material so as to generate a permanent field. However, in the context of integrated circuits it is often more convenient to use an electric current flowing in a conductor to generate the perturbation. This has the advantage that the magnitude and direction of the perturbation can be changed by drive circuitry. This is useful when determining the sensitivity of the magnetic field direction detector, or when performing steps to enhance signal processing, such as auto-zeroing actions to measure and/or compensate for offsets occurring in amplifiers or comparators connected to the output terminals 30 and 32.

Figure 3:
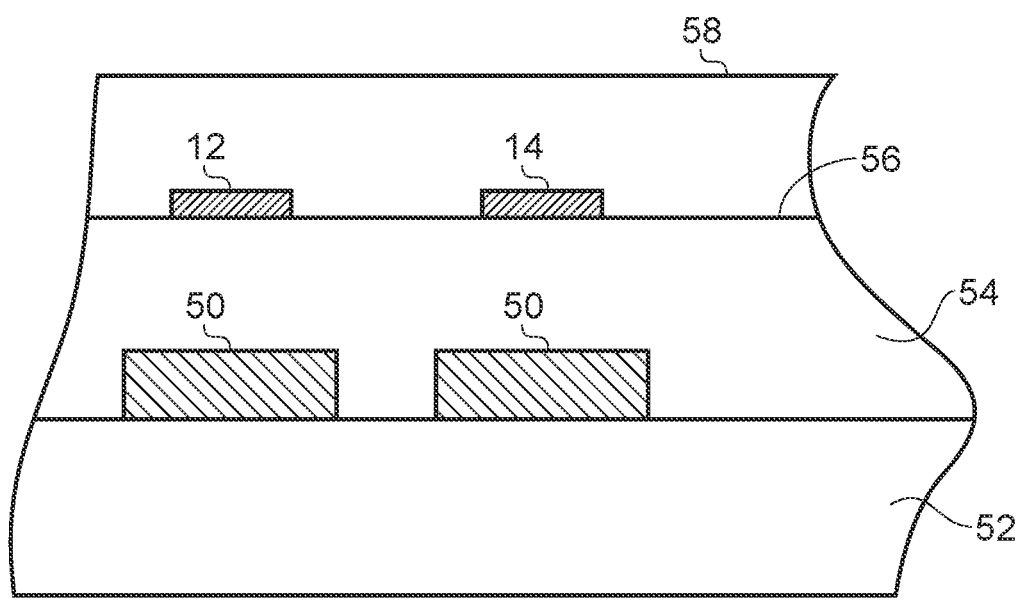
FIG. 3 is a cross section along the line A-A' of FIG. 1.

FIG. 3 is a cross section along the line A-A' of FIG. 1, and showing the first and second magneto-resistors 12 and 14, and the perturbation generator 50 formed by a conductive element. The conductive element is formed over a substrate, such as a silicon substrate 52 or a layer of an insulator, such as polyamide over a silicon substrate. The conductive element is itself surrounded by and embedded within an insulator 54, such as polyamide. The insulator 54 may, during manufacture of the magnetic field direction detector, be planarized so as to form a planar surface 56 over which the magneto-resistors 12 and 14 are deposited. The resistors are then enclosed in a protective layer 58 to protect them from environmental damage.

These steps are conventional to the person skilled in the art of device fabrication and need not be described here. It can be seen that with the magneto-resistors positioned as shown in FIG. 3, that they will be subjected to a magnetic flux due to current flowing in the conductor of the perturbation generator 50.

Returning to FIG. 1, it can be observed that the perturbation generator 50 has a folded path such that if the current flowing beneath the first magneto-resistor 12 has a first direction (say upwardly as shown in FIG. 1 and into the plane of the page of FIG. 3) then the current flowing beneath the second magneto-resistor 14 flows in an opposing direction (down the page of FIG. 1 and out of the plane of FIG.

3). Thus, when the perturbation generator 50 is carrying a current, different perturbing magnetic fields occur at the first magneto-resistor 12 and the second magneto-resistor 14.

Exactly the same effect also occurs at the third and fourth resistors 16 and 18.

Figure 4:
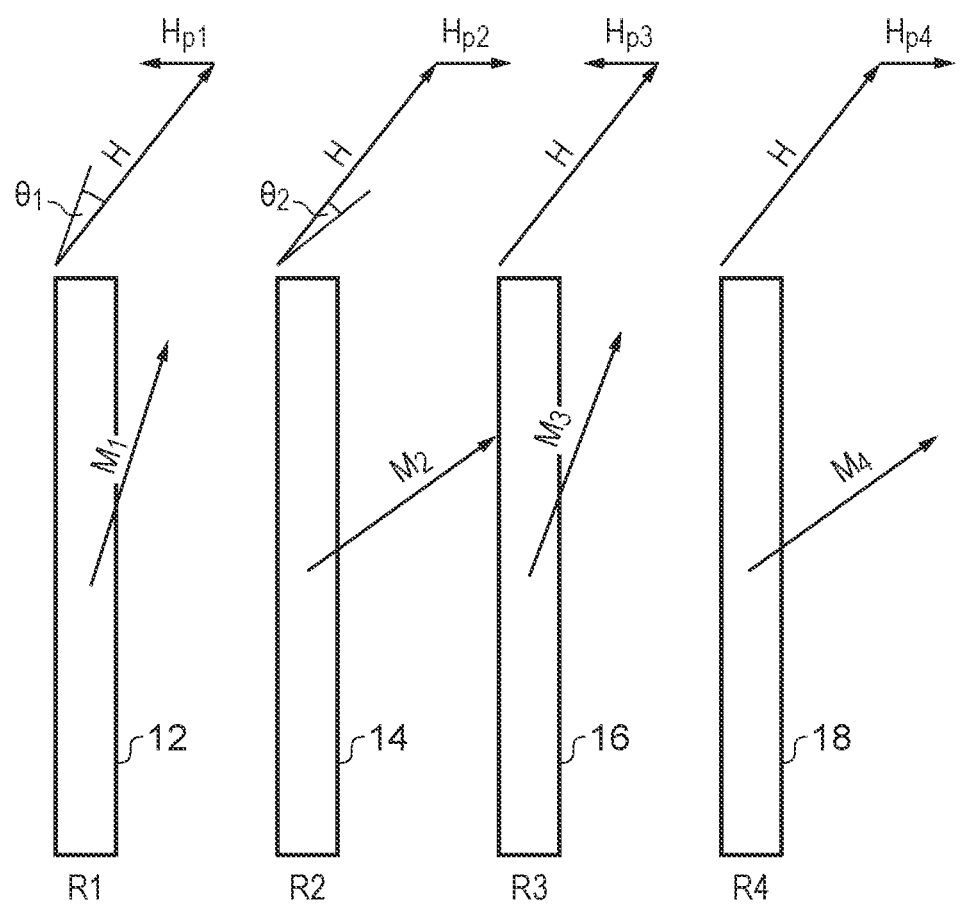
FIG. 4 is a vector diagram showing the vector addition of a perturbing magnetic field at each magneto-resistor to magnetic field whose direction is to be measured.

FIG. 4 schematically shows the vector addition of the perturbing magnetic field with an external magnetic field having a strength and direction illustrated by the vector "H". The perturbation at each magneto-resistor is represented by the vector $H_p$. In each instance the magnitude of $H_p$ has been shown as the same for each magneto-resistor but the direction for the first and third magneto-resistors is opposed to that for the second and fourth magneto-resistors.

The resultant vector sum is designated "M" for each resistor 12, 14, 16 and 18, and it can be seen that the direction of the resultant field $M_1$ for the first resistor 12 has changed by a first angle $\theta_1$ that differs from that of the resultant field $M_2$ for the second magneto-resistor 14 which has changed by a second angle $\theta_2$. Also, but not so clearly shown, the magnitude of the vector sums $M_1$ and $M_2$ may differ.

The change in magnetic field direction and strength effects the resistances R1 to R4 of the first to fourth magneto-resistors 12, 14, 16 and 18, respectively, and each vector sum is rotated by a respective angle $\theta_1$ to $\theta_4$ with respect to H.

Figure 5:
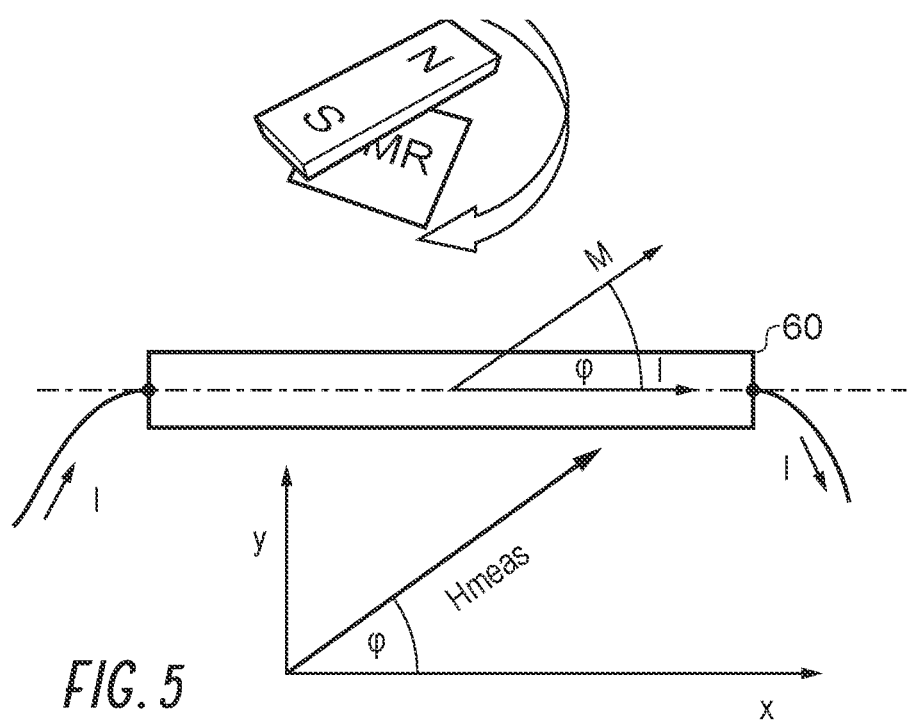
FIG. 5 is a diagram showing a frame of reference for measuring a direction between a magnetic field and a direction of current flow in a magneto-resistor.
Figure 6:
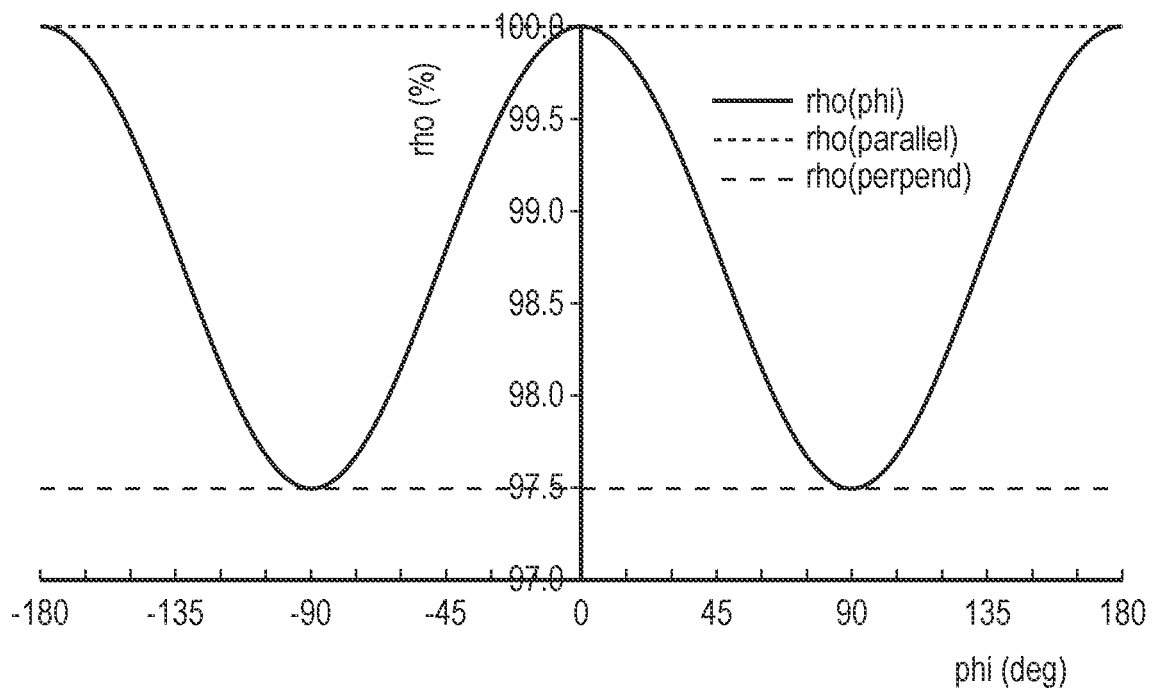
FIG. 6 is a graph showing variations in resistivity as a function of angle of the measured magnetic field to a direction of current flow.

FIG. 5 illustrates a frame of reference defining the angle φ between the direction of current flow in an elongate and linear magneto-resistor 60 and a magneto-resistor magnetization vector M resulting from a surrounding magnetic field H, and FIG. 6 is a graph showing how bulk resistivity ρ of the magneto-resistor varies with φ. It is known to the person skilled in the art that a sufficiently large magnetic field H causes the magnetization vector M to align with H. This is the mode of operation used in angular field sensors.

The features of note are that ρ (rho) is at a minimum at ±90° and that the response is symmetric about ±90°. This effect can be exploited to increase the effective length of the magneto-resistor and hence increase sensitivity, by allowing a magneto-resistive sensor to be formed from magneto-resistive elements having opposing directions of current flow, as will be discussed later.

From comparing FIGS. 4 and 6, it is apparent that the resistance R1 of the first magneto-resistor 12 will be changed to different extent than that, R2, of the second magneto-resistor 14. In the example illustrated in FIG. 4 $M_2$ is at a higher angle ρ (rho) than $M_1$ and hence R2<R1, assuming R1=R2 in the absence of any magnetic field. Similarly R4<R3. Therefore, for these resistors in a bridge configuration as shown in FIG. 2, $Vout_2$>$Vout_1$ if the magnetic field has a component in the first direction 40, whereas $Vout_2$<$Vout_1$ if the magnetic field has a component in the second direction 42.

The strength of the magneto-resistive response can be enhanced by using resistors that have an increased "length" compared to their "width". This can be achieved by forming a meandering or serpentine pattern in the material forming the magneto-resistors, or by forming each magneto-resistor of several series connected stripes or elements of magneto-resistive material. The stripes or elements of magneto-resistive material may be deposited parallel to one another.

Figure 7:
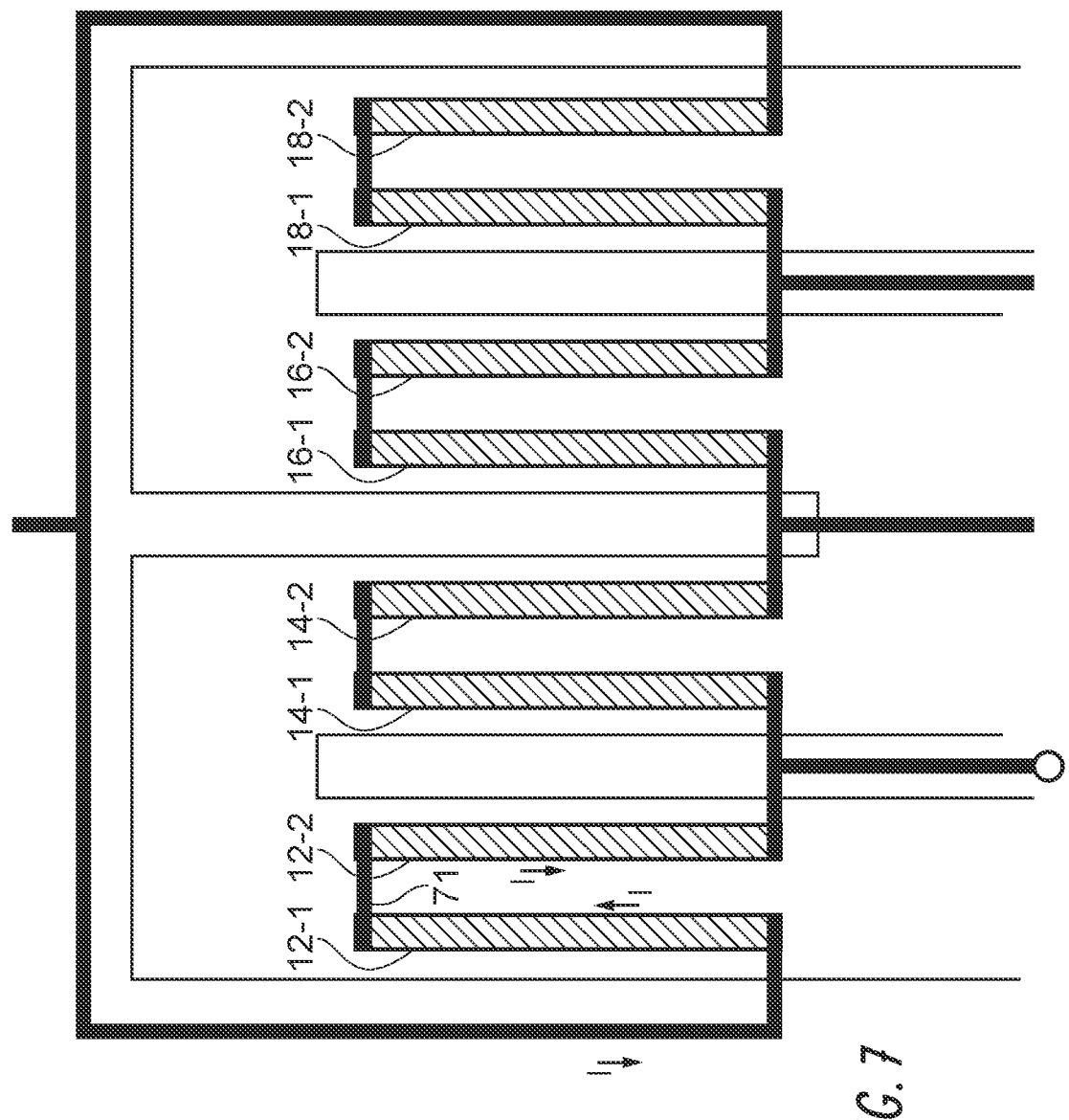
FIG. 7 is a plan view of a further embodiment of a magnetic field direction detector.

FIG. 7 shows in simplified form, a magnetic field direction detector where each magneto-resistor now comprises a plurality of interconnected magneto-resistive elements. Comparing FIG. 7 with FIG. 1, the first magneto-resistor 12 now comprises two magneto-resistive elements 12-1 and 12-2 connected together by way of a metallic link 71 which may be formed over the magneto-resistive material or formed in a layer intermediate the conductor of the perturbation generator 50 and the magneto-resistive elements, or may be part of the magneto-resistive material.

The other magneto-resistors are similarly formed by magneto-resistive elements 14-1, 14-2; 16-1, 16-2; 18-1 and 18-2.

Although the current flow is in opposite directions within the magneto-resistive element 12-2 compared to the current flow in element 12-1, the symmetry in the resistivity characteristic around the 90° direction means that the response of the two elements is identical. Each magneto-resistor 12, 14, 16 and 18 can be made of a plurality of magneto-resistive elements, e.g. two, three, four, five and so on. The resistance, and hence the resistance change, scales with the number of resistive elements.

The resistive elements have been drawn as linear elements, as this is both the simplest configuration and it is believed to be the most likely, but the invention is not so limited. Even when the external magnetic field is expected to be substantially linearly directional over the spatial existent of the direction detector, the magneto-resistors and the magneto-resistive elements forming them may take other geometries such as arcuate or zigzag. This may enhance the packing of the magnetic field direction detector onto a die containing other components.

Two magnetic field direction detectors can be used to form a quadrant detector, as will now be described.

Figure 8:
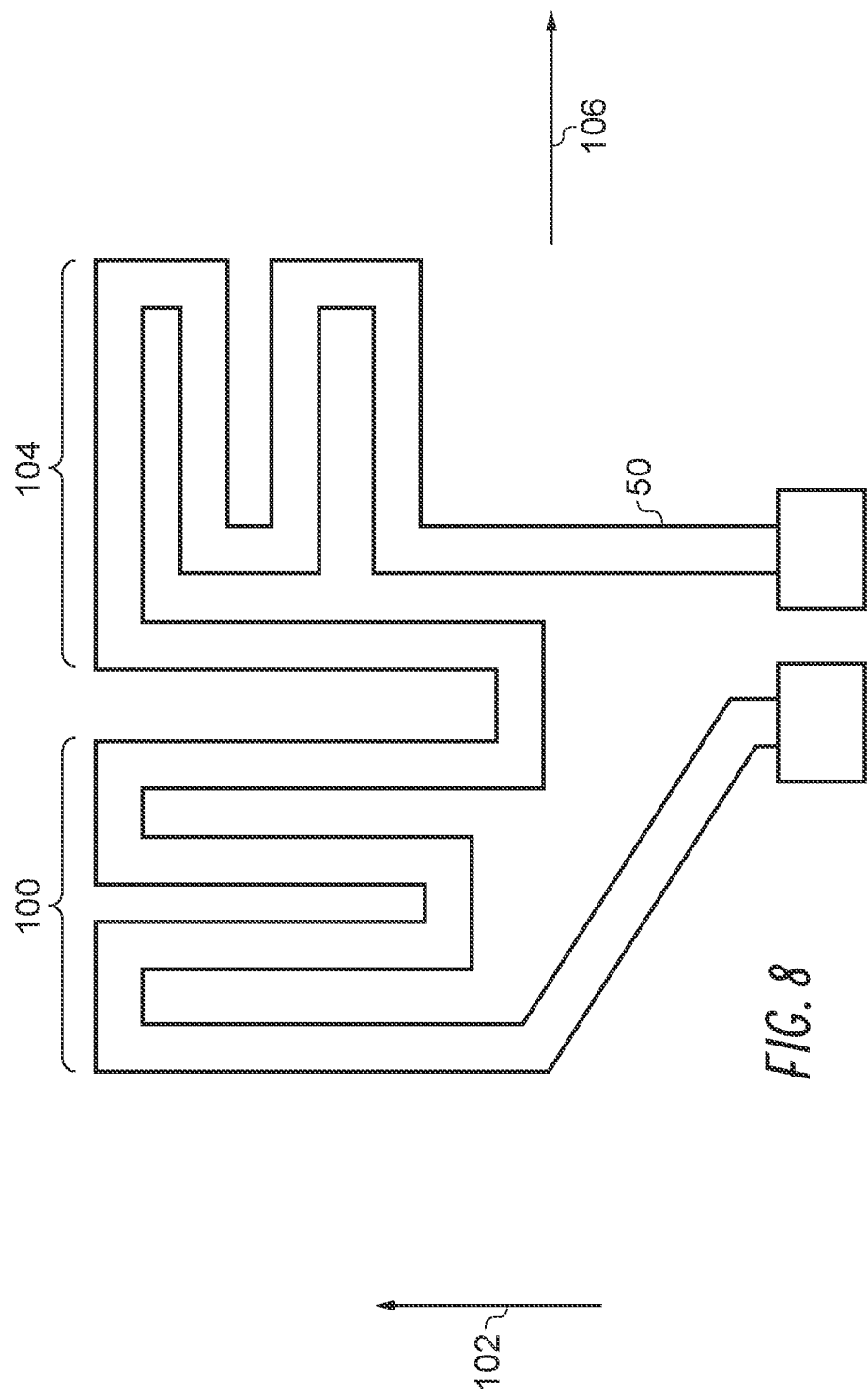
FIG. 8 is a plan view of a conductor acting as a perturbation generator for a quadrant detector constituting an embodiment of the invention.
Figure 9:
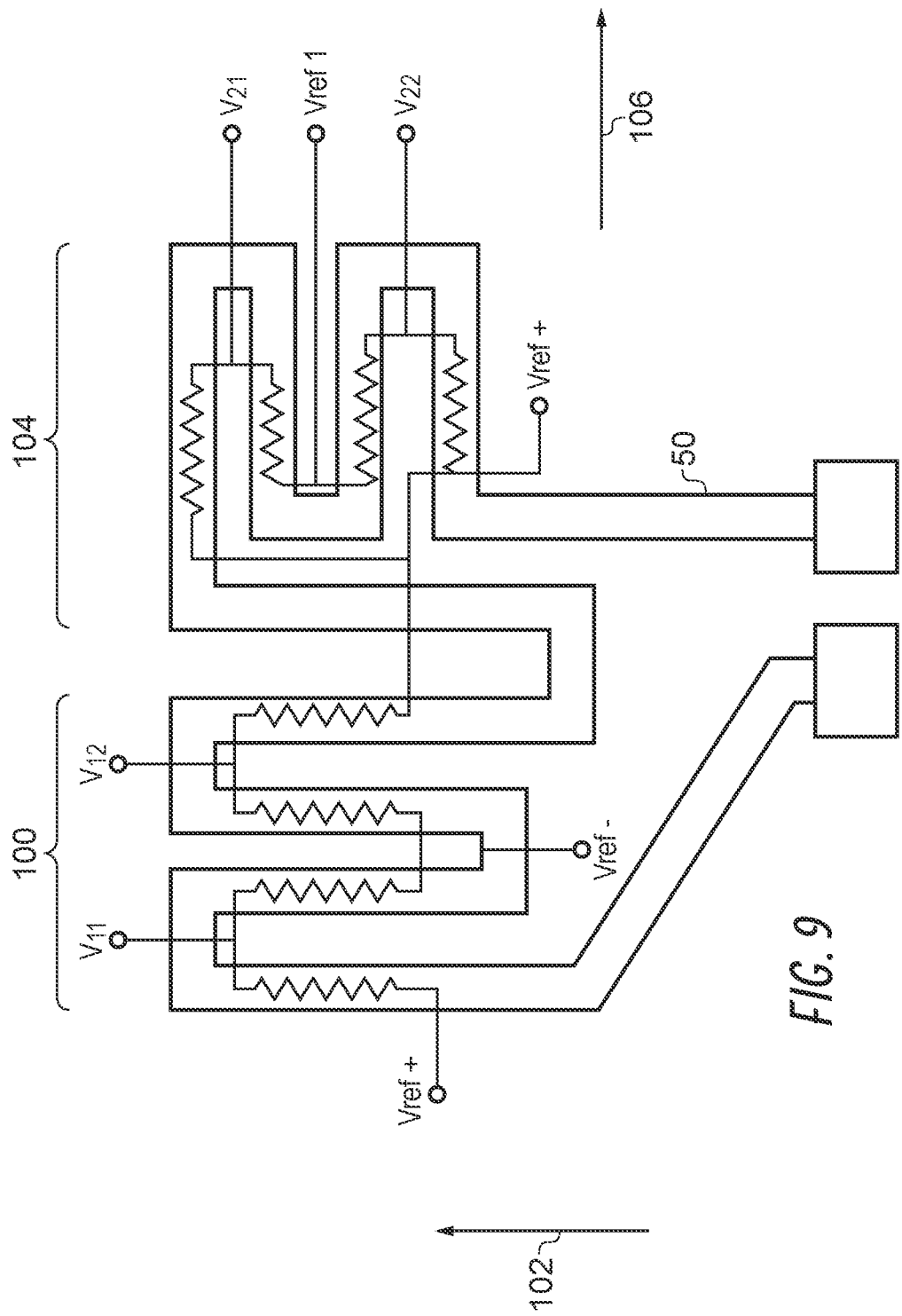
FIG. 9 is a plan view of the perturbation generator of FIG. 8 with the position of magneto-resistors and their interconnections diagrammatically superimposed.

FIG. 8 shows the path of a shared perturbation generator comprising a single conductor perturbation generator 50 for generating the magnetic perturbation in a first direction detector 100 having a detection axis along the direction of arrow 102, and a second direction detector 104 having a detection axis along the direction of arrow 106. Thus the magnitude and direction of the perturbing field can be controlled simultaneously in both magnetic field direction detectors. FIG. 9 is similar to FIG. 8, but also schematically indicates the positions of the first to fourth magneto-resistors in each direction detector 100 and 104 (the magneto-resistors may be made of a plurality of magneto-resistive elements as described with respect to FIG. 7).

A comparator, not shown, may be connected to the first and second outputs of the first direction detector 100 to compare $V_{11}$ with respect to $V_{12}$. Similarly a comparator connected to the outputs of the second bridge 104 may compare $V_{21}$ with respect to $V_{22}$.

Figure 10:
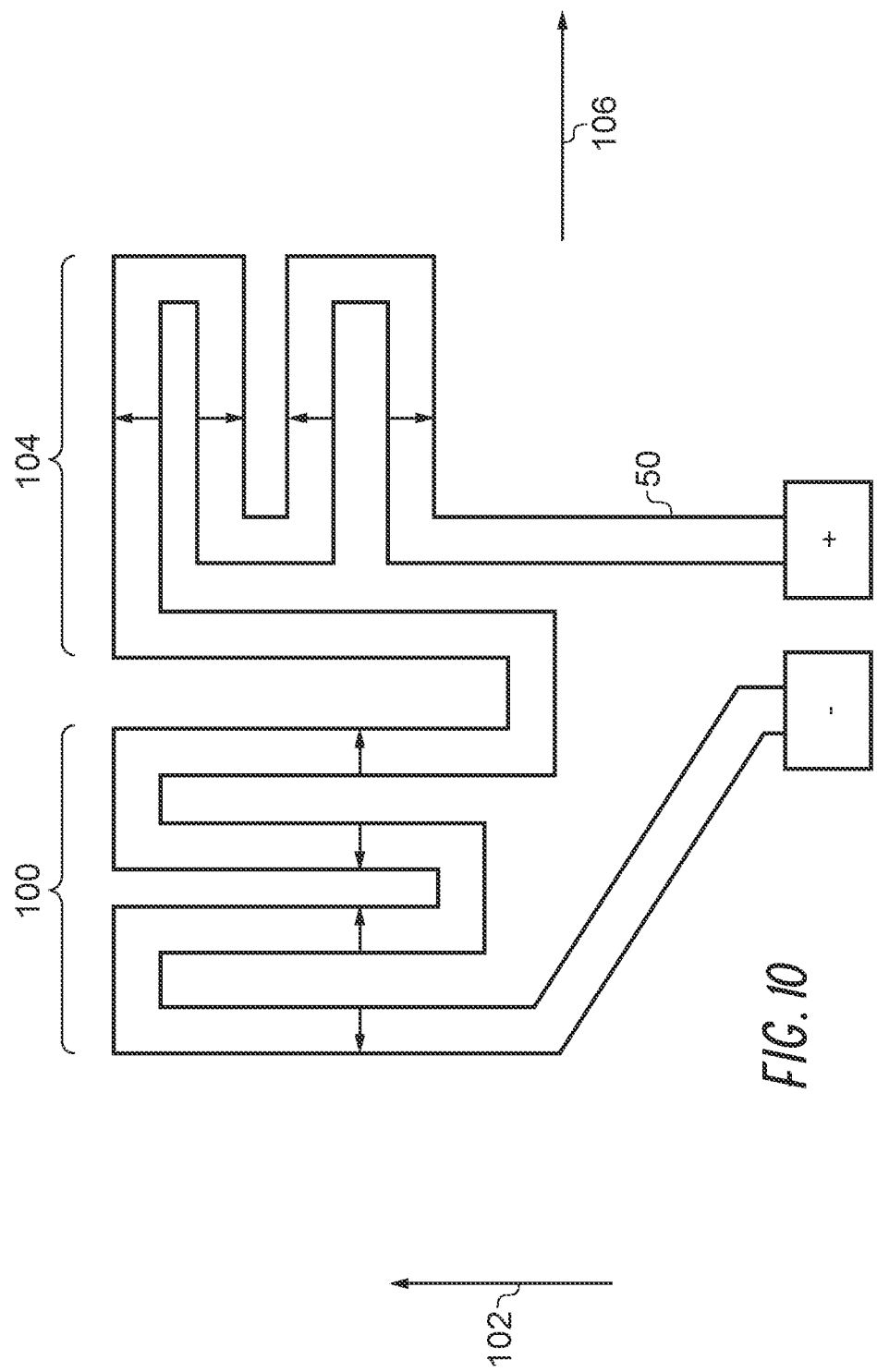
FIG. 10 is a diagram schematically illustrating the directions of perturbing magnetic fields at the magneto-resistors of FIG. 9.

FIG. 10 shows the directions of the perturbing magnetic fields when the conductor of the perturbation generator 50 is energized as shown, and buried beneath the magneto-resistors of FIG. 9.

Figure 11:
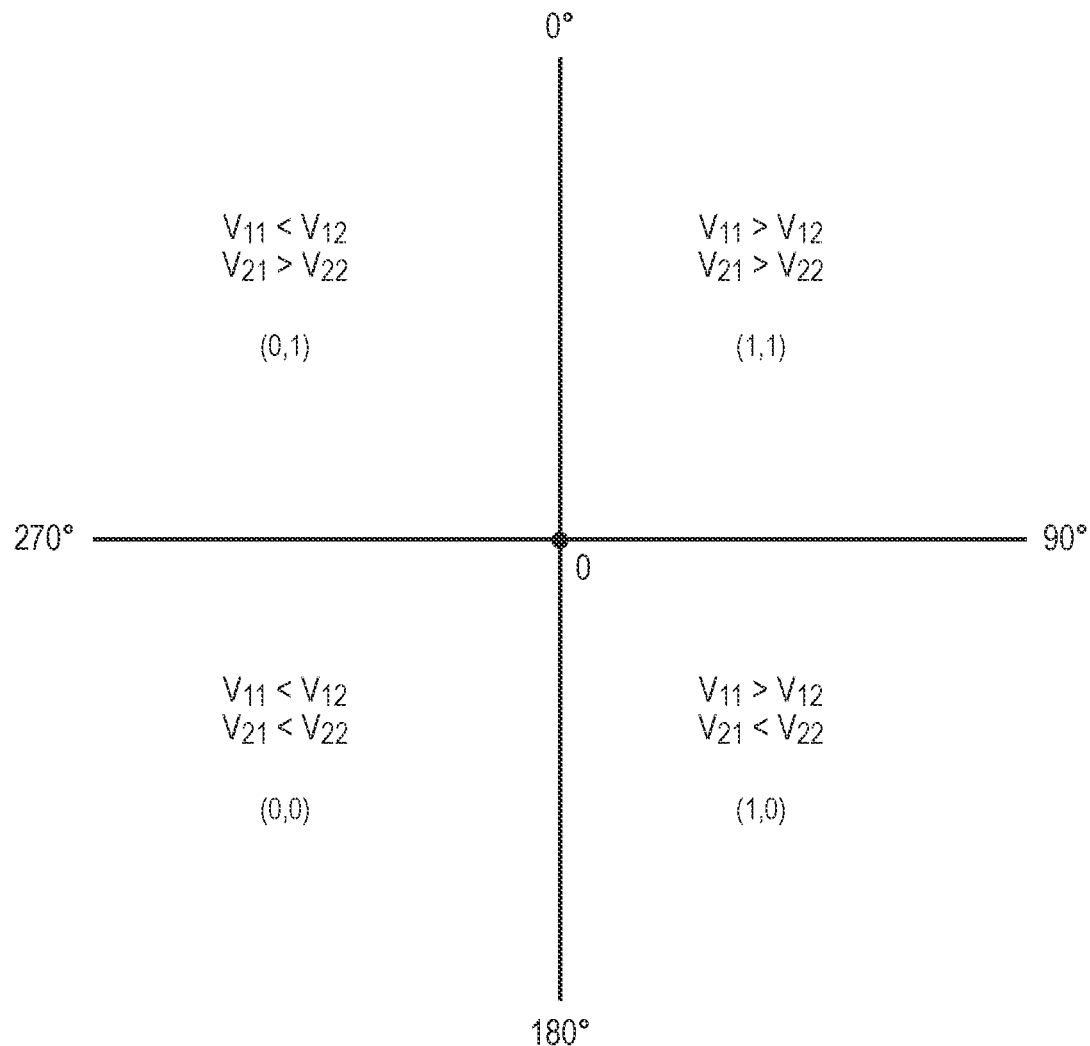
FIG. 11 is a diagram showing, for each quadrant that a magnetic field originates from, the output of the two direction detectors.
Figure 11:
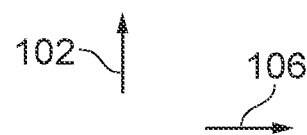

It becomes possible to map the relative magnitudes of $V_{11}$ and $V_{12}$, and $V_{21}$ and $V_{22}$ as the magnetic field is travelling left to right or right to left in the x-y plane illustrated in FIG. 11, where the detection axes 102 and 106 are illustrated so as to correspond with the direction shown in FIG. 10.

Thus for a field travelling from left to right the effect of the perturbation is to make $V_{11}$>$V_{12}$.

The second direction detector checks to see if the field is travelling upwardly or downwardly in the co-ordinate system shown in FIG. 11. If the field is travelling upwardly then $V_{21}$>$V_{22}$.

If the comparators are arranged such that $V_{11}$>$V_{12}$=1, $V_{11}$<$V_{12}$=0; $V_{21}$>$V_{22}$=1 and $V_{21}$<$V_{22}$=0, then the direction of the magnetic field can be represented as a two bit word, as also shown in FIG. 11.

Thus, in this example a magnetic field originating from the origin of travelling in to the 0° to 90° direction is represented by 1,1. In the 90° to 180° direction it is represented by 1.0 and so on. The signs of the comparator outputs can be changed by altering the input connections to $V_{11}$ and $V_{12}$, and to $V_{21}$ and $V_{22}$, and/or by reversing the polarity of the current flowing in the perturbation generator 50 (FIGS. 8, 9 and 10).

It is apparent that two quadrant detectors offset by 45° could be used to determine the direction of a magnetic field to within a sector constituting ⅛ of a circle. With a modification, a detector can also be sensitive to magnetic field directions perpendicular to the plane in which the magneto-resistors are formed. Such an arrangement is schematically illustrated in FIG. 12.

Figure 12:
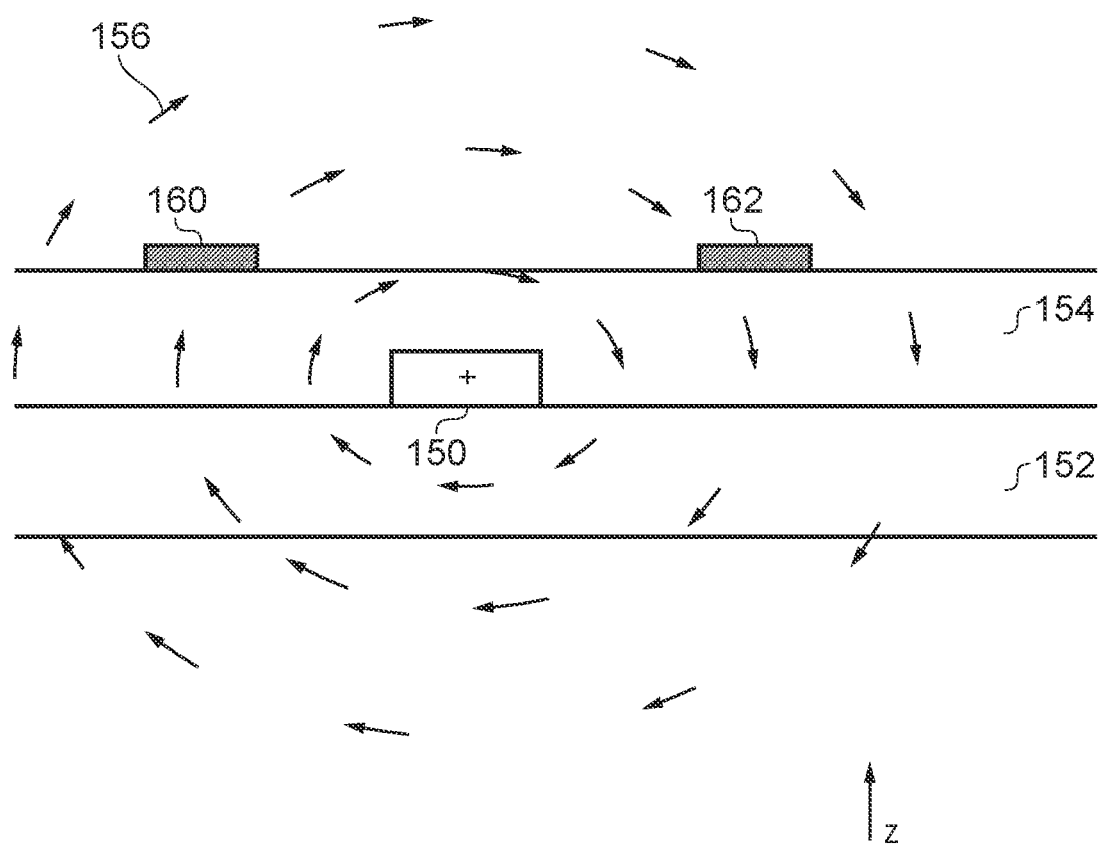
FIG. 12 is a cross section through a further embodiment, and illustrating the relative directions of a perturbing magnetic flux.

As shown in FIG. 12, a conductor 150 is formed over a substrate 152 and embedded within an insulator 154. First and second magneto-resistors 160 and 162 (corresponding to the magneto-resistors 12 and 14 of FIG. 1) are formed over the layer 154, and laterally displaced either side of the conductor 150.

The lines of magnetic flux 156 from current flow in the conductor 150 (conventional current flow direction into the plane of FIG. 12) are illustrated. The perturbing filed has an upward component at magneto-resistor 160 and a downward component at magneto-resistor 162. This allows sensing in the direction perpendicular to the plane of the integrated circuit carrying the magneto-resistors to occur. Such an arrangement may have to compete with shape anisotropy in the magneto-resistor resulting from the material being thin in the Z direction. As a result of this anisotropy, the sensitivity of this embodiment may be limited such that it needs the presence of a strong magnetic field and/or the magneto-resistors need to be formed with additional thickness in the Z direction.

Figure 13:
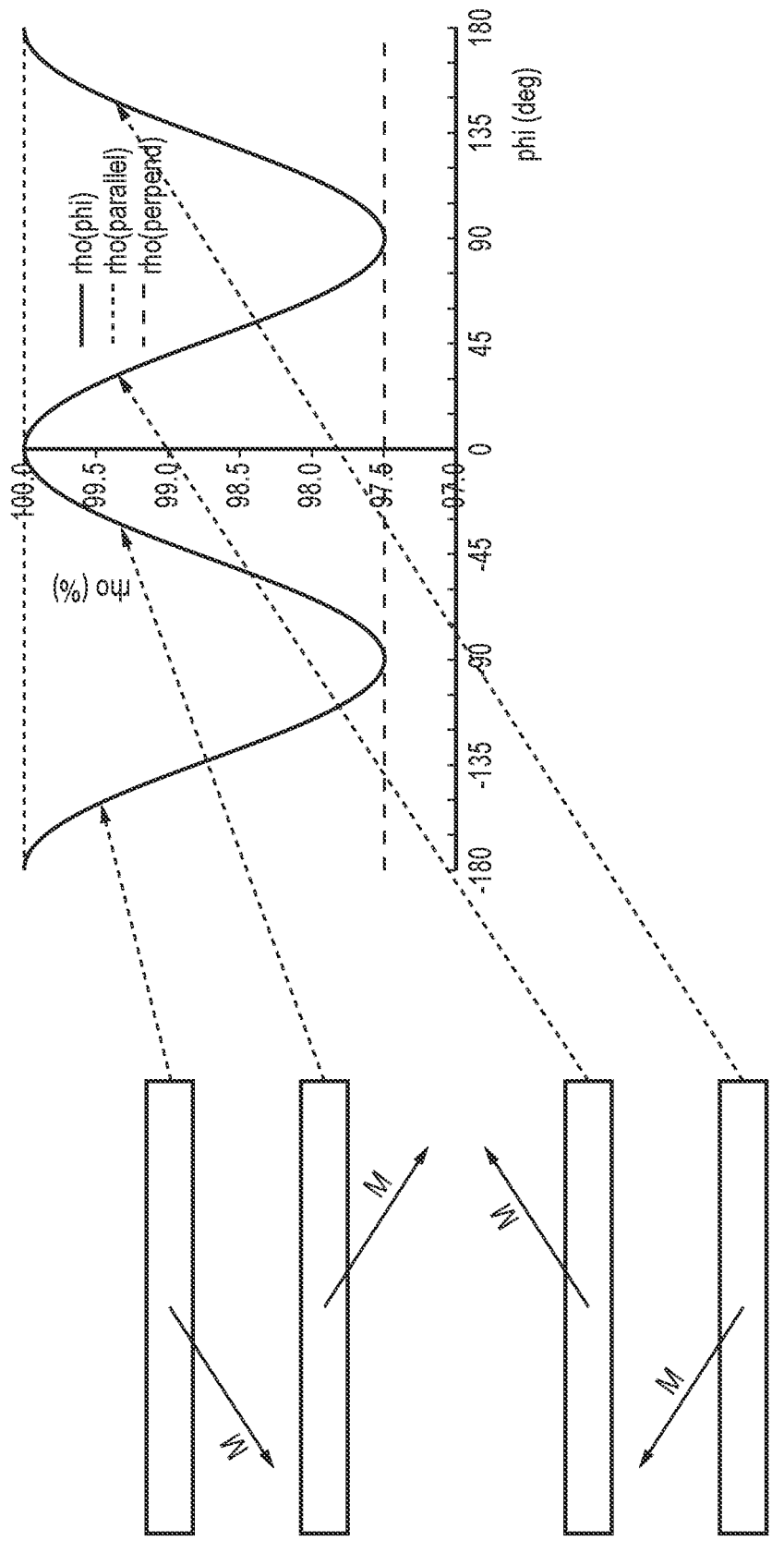
FIG. 13 is a diagram representing directional uncertainty at a magneto-resistive sensor in a magnetic angle direction detector.

The quadrant detector may be used to augment the output from the magnetic angle direction detectors using anisotropic magneto-resistance. Such sensors are also made from stripes of magneto-resistive material forming magneto-resistors, but do not have a perturbation generator. In order to understand the limitations of AMR elements as rotation detectors, for example when a bar magnet is carried on a shaft so as to measure the angular rotation of a shaft, consider FIG. 13, which represents the data of FIG. 6, but exemplifies that there are four directions of magnetic field direction M with respect to longitudinal axis of a magneto-resistor that give identical resistivities, and hence identical resistances.

Figure 14:
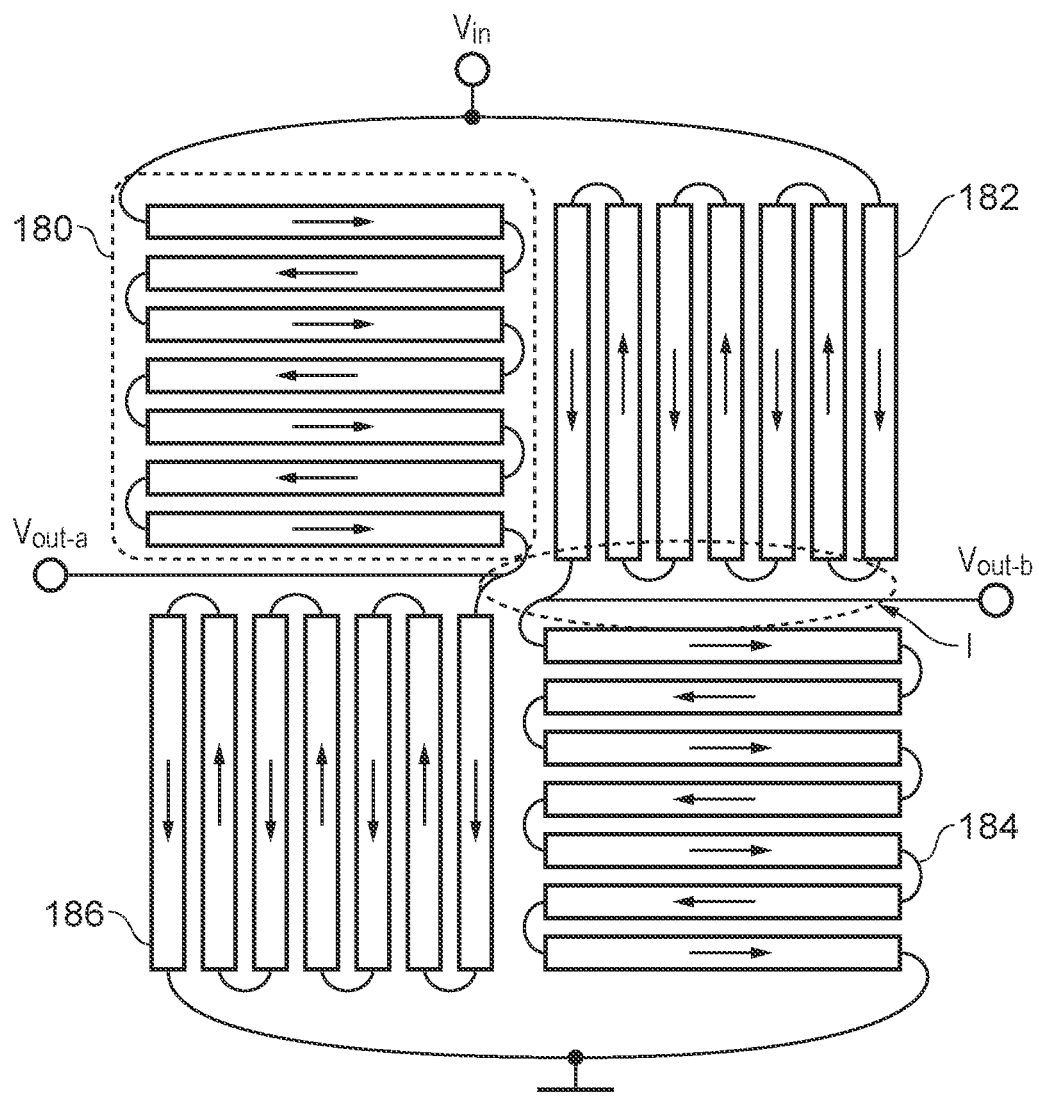
FIG. 14 schematically illustrates an anisotropic magneto-resistive bridge magnetic angle sensor.

This angular ambiguity remains unaltered when the magneto-resistors are placed into a bridge array of the type schematically illustrated in FIG. 14. Here magneto-resistive elements are laid parallel to one another in four blocks to form a bridge of resistors. Thus the seven magneto-resistive elements contained within the region 180 form a single magneto-resistor. The regions 182, 184 and 186 form other magneto-resistors which are then placed in a bridge configuration, such that the magneto-resistors 180 and 186 co-operate to form one limb of the bridge, and the magneto-resistors 182 and 184 co-operate to form the other limb of the bridge.

Figure 16:
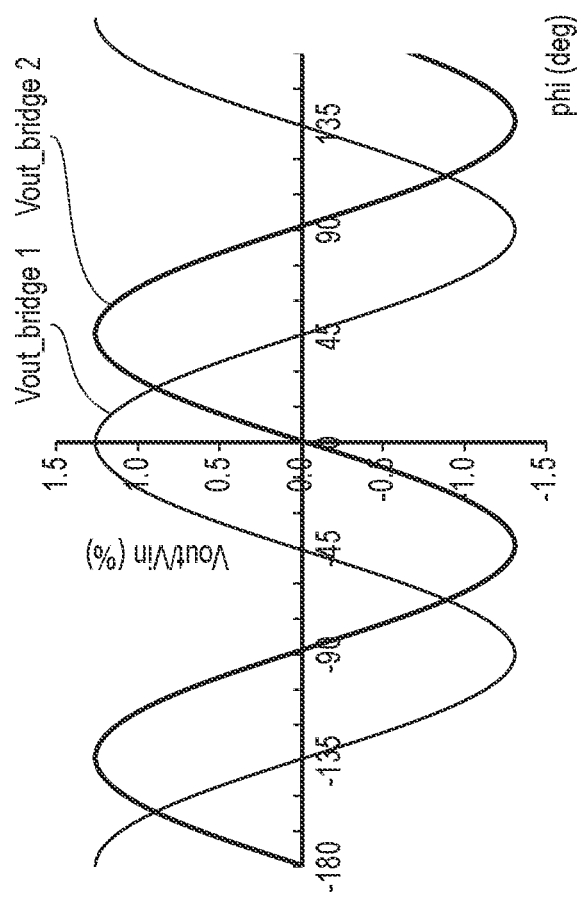
FIG. 16 is a graph representing output voltage versus angle across each bridge of a two bridge magnetic angle position sensor.
Figure 15:
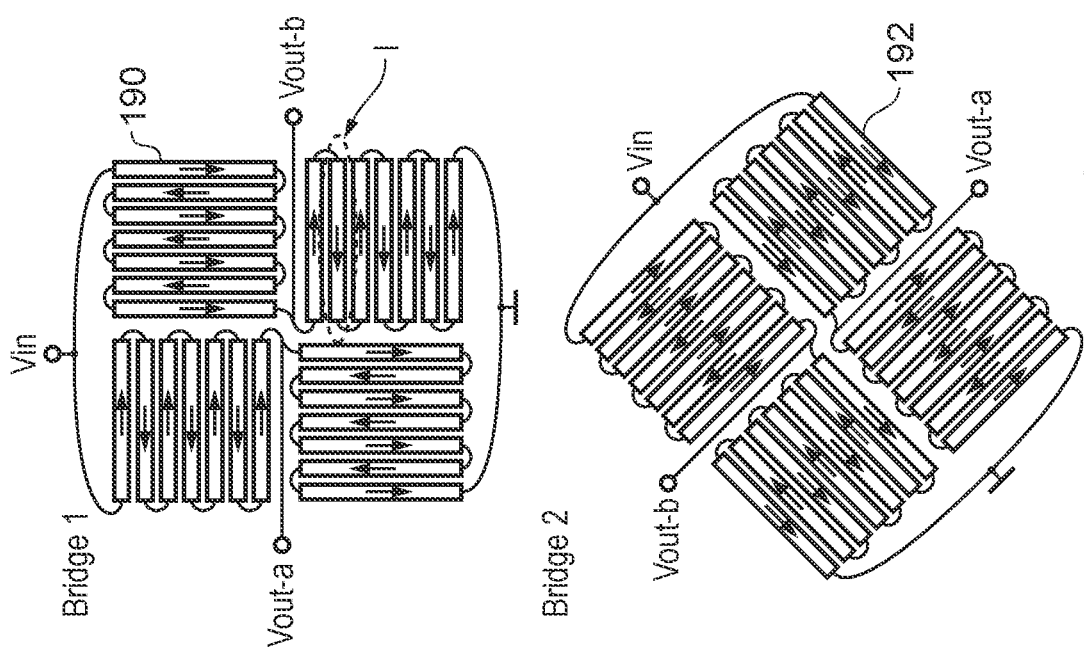
FIG. 15 schematically illustrates a two bridge magnetic angle position sensor.

In known angular position sensors it is known to form two magneto-resistive bridge configurations 190 and 192, with one bridge rotated by 45° with respect to the other bridge, as shown in FIG. 15. For each bridge an output signal Vout=Vout-a−Vout-b Vout-b can be formed. These responses for the first bridge 190 and the second bridge 192 are illustrated in FIG. 16 as Vout_bridge1 and Vout_bridge2 respectively.

The output from the bridges can be combined as shown below in Eq. 1.

$$\text{Output angle} = 0.5 \arctan2(\text{Vout\_bridge1}, \text{Vout\_bridge2}) \qquad \text{Eq. 1}$$

Figure 17:
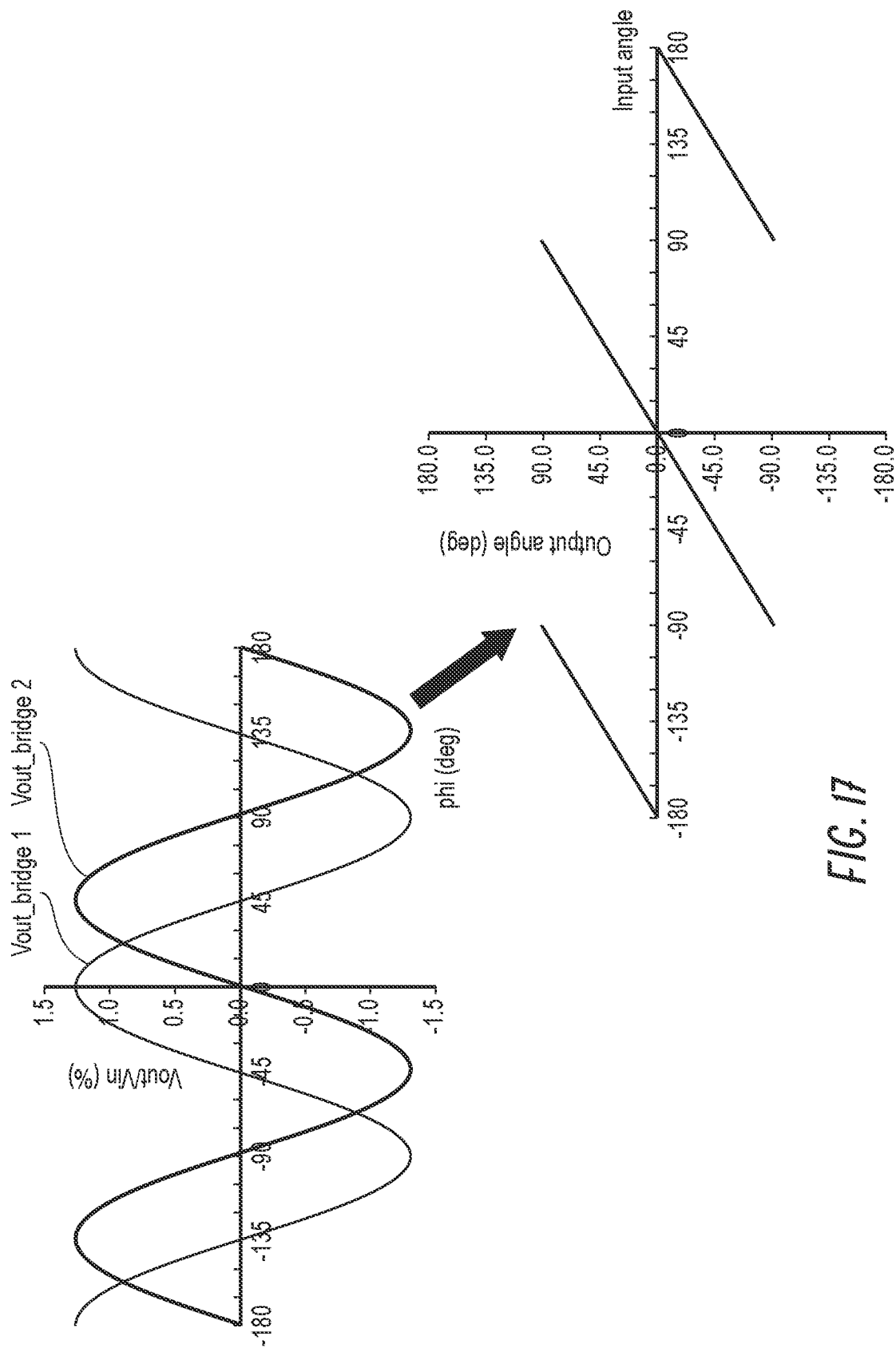
FIG. 17 is a graph showing the monotonic output of a two bridge magnetic angle sensor over a limited angular range after signal processing has taken place.

The output is shown in FIG. 17, and is monotonic in the range −90°<X<90° where X represents the direction of the magnetic field with respect to a sensing axis of the first bridge 190. So ambiguity still exists between, for example, −45° and +135°. However by the inclusion of a quadrant detector as described herein, the angular uncertainty can be resolved and an unambiguous output given.

As noted before, the elements of the quadrant detector, or the individual direction detectors forming it, need not be straight or linear elements. Similarly the individual resistors of a detector need not be placed side by side, but may be disbursed over a substrate to achieve greater packing density. Similarly the conductor used to form the magnetic perturbation need not follow the paths disclosed hereinbefore and might, for example, be formed into a spiral path.

Figure 18:
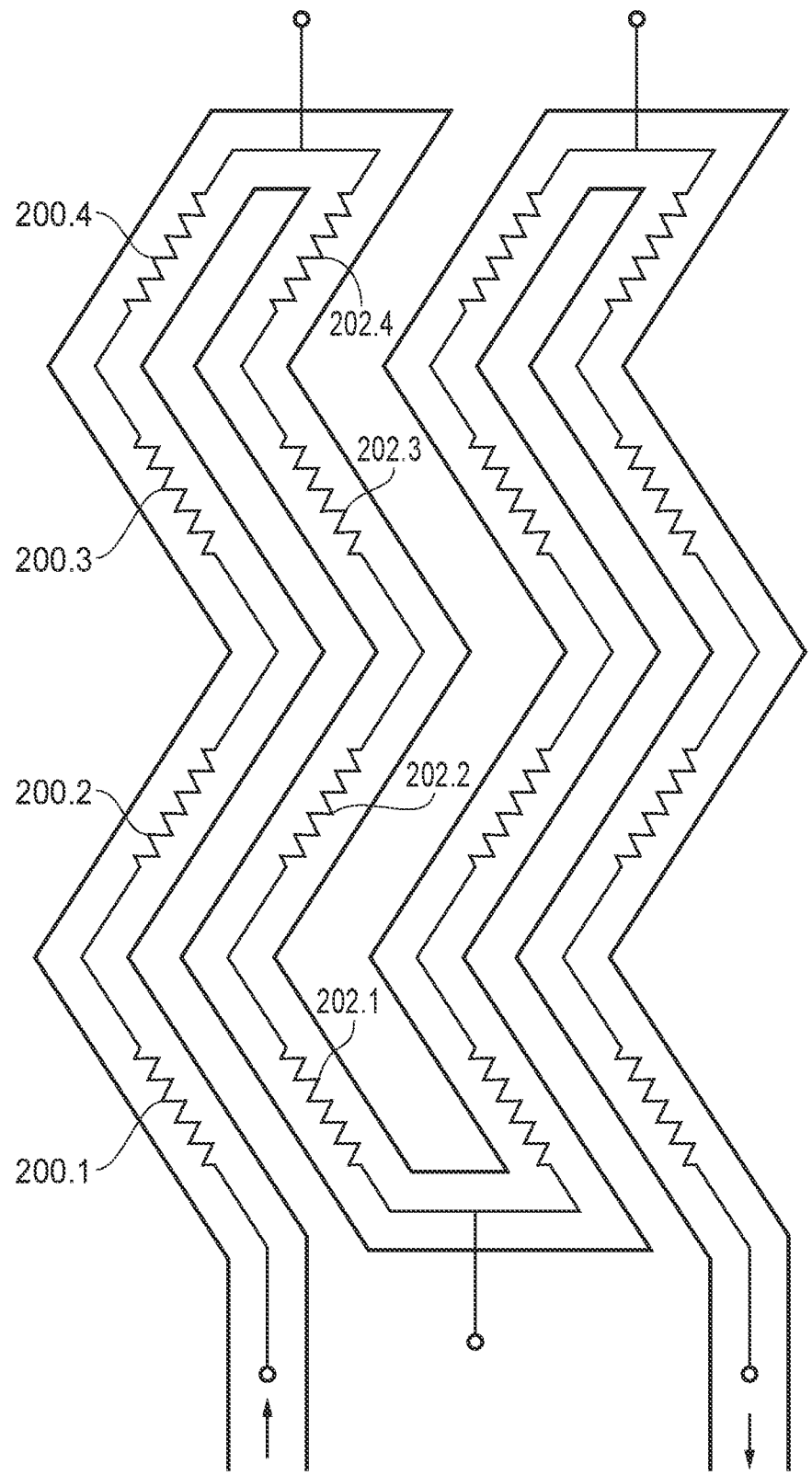
FIG. 18 is a schematic plan view of a further configuration of a perturbation generator.

FIG. 18 shows a modified magnetic field detector where each of the magneto-resistors is formed from a plurality of magneto-resistive elements formed above respective portions of the perturbation generator. This comparing FIG. 18 with FIG. 1, the first resistor 12 of FIG. 1 is now composed of four magneto-resistive elements 200.1 to 200.4. The magneto-resistive elements 200.1 to 200.4 are inclined with respect to one another so as to have a zig-zag pattern above a zig-zag perturbation generator. The other magneto-resistors are similarly formed.

The perturbation conductor need not be permanently energized. An angular position sensor should be able to keep a running estimate of angular position, so it should suffice to power up the quadrant detector, or indeed only a direction detector, at initialization, and/or periodically for checking purposes.

Figure 19:
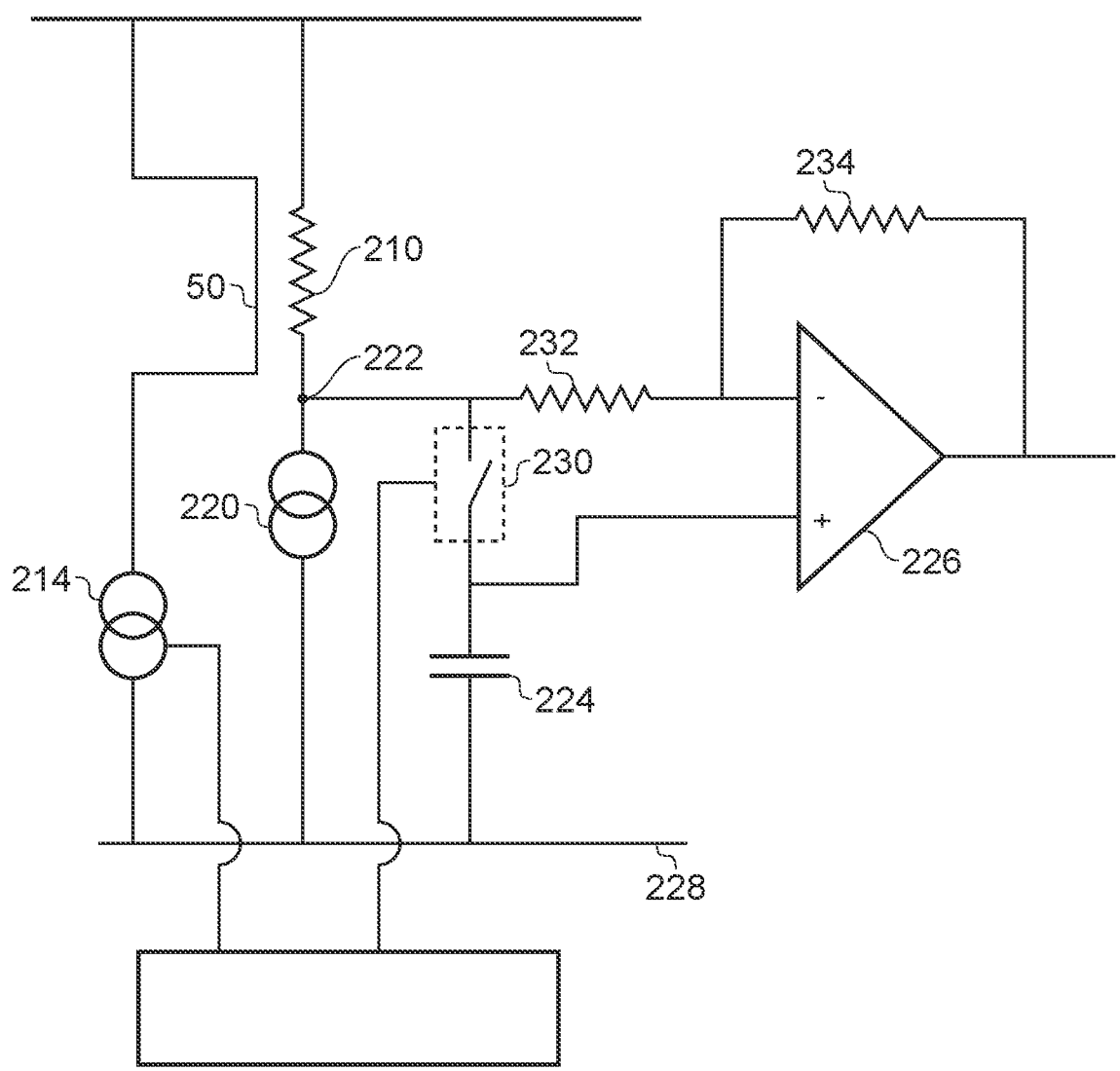
FIG. 19 is a circuit diagram for an embodiment of a magnetic field direction detector using a single magneto-resistor.

FIG. 19 shows a further embodiment where the number of magneto-resistors have been reduced, in this example, to a single resistor 210 placed next to a perturbation generator 50 which can be selectively energized by a controllable current sink 214 (or current source). The current through the magneto-resistor may also be controlled by a current sink 220 as shown, or by a current source. In the presence of a magnetic field having a component transverse to a sensing or detection direction of the resistor 210, energizing the perturbation generator causes the resistance of the resistor 210 to either decrease or increase, depending on the direction of the magnetic field. This causes the voltage at node 222 to change. If this change can be monitored, then the direction of the magnetic field can be estimated. FIG. 19 shows a circuit capable of monitoring the change in voltage at node 222. A capacitor 224 has a first terminal connected to a non-inverting input of an operational amplifier 226. A second terminal of the capacitor is connected to a local ground or to a supply rail 228. An electrically controlled switch 230, for example formed by a FET, is provided to connect the first terminal of the capacitor 224 to node 222. The inverting input of the amplifier 226 is connected to the node 222 by a resistor, and also to the output of the amplifier 226 by resistor 234. These resistors act to define the gain of the amplifier 226.

When switch 230 is closed, the capacitor can charge to the voltage of node 222. During this time the current sink 214 may be de-energized so that no current flows in the perturbation generator 50. When it is desired to check the direction of the magnetic field, the switch 230 is opened such that the voltage at node 222 is held on the capacitor 224. The perturbation generator is then energized, causing the resistance of the resistor 210 to change, and hence the voltage at node 222 to change. This new voltage is provided to the inverting input where it is compared with the immediately preceding value by the amplifier 226, and the sign of the amplifier output is indicative of the direction of the magnetic field. The amplifier 226 may be replaced by a comparator and resistors 232 and 234 dispensed with, and the inverting input of the comparator connected directly to node 222.

The direction detector is suitable for integration within an integrated circuit containing angular position sensors, and in some circumstances the same AMR bridge may be used to form part of an angular direction detector and the direction detector, i.e. semi-sphere or quadrant detector of the present invention.

An apparatus and method for magnetic field detection including a magnetoresistive sensor and a conductor or perturbation generator allowing resolving direction uncertainty of an external magnetic field are disclosed in U.S. application Ser. No. 13/655,059 ("'059 Application") titled "MAGNETIC FIELD DIRECTION DETECTOR," the entirely of which is hereby incorporated by reference. As disclosed in the '059 Application, magnetoresistive sensors can have an accompanying perturbation generator in an isolated layer below or above the layer including magnetoresistive sensors, and the perturbation generator can be configured to conduct currents in different directions near different stripes of the magnetoresistive sensors. The perturbation generator implemented as disclosed in the '059 Application allows determination of which quadrant the direction or angle of an external magnetic field is in based on comparing the output values of the different stripes perturbed by the conductor. As also discussed in the '059 Application, the direction detector having the perturbation generator can be implemented with magnetoresistive sensors formed in a bridge configuration. In such examples, a first set of magnetoresistive stripes are provided in one direction, having a first detection axis, and a second set of magnetoresistive stripes are provided in another direction, having a second detection axis, where the first and second directions can be approximately perpendicular to each other. The first and second sets of magnetoresistive stripes can be referred to as sine bridge resistors and cosine bridge resistors, respectively.

Magnetic sensors, such as anisotropic magnetoresistive (AMR) sensors, giant magnetoresistive (GMR), tunneling magnetoresistive sensors (TMR), or any other magnetoresistive (XMR) sensors, each provide different advantages in implementing a magnetic field detector. And applications implemented using different type of magnetic sensors may be able to sense different ranges of angles of an external field. For example, some applications of AMR sensors formed in a bridge may only be able to determine the angle of an external magnetic field in the range of 0 to 180 degrees as the outputs from the AMR sensor bridges may repeat every 180 degrees. Certain magnetic field detectors implemented as disclosed herein allow a full 360 degree range of external field angle detection with a relatively wide magnetic window and relatively high accuracy. This can allow the sensors to benefit from advantages of certain magnetoresistive sensors, such as AMR sensors, while overcoming certain disadvantages associated with those sensors.

An AMR quadrant detector can supplement to AMR angular position sensor and expand its range from 180 degrees to a full 360 degree rotation. Some AMR angular sensors provide an output signal corresponding to an angle of an external field with 2× increased phase, so that for a 360 degree magnetic field rotation, 2 periods (720 degrees) of an output signal are provided. It can therefore be challenging to distinguish, whether the actual measured angle is α or α+180 degrees.

A number of applications can benefit from an ability to resolve this ambiguity. A solution disclosed in the '059 Application involves adding 2 specifically designed AMR bridges (AMR Quadrant Detector) which can have zero output in normal operation, but upon biasing with an overlaid "coil," which can as also be known as a perturbation generator or bias conductor, would provide direction of measured field within a quadrant. It will be understood that the "coil" can have shapes other than coils and can generally be adjacent the magnetoresistive elements. This additional information combined with an AMR angular sensor provides a full 360 degree operation range. The quadrant detector can be based on substantially the same process as the angular AMR bridges, and can be implemented with only 1 additional metallic layer in certain embodiments. Accordingly, integration within a single die is possible.

As disclosed herein, by tilting the resistive stripe angles within the quadrant detector from the '059 Application (see FIG. 9, herein), it is possible to avoid singular-point ambiguity without resorting to having to use both a quadrant detector and an angle detector. It is also shown that in one embodiment of resistive stripes, a sinewave output with a 360 degree period can be obtained. Furthermore, by changing the polarity of a biasing current, the bridge offset (and its drift) can be detected, reduced, and/or removed through signal processing. Further, a relatively large field magnitude of an applied magnetic field can be measured by this arrangement in addition to the angular direction of the applied magnetic field. This can have significant functional safety feature uses.

One advantage of this proposed solution compared to various co-packaged combinations of sensors of different technologies is that embodiments disclosed herein can use the same process as one type of magnetic sensor (e.g., AMR sensor). Accordingly, integration on the same die is possible with an additional metallic layer. Additionally, if the magnetic sensor (e.g., AMR) is monolithically integrated onto an ASIC, the number of dies in package drops to one compared to at least three in some other approaches. In some implementations, the biasing current can be turned off most of the time, when no quadrant information is desired in order to save power, and turned on only in given intervals or on demand.

Figure 20:
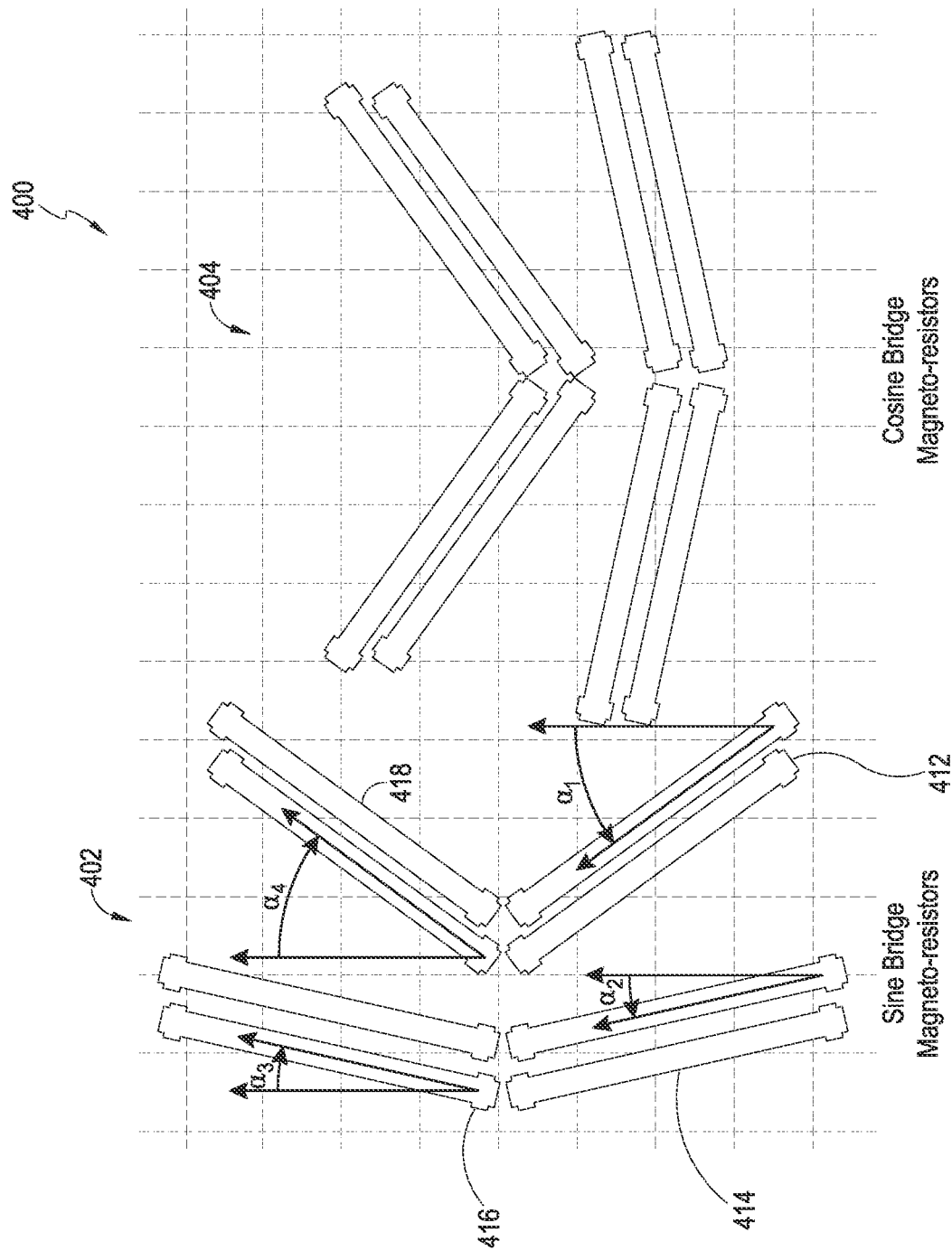
FIG. 20 illustrates an arrangement of magneto-resistors for a quadrant detector having harmonic cancellation.
Figure 24:
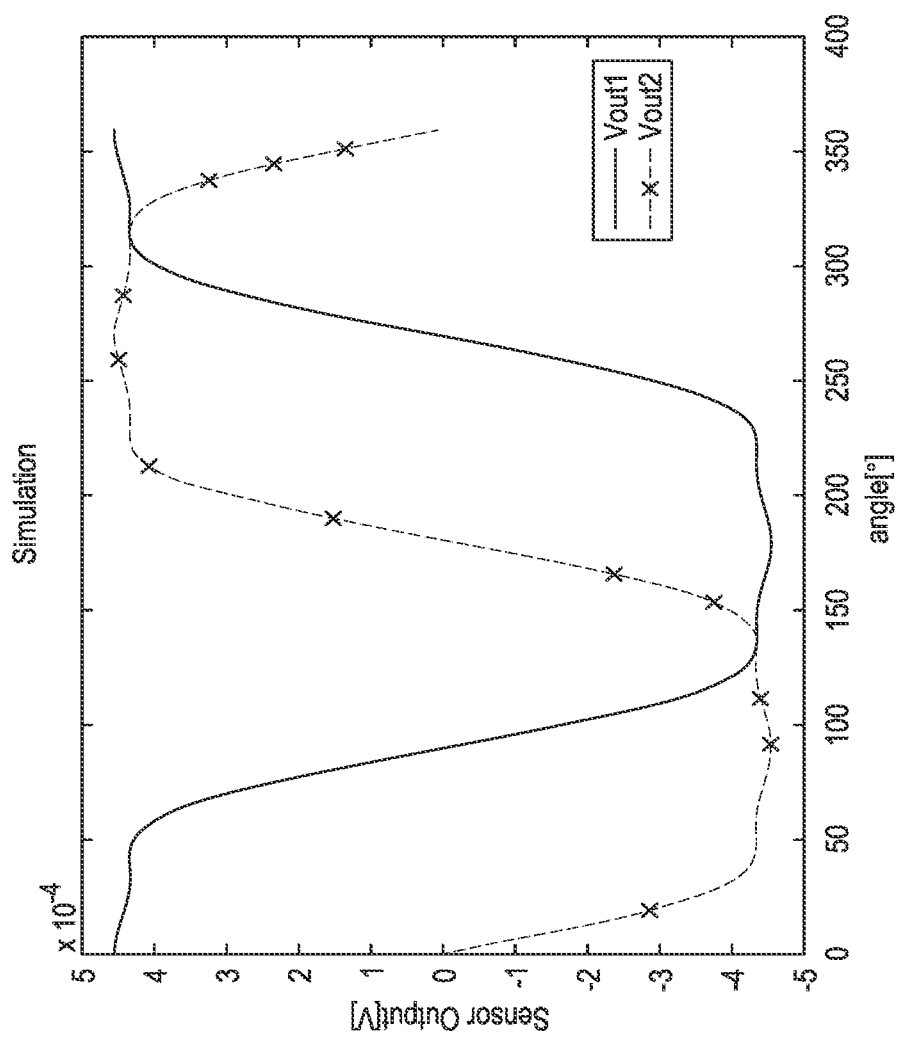
FIG. 24 illustrates simulation results for the quadrant detector.

FIG. 20 illustrates an example arrangement of magnetoresistive elements or magneto-resistors ("resistors") for a quadrant detector or switch according to one embodiment, and FIG. 24 illustrates a simulation sensor output result for the example arrangement. As illustrated in FIG. 20, the sine bridge resistor stripes are arranged at varying angles not parallel to or perpendicular to the detection axis of the sine bridge. Similarly, the cosine bridge resistor stripes are arranged at varying angles not parallel to or perpendicular to the detection axis of the cosine bridge. Two resistors of each bridge can be oriented at opposite angles from each other (e.g., X° and)−X° and two other resistors of each bridge can be oriented at different angles that are opposite from each other (e.g., Y° and −Y°, where X does not equal Y) that are different than the two resistors. In the illustrated example, the sine and cosine bridge resistor stripes each are arranged at −36°, −12°, 12°, and 36° with respect to their respective axes of symmetry, which are perpendicular to their respective detection axes.

The illustrated quadrant detector 400 includes a first magnetic field detector 402 and a second magnetic field detector 404. For the purposes of this disclosure, like reference numerals in the figures shall refer to like features unless otherwise indicated. The first magnetic field detector 402 can correspond to a sine bridge, and the second magnetic field detector 404 can correspond to a cosine bridge. In one embodiment, the magnetoresistive elements of the second magnetic field detector 404 can have the same general arrangement as the magnetoresistive elements of the first magnetic field detector 402, but are rotated 90 degrees from the arrangement of the first magnetic field detector 402.

The illustrated first magnetic field detector 402 includes a first group of magnetoresistive elements 412, a second group of magnetoresistive elements 414, a third group of magnetoresistive elements 416, and a fourth group of magnetoresistive elements 418. As a point of reference for describing angles, four vertical axes are shown in FIG. 20. These axes will be referred to as a reference axis. In this case, the reference axis is orthogonal to a detection axis, which would be horizontal for the first magnetic field detector 402 of FIG. 20.

The one or more magnetoresistive elements of the first group 412 are configured to carry current in a first current direction that is substantially parallel to a first axis that is at a first angle $\alpha_1$ relative to the reference axis. The current can be forced to travel along the first current direction in a variety of ways, such as by forming the magnetoresistive elements into relatively long and narrow stripes, which are lengthwise in the direction of the first current direction. However, other ways are possible as the majority of current will travel along the path of least resistance, and the magnetoresistive elements can be shaped other than relatively long and thin with the location of contacts governing the direction of current flow.

The one or more magnetoresistive elements of the second group 414 are configured to carry current in a second current direction that is substantially parallel to a second axis that is at a second angle $\alpha_2$ relative to the reference axis. The one or more magnetoresistive elements of the third group 416 are configured to carry current in a third current direction that is substantially parallel to a third axis that is at a third angle $\alpha_3$ relative to the reference axis. The one or more magnetoresistive elements of the fourth group 418 are configured to carry current in a fourth current direction that is substantially parallel to a fourth axis that is at a fourth angle $\alpha_4$ relative to the reference axis.

In certain embodiments, the angles $\alpha_1$, $\alpha_2$, $\alpha_3$, and $\alpha_4$ for the first magnetic field detector 402 of the quadrant detector 400 are selected to reduce and preferably cancel the presence of at least two even harmonics in the output signals of the first magnetic field detector 402 and the second magnetic field detector 404. In other embodiments, more than two even harmonics can be cancelled or reduced by adding additional groups of magnetoresistive elements.

Examples of amounts for the angles $\alpha_1$, $\alpha_2$, $\alpha_3$, and $\alpha_4$ for the first magnetic field detector 402 of the quadrant detector 400 can vary in a broad range. In some embodiments, the angles $\alpha_1$, $\alpha_2$, $\alpha_3$, and $\alpha_4$ are within a range of −39 to −33 degrees, −15 to −9 degrees, 9 to 15 degrees, and 33 to 39 degrees, respectively. In other embodiments, the angles $\alpha_1$, $\alpha_2$, $\alpha_3$, and $\alpha_4$ are within a range of −38 to −34 degrees, −14 to −10 degrees, 10 to 14 degrees, and 34 to 38 degrees, respectively. In other embodiments, the angles $\alpha_1$, $\alpha_2$, $\alpha_2$, and $\alpha_4$ are about −36, −12, 12, and 36 degrees, respectively.

Figure 21:
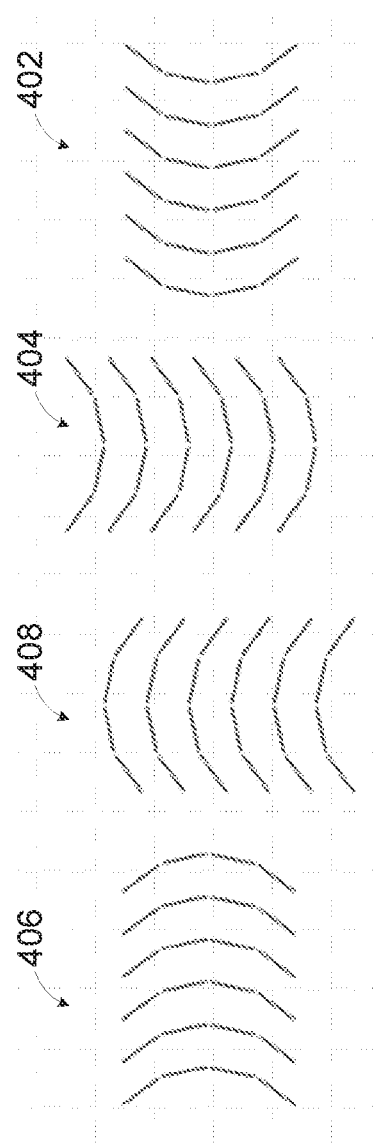
FIG. 21 illustrates a relatively compact arrangement of magnetoresistive elements for a quadrant detector or switch.

FIG. 21 illustrates a relatively compact arrangement of magnetoresistive elements for the quadrant detector 400. The magnetoresistive elements of the first magnetic field detector 402 and the second magnetic field detector 404 for FIG. 21 are in the same angles as those of FIG. 20, but have been rearranged for a more practical, space-saving layout. In certain embodiments, the quadrant detector 400 can have a single-ended configuration and includes the first magnetic field detector 402 and the second magnetic field detector 404. In other embodiments, the quadrant detector 400 has a differential configuration and includes the first magnetic field detector 402, the second magnetic field detector 404, a third magnetic field detector 406 and a fourth magnetic field detector 408. For differential operation, the third magnetic field detector 406 and the fourth magnetic field detector 408 should be arranged so that the magnetoresistive elements are about 180 degrees rotated from the magnetoresistive elements of the first magnetic field detector 402, the second magnetic field detector 404, respectively.

Figure 22:
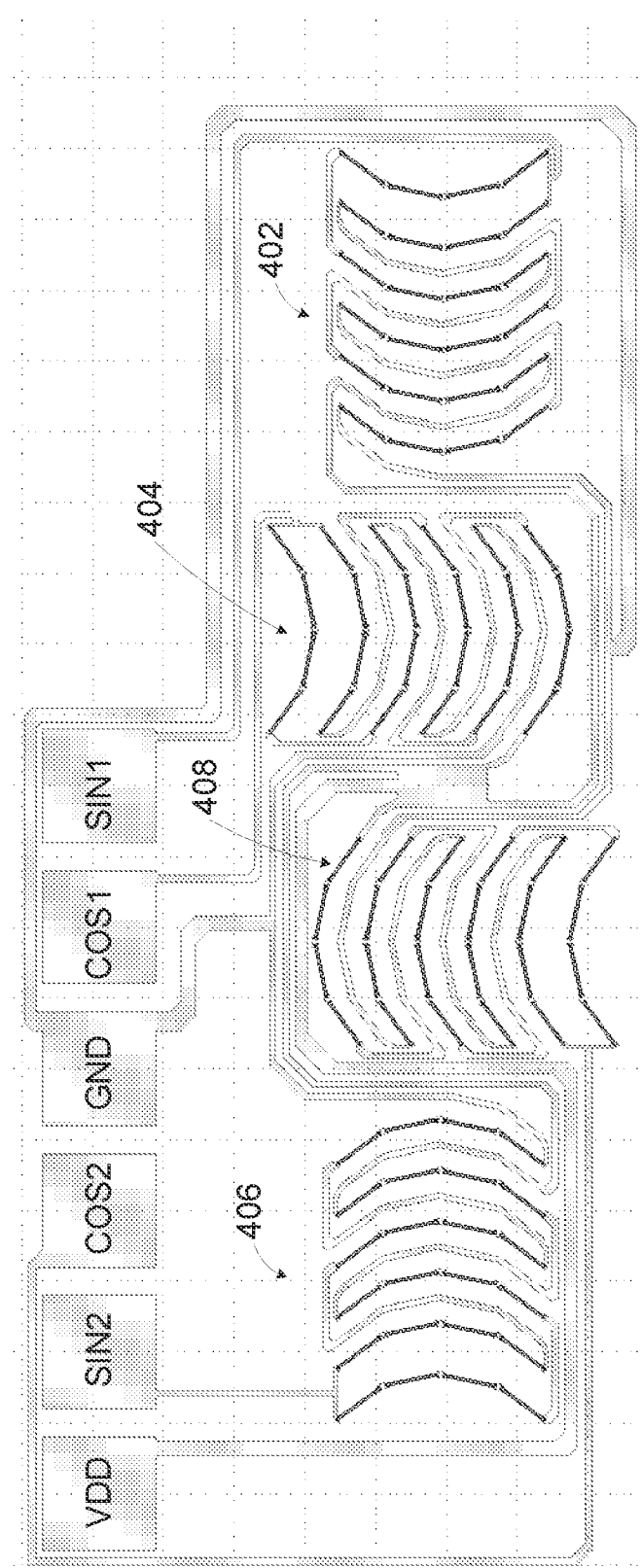
FIG. 22 illustrates electrical connections for the magnetoresistive elements of the quadrant detector of FIG. 21.

FIG. 22 illustrates electrical connections for the magnetoresistive elements of the quadrant detector of FIG. 21. The terminals or bond pads labeled COS1, SIN1, COS2, SIN2 can correspond to a first sensor output signal, a second sensor output signal, a third sensor output signal, and a fourth sensor output signal, respectively. Each of these signals (COS1, SIN1, COS2, SIN2) is an output of a half-bridge. These signals can be converted to digital and analyzed in digital domain, or can be combined initially in analog domain with, for example, a differential amplifier. For example, in differential operation, a differential amplifier can be used to subtract the first sensor output signal COS1 from the third sensor output signal COS2, and another differential amplifier can be used to subtract the second sensor output signal SIN1 from the fourth sensor output signal SIN2. The results of the subtraction operation can be converted to digital and the quadrant determined via analysis of the signs (positive or negative) or with reference to a lookup table.

Figure 23:
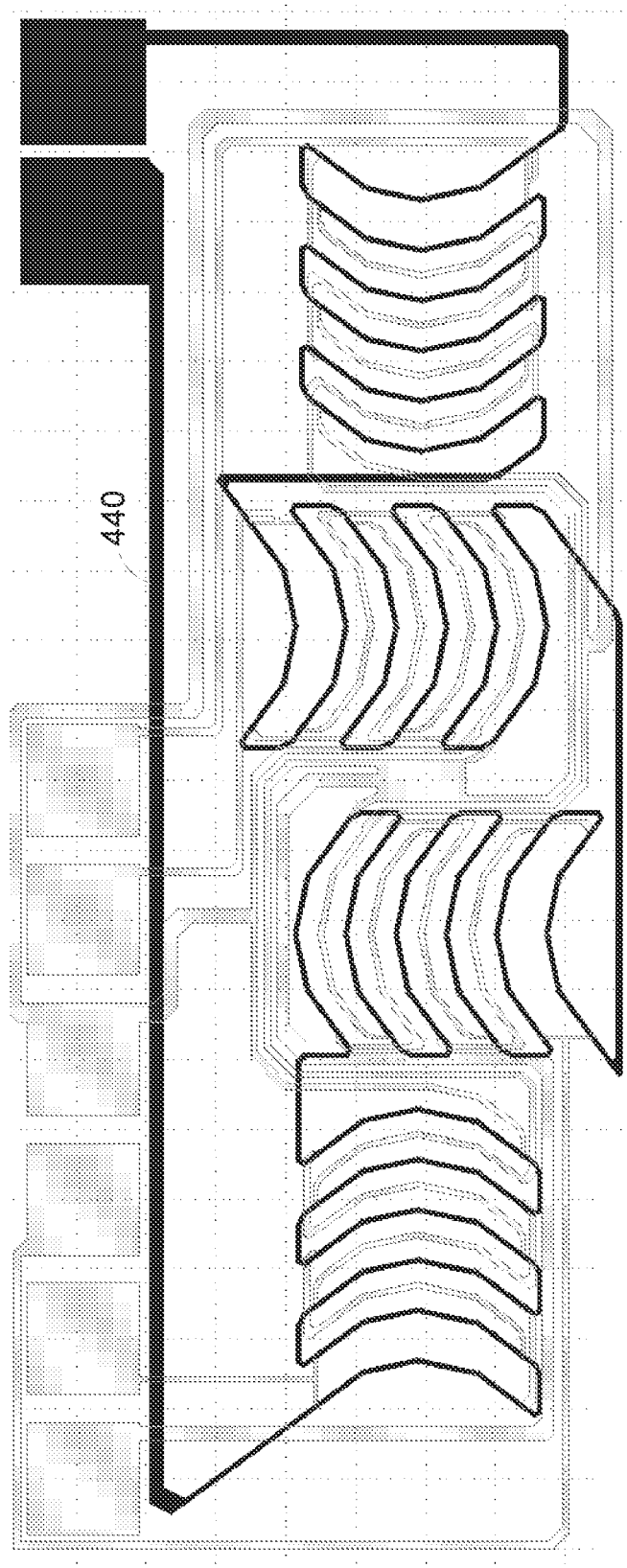
FIG. 23 illustrates a biasing conductor that can be used to generate a magnetic bias for perturbing the magnetic field for the magnetoresistive elements of the quadrant detector of FIG. 21.

FIG. 23 illustrates a biasing conductor 440 that can be used to generate a magnetic bias for perturbing the magnetic field. The biasing conductor can be implemented in a variety of ways. For example, the biasing conductor can be implemented by a single layer or by multiple layers. Fewer layers have the advantage of lower cost, but multiple layers in series with each other can offer power savings as the same current can be passed through multiple layers and generate a higher magnetic field for a given amount of current. For example, these layers can be above and/or below the layer of the magnetoresistive elements. In one example, the biasing conductor is implemented in a layer above and a layer below the magnetoresistive elements. In another example, the biasing conductor is implemented in two layers above and two layers below the magneto-resistive elements. Other variations will apply. It should also be noted that other ways of providing a perturbing magnetic field are applicable. For example, rather than generating a magnetic field via electrical current, a permanent magnet can alternatively be used.

FIG. 24 illustrates simulation results of the sensor outputs of the quadrant detector of FIGS. 20-23. The following conditions apply to the simulation. As described above, the example arrangement illustrated in FIG. 20 includes magnetoresistive stripes arranged at −36°, −12°, 12°, and 36° with respect to their respective axes of symmetry. The magnetoresistive stripes in this example are implemented with AMR sensor stripes having the dimensions of approximately 2 micrometers (μm) in width and 10 nanometers (nm) in thickness. The biasing conductor 440 or perturbation generator in this example has the dimensions of approximately 3 μm in width and 1 μm in thickness and is approximately 1 μm away from the layer containing the AMR sensor stripes. Other dimensions are applicable and will be readily determined by one of ordinary skill in the art. The magnetic field at a magnetoresistive element obtained by passing a current of 10 milliamps (mA) through the biasing conductor 440 is about 800 Amps/meter (A/M). Output signal levels at 10 mA are 0.174 mV/V. An AMR strip length to obtain 3 kilohms is 107 micrometers.

As illustrated in FIG. 24, the simulation results show that the combination of the outputs from the sine and cosine bridge resistors is different at least in each quadrant and without ambiguous points at or around the transitions from one quadrant to another (i.e., at around 0°, 90°, 180°, and 270°) over the full range of angles from 0 to 360 degrees. For example, the signal labeled Vout1 can correspond to the COS1 signal or to a difference between the COS1 and COS2 signals. The signal labeled Vout2 can correspond to the SIN1 signal or to a difference between the SIN1 and SIN2 signals. By examining the signs of the Vout1 and Vout2 signals, a particular quadrant can be uniquely identified by the quadrant detector. In one quadrant, both Vout1 and Vout2 signals can be positive, in another quadrant, both Vout1 and Vout2 signals can be negative, in another quadrant, the Vout1 signal can be positive and the Vout2 signal can be negative, and in another quadrant, the Vout1 signal can be negative and the Vout1 signal can be positive. Quadrant detection can be useful in rotating objects, like motors, rotors, hubs, wheels, shafts, and the like.

Figure 25:
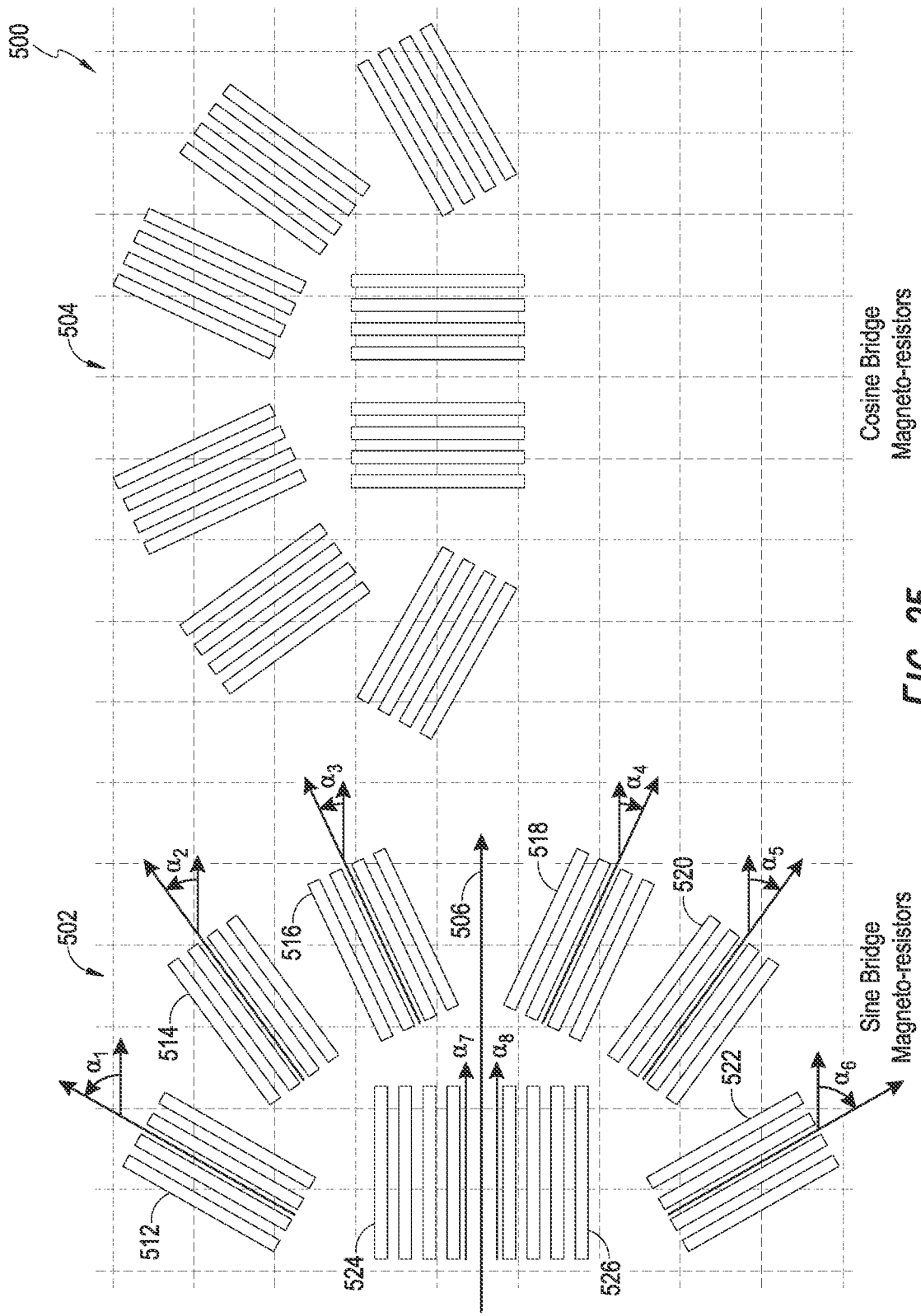
FIG. 25 illustrates an arrangement of magneto-resistors for a magnetic field direction or angle detector.

FIG. 25 shows another example arrangement of magnetoresistive elements or magneto-resistors ("resistors") of a detector according to one embodiment and a simulation sensor output result for the illustrated example arrangement. The example arrangement illustrated in FIG. 25 shows that sine and cosine bridge resistor stripes are arranged at varying angles relative to the respective detection axes or the axes perpendicular to the respective detection axes of the sine and cosine bridge resistor stripes. Two sets of these stripes correspond to each resistor in a bridge. See FIG. 2 for an example of a bridge or two half-bridges. One or more resistors of the bridge (preferably each resistor) can be split up into multiple groups, such as 4 or more groups, of magnetoresistive elements arranged at varying angles with respect to a reference axis in order to suppress or cancel harmonics. Accordingly, there can be 8 sets of bridge resistor stripes in each bridge. In the illustrated example of FIG. 25, the sine and cosine bridge resistor stripes each are arranged at −60.5°, −35.5°, −24.5°, −0.5°, 0.5°, 24.5°, 35.5°, and 60.5° with respect to their respective axes of symmetry, which are perpendicular to their respective detection axes.

The illustrated magnetic field direction or angle detector 500 includes a first magnetic field detector 502 and a second magnetic field detector 504. The first magnetic field detector 502 can correspond to a sine bridge, and the second magnetic field detector 504 can correspond to a cosine bridge. In one embodiment, the magnetoresistive elements of the second magnetic field detector 504 can have the same general arrangement as the magnetoresistive elements of the first magnetic field detector 502, but are rotated 90 degrees from the arrangement of the first magnetic field detector 502.

The illustrated first magnetic field detector 502 includes a first group of magnetoresistive elements 512, a second group of magnetoresistive elements 514, a third group of magnetoresistive elements 516, a fourth group of magnetoresistive elements 518, a fifth group of magnetoresistive elements 520, a sixth group of magnetoresistive elements 522, a seventh group of magnetoresistive elements 524, and an eighth group of magnetoresistive elements 526. As a point of reference for describing angles, a reference axis 501 is shown in FIG. 25. The reference axis is orthogonal to a detection axis, which would be a horizontal for the first magnetic field detector 502 of FIG. 25, and vertical for the second magnetic field detector 504.

The one or more magnetoresistive elements of the first group 512 are configured to carry current in a first current direction that is substantially parallel to a first axis that is at a first angle $\alpha_1$ relative to the reference axis 501. The current can be forced to travel along the first current direction in a variety of ways, such as by forming the magnetoresistive elements into relatively long and narrow stripes, which are lengthwise in the direction of the first current direction. However, other ways are possible as the majority of current will travel along the path of least resistance, and the magnetoresistive elements can be shaped other than relatively long and thin with the location of contacts governing the direction of current flow.

The one or more magnetoresistive elements of the second group 514 are configured to carry current in a second current direction that is substantially parallel to a second axis that is at a second angle $\alpha_2$ relative to the reference axis 501. The one or more magnetoresistive elements of the third group 516 are configured to carry current in a third current direction that is substantially parallel to a third axis that is at a third angle $\alpha_3$ relative to the reference axis 501. The one or more magnetoresistive elements of the fourth group 518 are configured to carry current in a fourth current direction that is substantially parallel to a fourth axis that is at a fourth angle $\alpha_4$ relative to the reference axis 501.

The one or more magnetoresistive elements of the fifth group 520 are configured to carry current in a fifth current direction that is substantially parallel to a fifth axis that is at a fifth angle as relative to the reference axis 501. The one or more magnetoresistive elements of the sixth group 522 are configured to carry current in a sixth current direction that is substantially parallel to a sixth axis that is at a sixth angle $\alpha_6$ relative to the reference axis 501. The one or more magnetoresistive elements of the seventh group 524 are configured to carry current in a seventh current direction that is substantially parallel to a seventh axis that is at a seventh angle $\alpha_7$ relative to the reference axis 501. The one or more magnetoresistive elements of the eighth group 526 are configured to carry current in an eighth current direction that is substantially parallel to an eighth axis that is at an eighth angle as relative to the reference axis 501.

In certain embodiments, the angles $\alpha_1$, $\alpha_2$, $\alpha_3$, $\alpha_4$, $\alpha_5$, $\alpha_6$, $\alpha_7$, and $\alpha_8$ for the first magnetic field detector 502 of the magnetic field direction detector 500 are selected to reduce and preferably cancel the presence of a third harmonic and at least one other harmonic in the output signals of the first magnetic field detector 502 and the second magnetic field detector 504. In some embodiments, the at least one other harmonic can be the 5th harmonic. In other embodiments, the at least one other harmonic can be the 5th harmonic and the 8th harmonic. Additional or alternative harmonics can be cancelled or reduced by other arrangements than those shown.

Examples of amounts for the angles $\alpha_a$, $\alpha_2$, $\alpha_3$, $\alpha_4$, $\alpha_4$, $\alpha_5$, $\alpha_6$, $\alpha_7$, and $\alpha_8$ for the first magnetic field detector 502 of the magnetic field direction detector 500 can vary in a broad range. In some embodiments, with 3rd, 5th, and 8th harmonic cancellation and 8 groups, the angles $\alpha_1$, $\alpha_2$, $\alpha_3$, $\alpha_4$, $\alpha_5$, $\alpha_6$, $\alpha_7$, and $\alpha_8$ are within a range of 57.2 to 63.2 degrees, 32.5 to 38.5 degrees, 21.29 to 27.29 degrees, −21.29 to −27.29 degrees, −32.5 to −38.5 degrees, −57.2 to −63.2 degrees, −2.5 to 3.5 degrees, and −3.5 to 2.5 degrees, respectively. In other embodiments, the angles $\alpha_1$, $\alpha_2$, $\alpha_3$, $\alpha_4$, $\alpha_5$, $\alpha_6$, $\alpha_7$, and $\alpha_8$ are within a range of 58.2 to 62.2 degrees, 33.5 to 37.5 degrees, 22.29 to 26.29 degrees, −22.29 to −26.29 degrees, −33.5 to −37.5 degrees, −28.2 to −62.2 degrees, −1.5 to 2.5 degrees, and −2.5 to 1.5 degrees, respectively. In other embodiments, the angles $\alpha_1$, $\alpha_2$, $\alpha_3$, $\alpha_4$, $\alpha_5$, $\alpha_6$, $\alpha_7$, and $\alpha_8$ are about 60.2 degrees, 35.5 degrees, 24.29 degrees, −24.29 degrees, −35.5 degrees, −60.2 degrees, 0.5 degrees, and −0.5 degrees, respectively.

As illustrated above, the seventh and eighth groups have almost the same angle. In some embodiments, instead of having separate seventh and eighth groups, the two groups can be merged into a single seventh group having twice the length as the other groups. In some embodiments (not drawn), with 3rd, 5th, and 8th harmonic cancellation and 7 groups, the angles $\alpha_1$, $\alpha_2$, $\alpha_3$, $\alpha_4$, $\alpha_5$, $\alpha_6$, and $\alpha_7$ are within a range of 57.2 to 63.2 degrees, 32.5 to 38.5 degrees, 21.29 to 27.29 degrees, −21.29 to −27.29 degrees, −32.5 to −38.5 degrees, −57.2 to −63.2 degrees, and −3.5 to 3.5 degrees, respectively. In other embodiments, the angles $\alpha_1$, $\alpha_2$, $\alpha_3$, $\alpha_4$, $\alpha_5$, $\alpha_6$, and $\alpha_7$ are within a range of 58.2 to 62.2 degrees, 33.5 to 37.5 degrees, 22.29 to 26.29 degrees, −22.29 to −26.29 degrees, −33.5 to −37.5 degrees, −28.2 to −62.2 degrees, and −2.5 to 2.5 degrees, respectively.

In another example (not drawn), with 3rd and 5th harmonic cancellation and 4 groups, the angles $\alpha_1$, $\alpha_2$, $\alpha_3$, and $\alpha_4$, are within a range of 45 to 51 degrees, 9 to 15 degrees, −9 to −15 degrees, −45 to −51 degrees, respectively. In other embodiments, the angles $\alpha_1$, $\alpha_2$, $\alpha_3$, and $\alpha_4$, are within a range of 46 to 50 degrees, 10 to 14 degrees, −10 to −14 degrees, and −46 to −50 degrees, respectively. In other embodiments, the angles $\alpha_1$, $\alpha_2$, $\alpha_3$, and $\alpha_4$, are within a range of 47 to 49 degrees, 11 to 13 degrees, −11 to −13 degrees, and −47 to −49 degrees, respectively.

Figure 26:
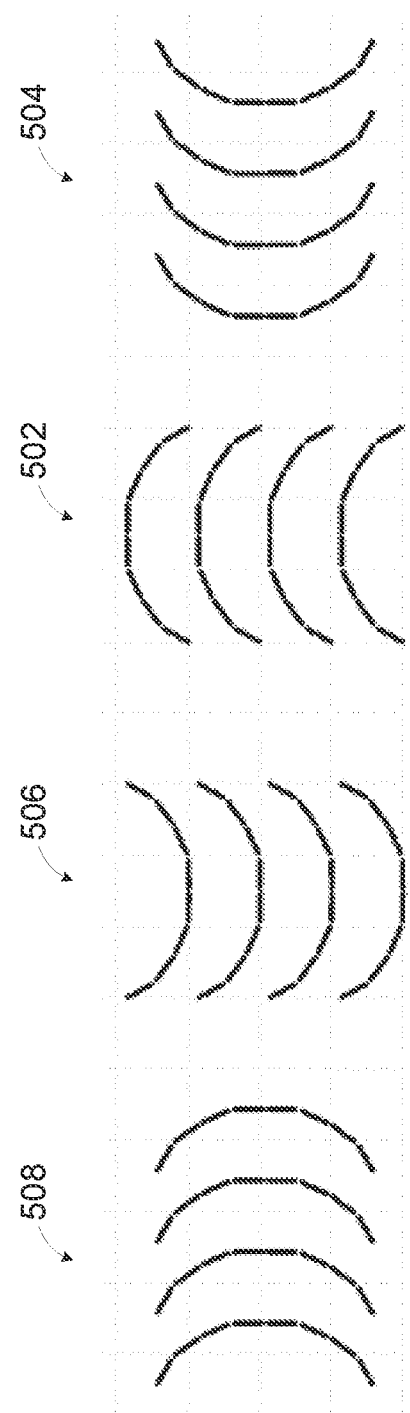
FIG. 26 illustrates a relatively compact arrangement of magnetoresistive elements for a magnetic field direction or angle detector.

FIG. 26 illustrates a relatively compact arrangement of magnetoresistive elements for a magnetic field direction detector 500. The magnetoresistive elements of the first magnetic field detector 502 and the second magnetic field detector 504 for FIG. 26 are in the same angles as those of FIG. 25, but have been rearranged for a more practical, space-saving layout. In certain embodiments, the magnetic field direction detector 500 can have a single-ended configuration and includes the first magnetic field detector 502 and the second magnetic field detector 504. In other embodiments, the magnetic field direction detector 500 has a differential configuration and includes the first magnetic field detector 502, the second magnetic field detector 504, a third magnetic field detector 506 and a fourth magnetic field detector 508. For differential operation, the third magnetic field detector 506 and the fourth magnetic field detector 508 should be arranged so that the magnetoresistive elements are about 180 degrees rotated from the magnetoresistive elements of the first magnetic field detector 502, the second magnetic field detector 504, respectively.

Figure 27:
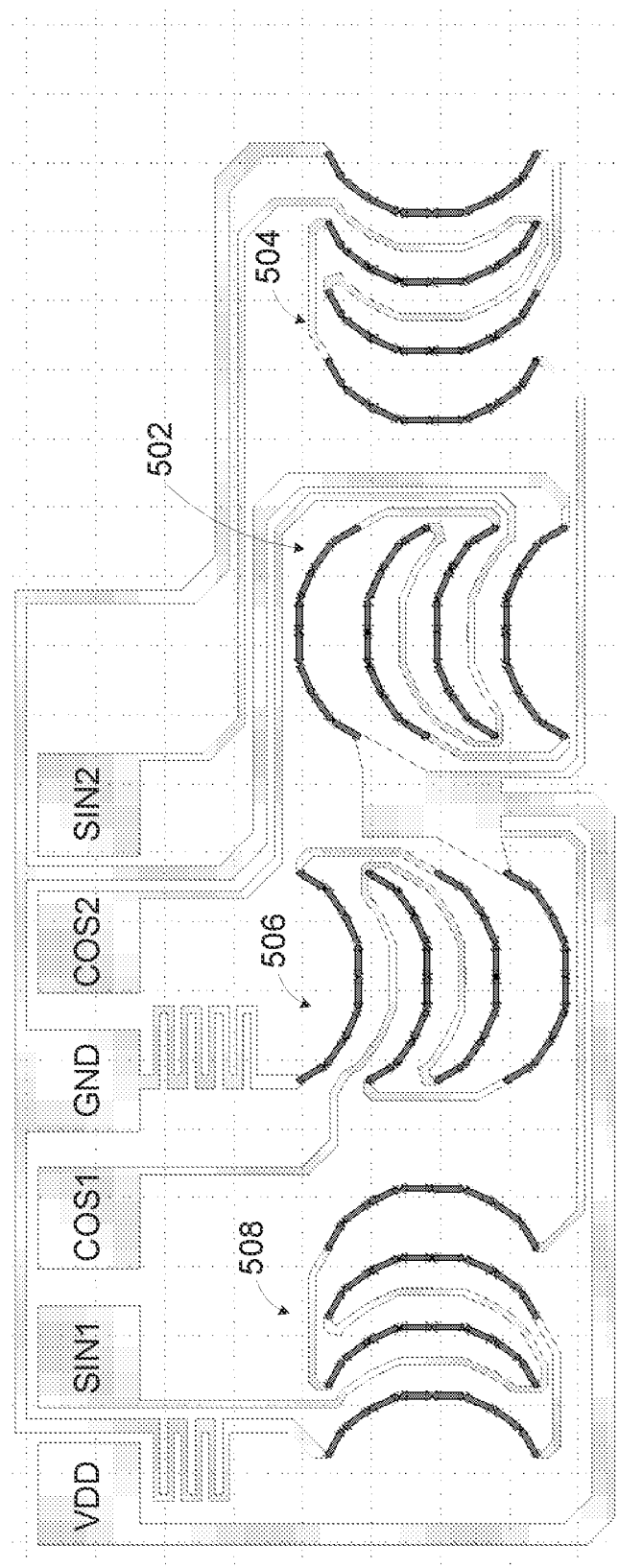
FIG. 27 illustrates electrical connections for the magnetoresistive elements of the magnetic field direction detector of FIG. 26.

FIG. 27 illustrates electrical connections for the magnetoresistive elements of the magnetic field direction detector 500 of FIG. 26. The terminals or bond pads labeled COS1, SIN1, COS2, SIN2 can correspond to a first sensor output signal, a second sensor output signal, a third sensor output signal, and a fourth sensor output signal, respectively. Each of these signals (COS1, SIN1, COS2, SIN2) is an output of a half-bridge. These signals can be converted to digital and analyzed in digital domain, or can be combined initially in analog domain with, for example, a differential amplifier. For example, in differential operation, a differential amplifier can be used to subtract the first sensor output signal COS1 from the third sensor output signal COS2, and another differential amplifier can be used to subtract the second sensor output signal SIN1 from the fourth sensor output signal SIN2. The results of the subtraction operation can be converted to digital and the angle determined via analysis with reference to a lookup table that can include calibration data.

Figure 28:
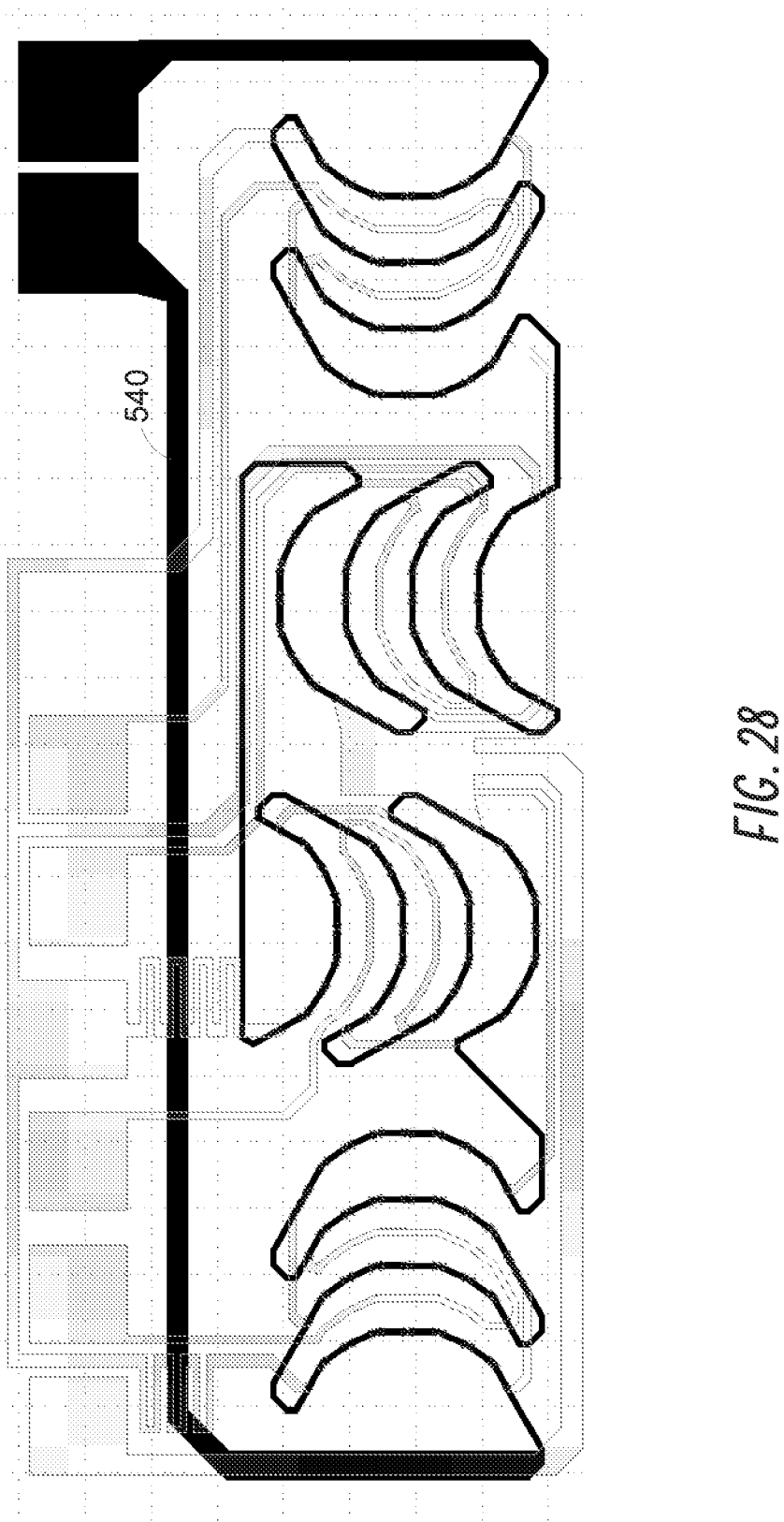
FIG. 28 illustrates a biasing conductor that can be used to generate a magnetic bias for perturbing the magnetic field for the magnetoresistive elements of the magnetic field direction detector.

FIG. 28 illustrates a biasing conductor 540 that can be used to generate a magnetic bias for perturbing the magnetic field for the magnetoresistive elements of the magnetic field direction detector 500. The biasing conductor can be implemented in a variety of ways. For example, the biasing conductor can be implemented by a single layer or by multiple layers. Fewer layers have the advantage of lower cost, but multiple layers in series with each other can offer power savings as the same current can be passed through multiple layers and generate a higher magnetic field for a given amount of current. For example, these layers can be above and/or below the layer of the magnetoresistive elements. In one example, the biasing conductor is implemented in a layer above and a layer below the magnetoresistive elements. In another example, the biasing conductor is implemented in two layers above and two layers below the magneto-resistive elements. Other variations will apply. It should also be noted that other ways of providing a perturbing magnetic field are applicable. For example, rather than generating a magnetic field via electrical current, a permanent magnet can alternatively be used.

Figure 29:
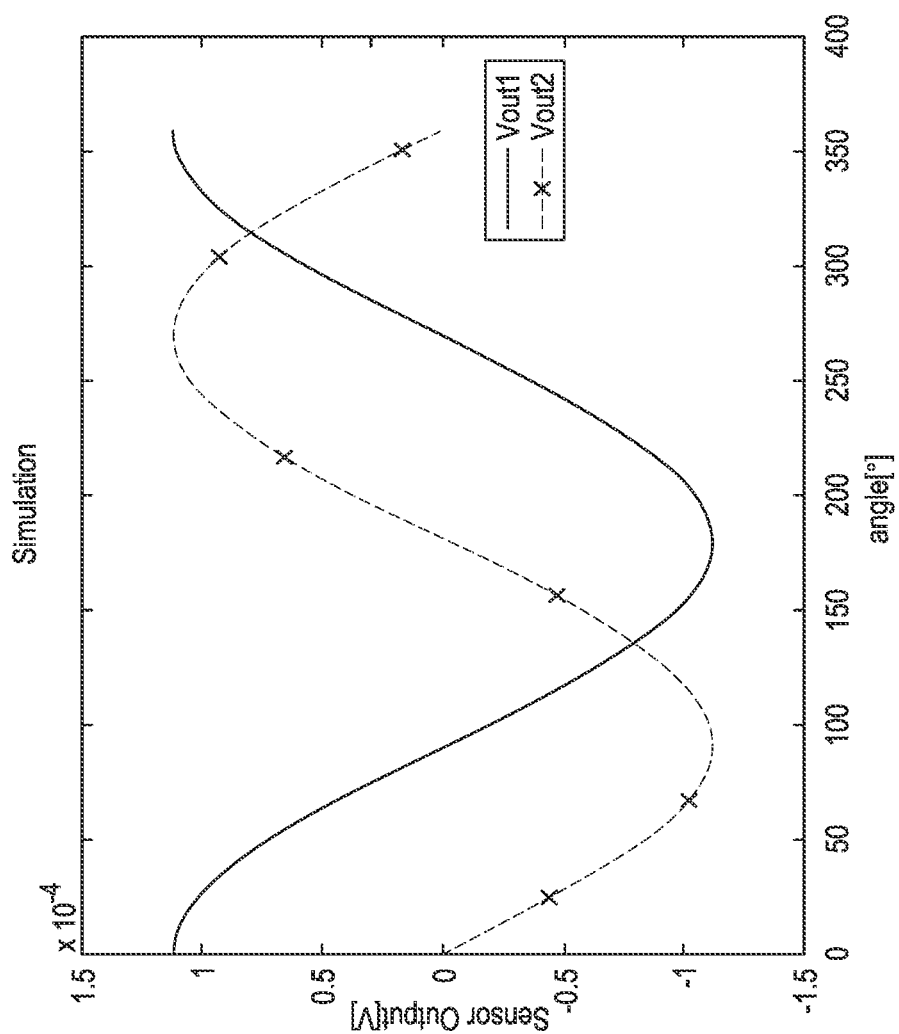
FIG. 29 illustrates simulation results for the magnetic field direction detector of FIGS. 25-28.

FIG. 29 illustrates simulation results for the magnetic field direction detector 500 of FIGS. 25-28. The following conditions apply to the simulation. The example arrangement illustrated in FIGS. 25-28, or the SIN/COS or angle design, can include magnetoresistive stripes arranged at −60.5°, −35.5°, −24.5°, −0.5°, 0.5°, 24.5°, 35.5°, and 60.5° with respect to their respective axes of symmetry. The magnetoresistive stripes in this example are implemented with AMR sensor stripes having the dimensions of approximately 3 μm in width and 10 nm in thickness. The biasing conductor 540 or perturbation generator in this example can have the dimensions of approximately 4 μm in width and 1 μm in thickness and is approximately 1 μm away from the layer containing the AMR sensor stripes. Other dimensions are applicable and will be readily determined by one of ordinary skill in the art. In addition to the simulated sensor outputs similar to the ones illustrated in FIGS. 20-21, FIG. 22 also includes the simulated magnetic field when approximately 10 mA of current is applied to the bias conductor or perturbation generator.

The magnetic field at a magnetoresistive element obtained by passing a current of 10 milliamps (mA) through the biasing conductor 540 is about 720 Amps/meter (A/M). An output signal level with 10 mA of biasing current is about 0.162 mV/V. An AMR strip length to obtain 3 kilohms is 161 μm. The simulation results indicate an expected error of about ±15 degrees.

The simulation of the sensor outputs of the sine and cosine bridge sensors of FIG. 29 shows that each output wave has a period of about 360° rather than about 180°, which allows the combination of the sine and cosine bridge resistor outputs to be unique throughout the full range of angles from 0 to 360 degrees. The combination of the sine and cosine bridge resistor outputs allows determining the angle or direction of an external magnetic field detected by the magnetoresistive sensors arranged in the bridge configurations determinatively. For example, the signal labeled Vout1 can correspond to the SIN1 signal or to a difference between the SIN1 and SIN2 signals. The signal labeled Vout2 can correspond to the COS1 signal or to a difference between the COS1 and COS2 signals. By examining the signs and magnitudes of the Vout1 and Vout2 signals, a particular angle can be uniquely identified by the magnetic field direction detector 500. For example, the signs and magnitudes can be compared to data stored in a lookup table. Angle detection can be useful in rotating objects, like motors, rotors, hubs, wheels, shafts, and the like.

Figure 30:
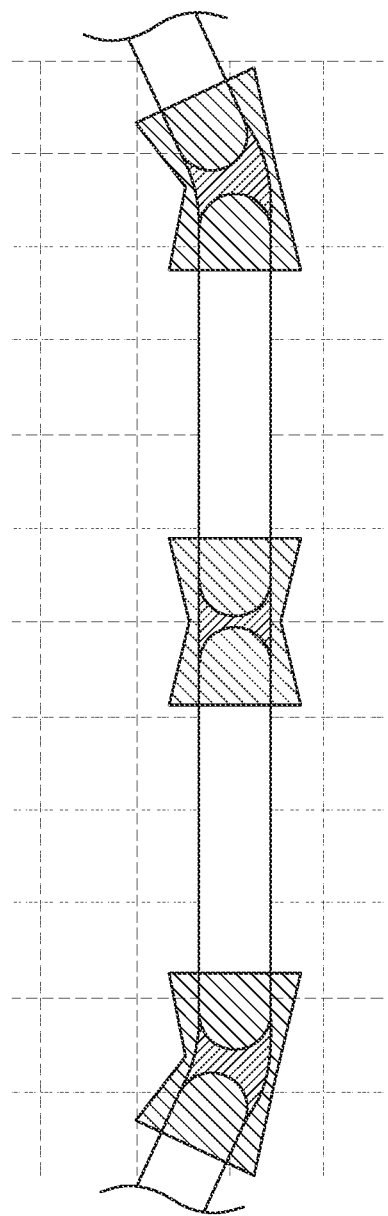
FIG. 30 illustrates an example of a magnetoresistive element with relatively long and narrow stripes.
Figure 31:
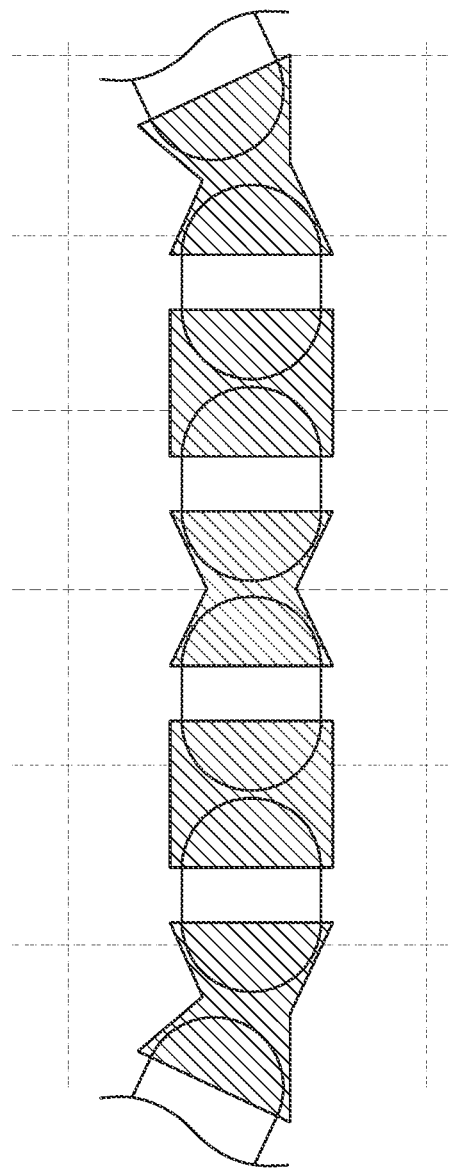
FIG. 31 illustrates an example of a magnetoresistive element with relatively short and wide stripes.

FIG. 30 illustrates an example of a magnetoresistive element with relatively long and narrow stripes. FIG. 31 illustrates an example of a magnetoresistive element with relatively short and wide stripes. Relatively shorter and wider stripes can have less form anisotropy than relatively longer and narrower stripes. This advantageously reduces sudden jumps of magnetic domains, which results in a smoother output as shown in FIGS. 32 and 33.

Figure 32:
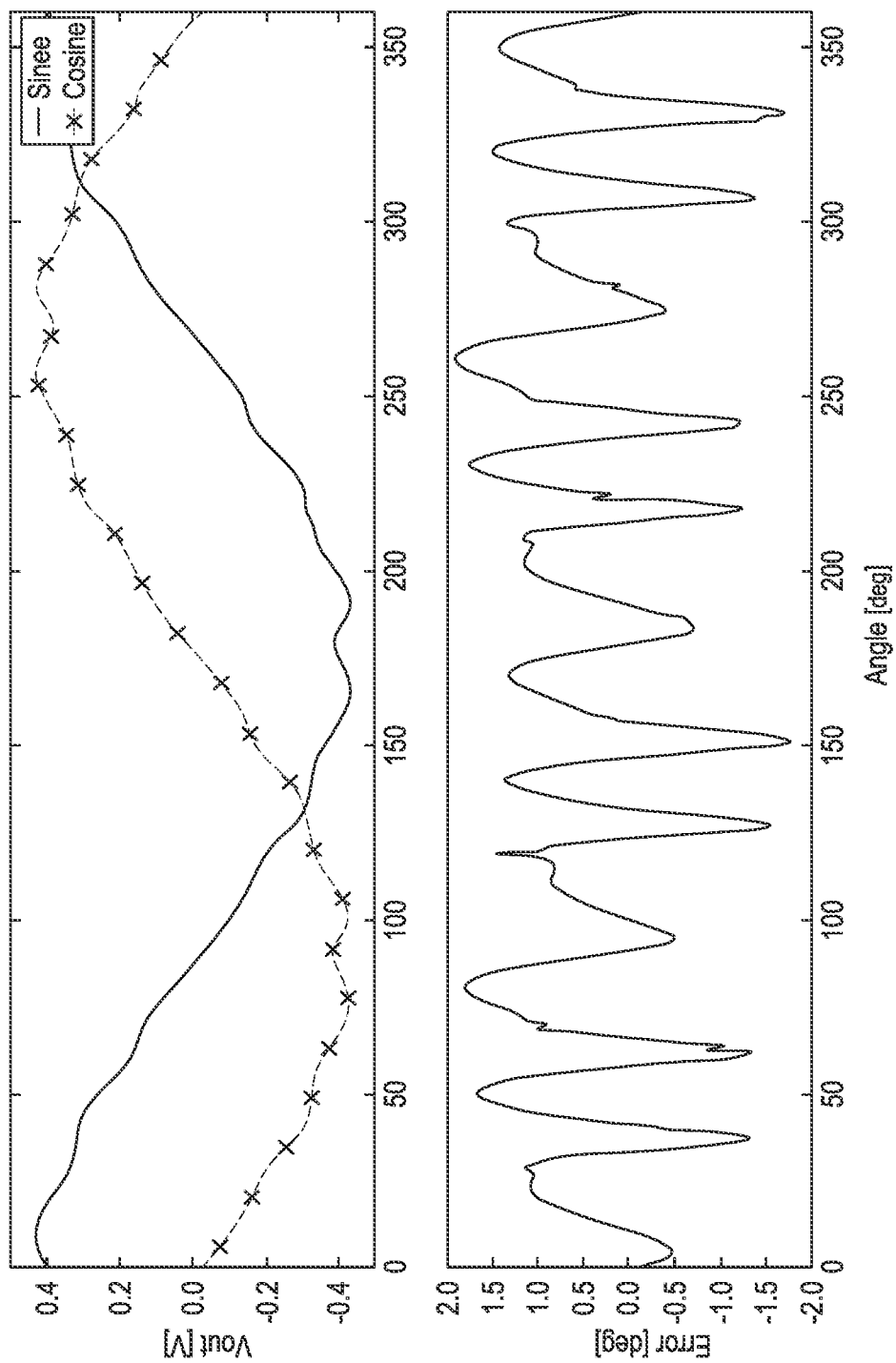
FIG. 32 illustrates measurement results of a magnetic field direction detector with 2 μm wide magnetoresistive element stripes.
Figure 33:
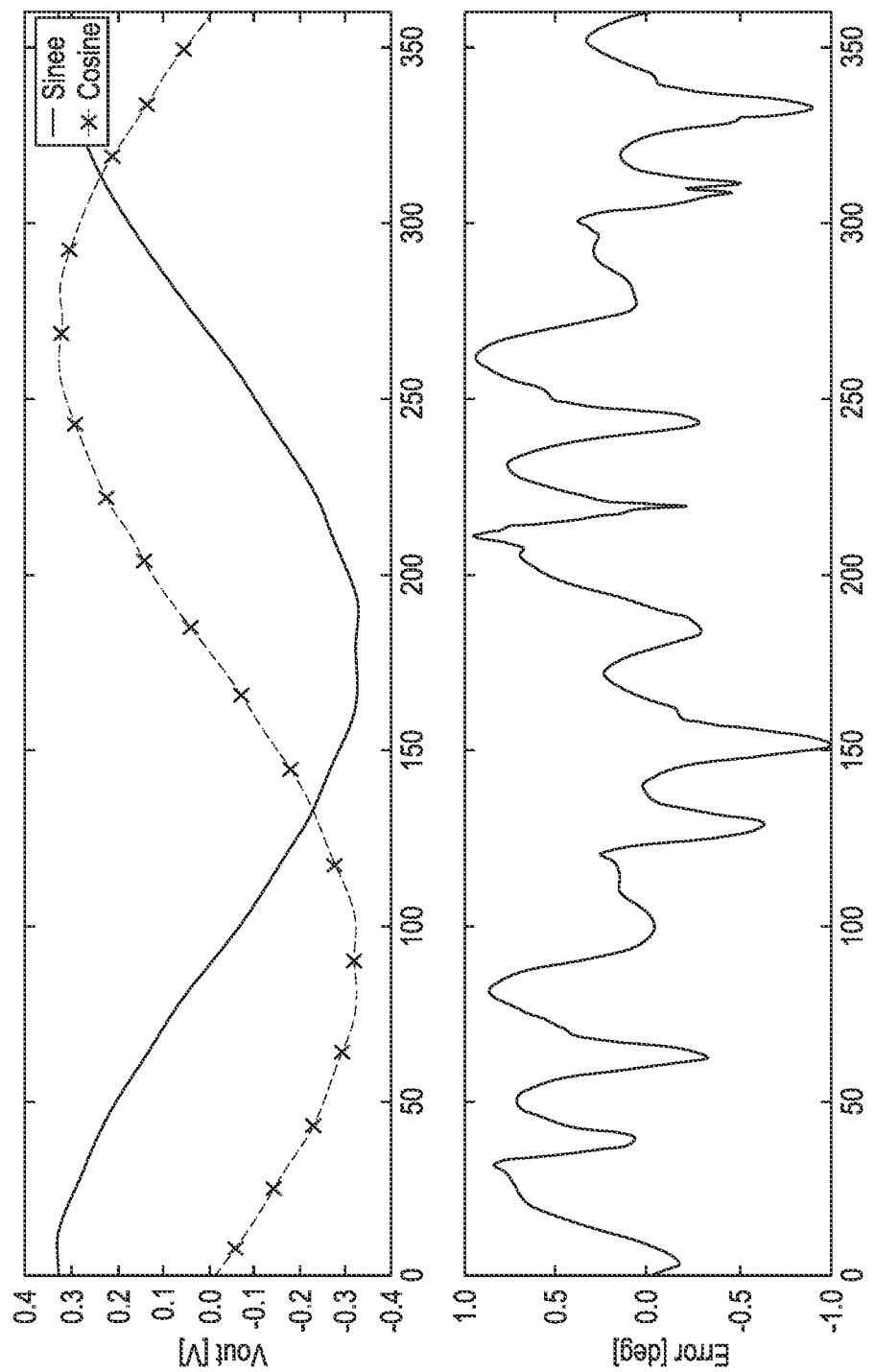
FIG. 33 illustrates measurement results of a magnetic field direction detector with 4 μm wide magnetoresistive element stripes.

FIG. 32 illustrates measurement results of a magnetic field direction detector with 2 μm wide magnetoresistive element stripes. FIG. 33 illustrates measurement results of a magnetic field direction detector with 4 μm wide magnetoresistive element stripes. As illustrated in FIGS. 32 and 33, the output voltage is smoother and has less error with the relatively wider stripes.

Without the harmonic cancellation techniques disclosed herein, a magnetic field direction detector can have relatively large amounts of 3rd, 5th, and 8th harmonics. Other harmonics exist, but are of smaller magnitude. A technique to determine preliminary angles to use for harmonic cancellation will now be described. These preliminary angles can then be further optimized by experimentation, which can be performed via simulation. The preliminary angles can be determined sequentially by splitting a magnetoresistive element into two, with an angle between the two of 180 degrees divided by the harmonic.

For reduction or cancellation of the 3rd harmonic, a magnetoresistive element initially aligned to a reference axis can be split into two elements having 180 degrees divided by 3 or 60 degrees separation. 60 degrees also corresponds to ±30 degrees.

For further reduction or cancellation of the 5th harmonic, the two elements are split again into 180 degrees divided by 5, or 36 degrees. 36 degrees also corresponds to ±18 degrees. By combining ±30 degrees and ±18 degrees, preliminary angles of 48 degrees, 12 degrees, −12 degrees, and −48 degrees are obtained.

For further reduction or cancellation of the 8th harmonic, the four elements are split into 180 degrees divided by 8, or 22.5 degrees. 22.5 degrees corresponds to ±11.25 degrees. By combining ±30 degrees, ±18 degrees, and ±11.25 together, preliminary angles of 59.25 degrees, 36.75 degrees, 23.25 degrees, 0.75 degrees, −0.75 degrees, −23.25 degrees, −36.75 degrees, and −59.25 degrees are obtained. These preliminary angles can then be adjusted via experimentation. In some embodiments, angles of ±60.2 degrees, ±35.5 degrees, ±24.29 degrees, and ±0.5 degrees are used as more optimal amounts.

Figure 34:
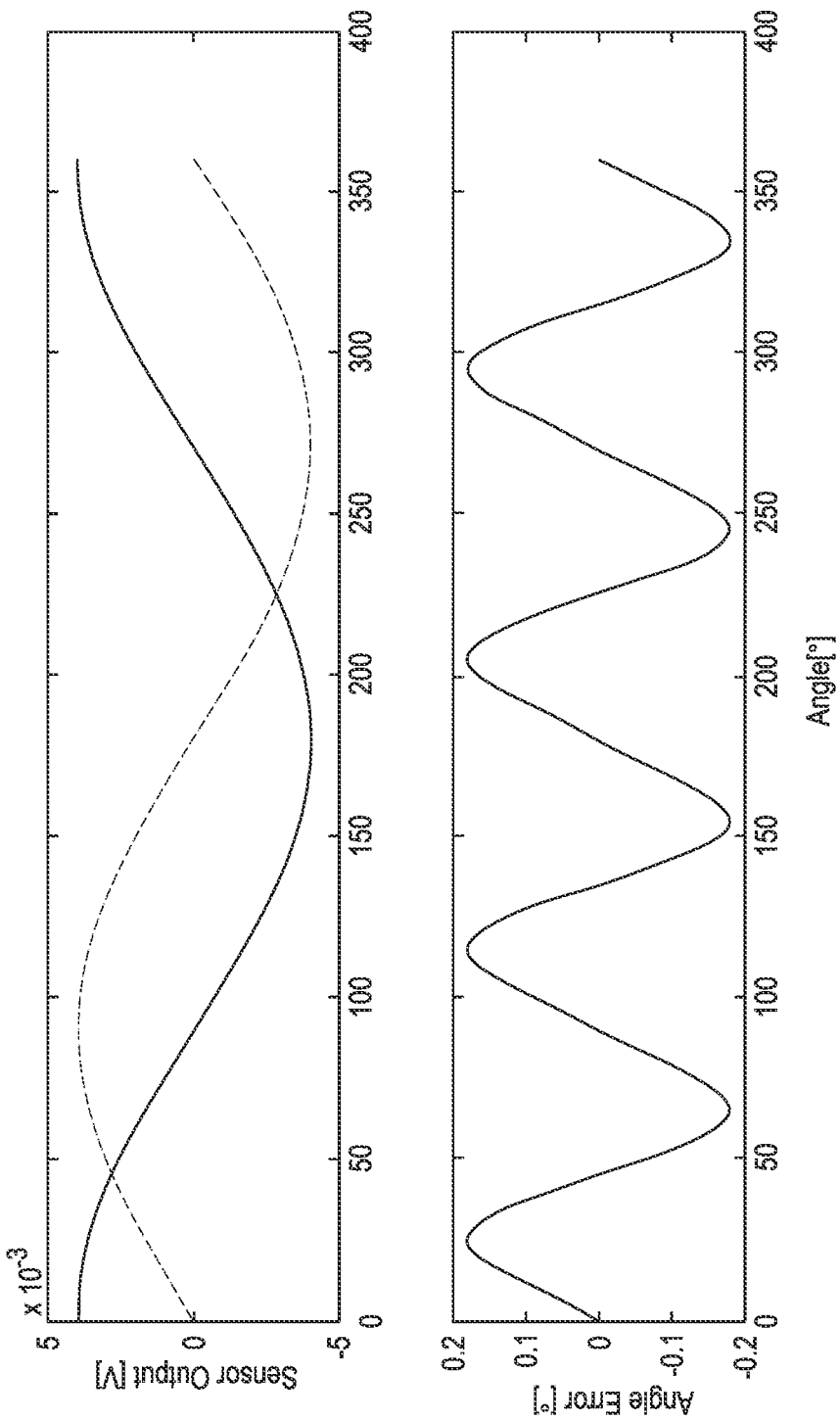
FIG. 34 illustrates simulation results of a magnetic field direction detector with magnetoresistive element stripes arranged at ±60.5 degrees, ±35.5 degrees, ±24.5 degrees and ±0.5 degrees.
Figure 35:
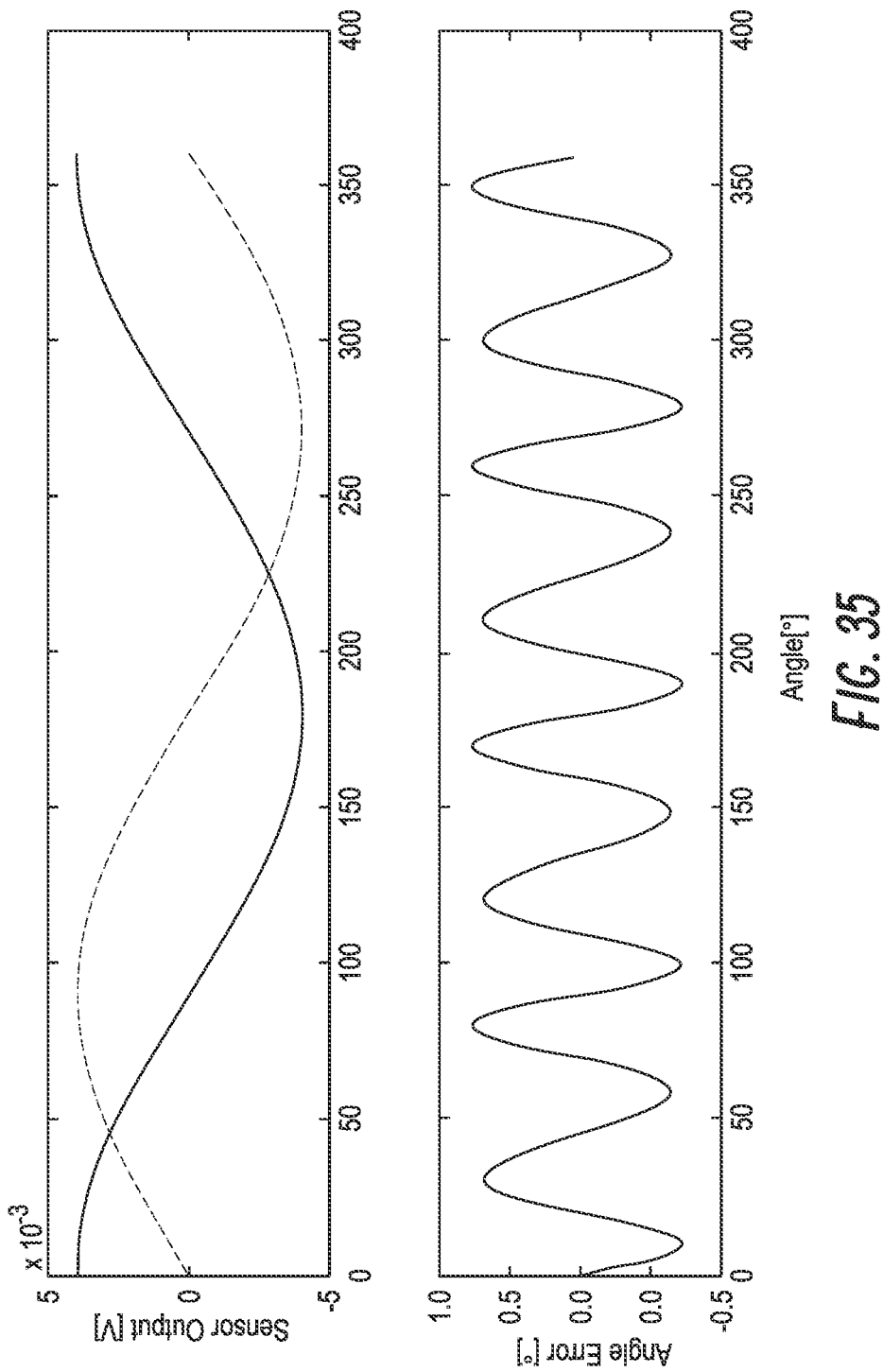
FIG. 35 illustrates simulation results of a magnetic field direction detector with magnetoresistive element stripes arranged at ±60.2 degrees, ±35.5 degrees, ±24.2935 degrees and ±0.5 degrees.

FIG. 34 illustrates simulation results of a magnetic field direction detector with magnetoresistive element stripes arranged at ±60.5 degrees, ±35.5 degrees, ±24.5 degrees and ±0.5 degrees. FIG. 35 illustrates simulation results of a magnetic field direction detector with magnetoresistive element stripes arranged at ±60.2 degrees, ±35.5 degrees, ±24.2935 degrees and ±0.5 degrees. As illustrated by the simulation results, the configuration of FIG. 35 has somewhat better optimization.

Figure 36:
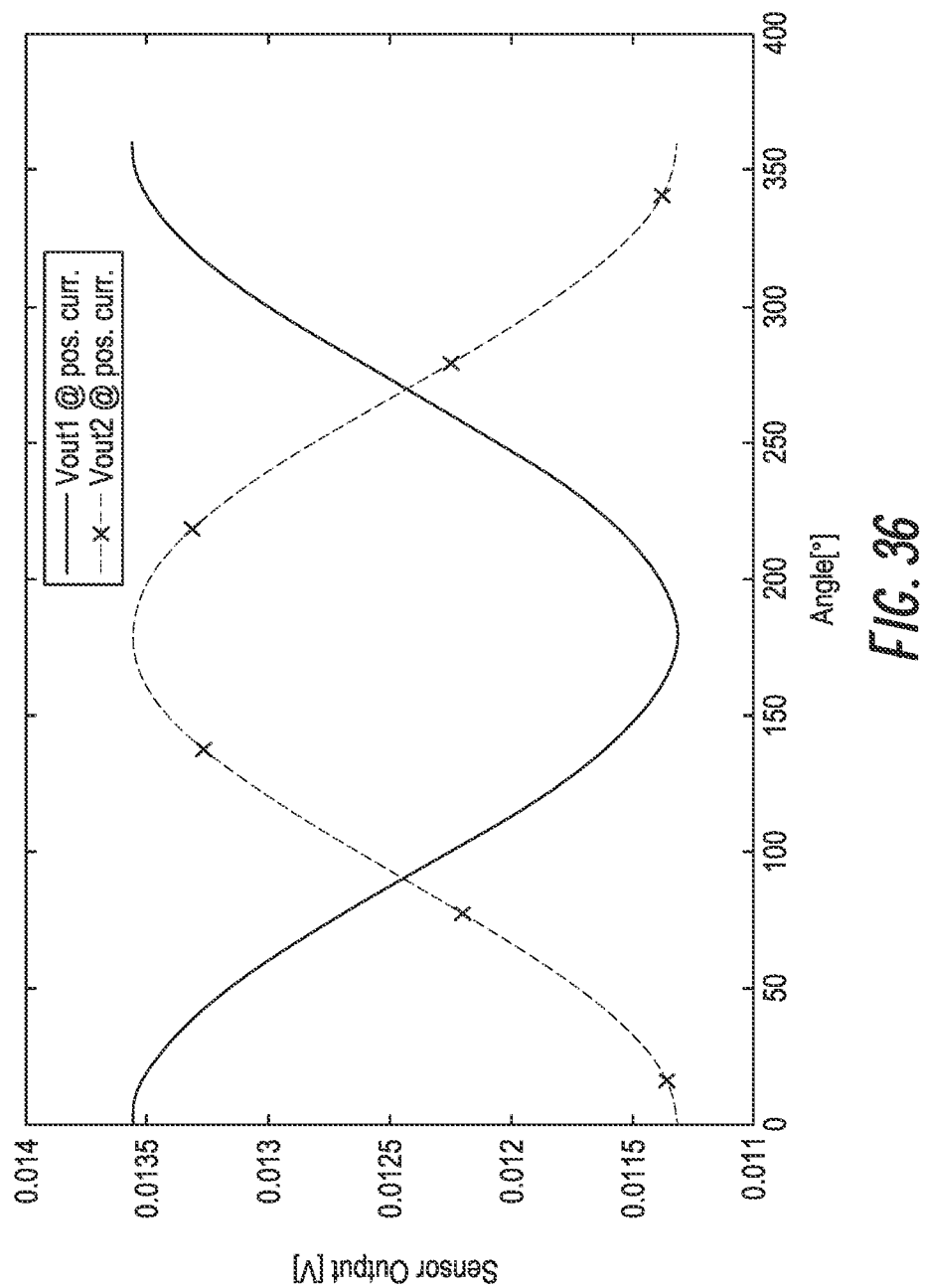
FIG. 36 illustrates simulation results of a half-bridge of a magnetic field detector with positive and negative biasing current directions.

FIG. 36 illustrates a simulation results of a half bridge of the magnetic field detector of FIGS. 25-28 with the biasing conductor 540 carrying current in a positive direction and in a negative direction. While illustrated in the context of using the same magnitude biasing current in two different directions, the principles and advantages can be extended to differences in biasing currents. For example, if two different amounts of biasing current are used, then based on the observations of their impact on the DC offsets, the DC offset can be estimated and cancelled. For example, a first biasing current of 5 mA and a second biasing current of 15 mA in the same direction can be used. The straightforward way presented herein is to have the same magnitude but opposite direction. However, as long as at least one of magnitude or direction differs between a first biasing current and a second biasing current, the effects of the biasing current on DC offset can be observed and reduced or eliminated.

Returning now to FIG. 36, applying positive and negative currents, respectively, to the biasing conductor 540 or perturbation generator results in opposite magnetoresistive sensor bridge outputs having the same DC offset, which can be attributed to various non-ideal characteristics of the sensors, conductors, and/or other elements or environmental factors (e.g., temperature) that are present and common in both cases (i.e., positive and negative applied currents). In this example, the offset of the sensor outputs is about 0.0124 V, and by processing the two outputs with positive and negative applied currents, this DC offset can be reduced or eliminated. This reduction in the DC offset advantageously permits embodiments of the invention to better distinguish between signals and offsets. While illustrated in connection with the magnetic field direction detector 500 of FIGS. 25-28, the principles and advantages of DC offset cancellation are generally applicable to other arrangements. In addition, the DC offset cancellation techniques disclosed herein are applicable to both single-ended and to differential configurations. Furthermore, the DC offset cancellation techniques disclosed herein are also applicable to linear detectors.

Figure 38:
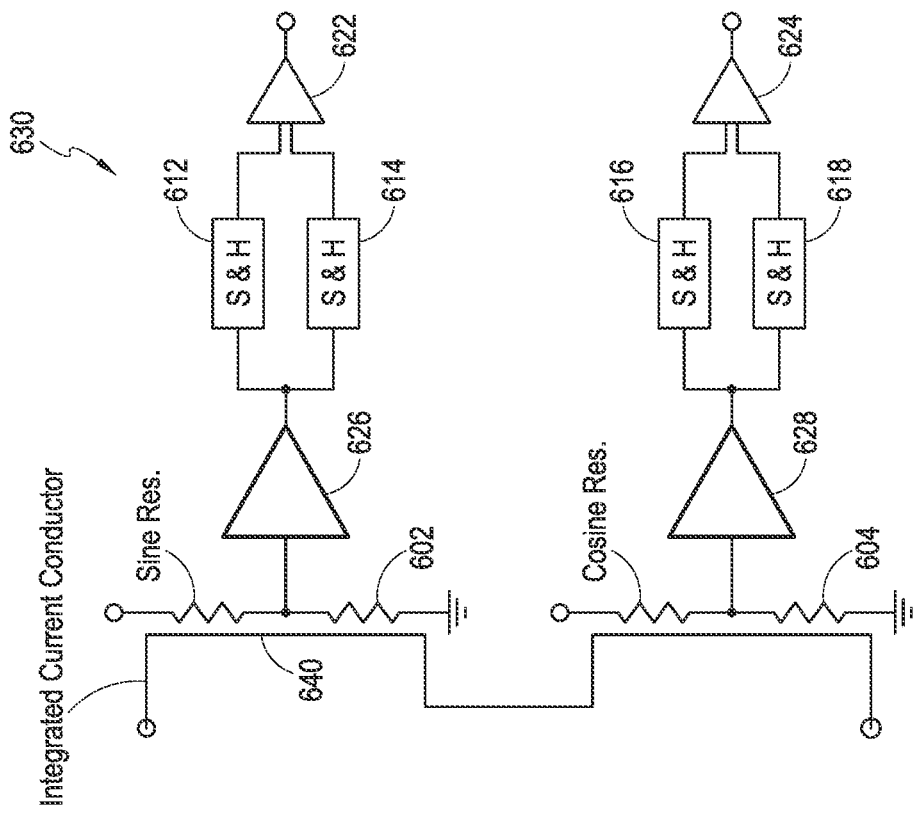
FIGS. 37 and 38 illustrate diagrams of magnetic field detectors incorporating DC offset correction circuitry.
Figure 37:
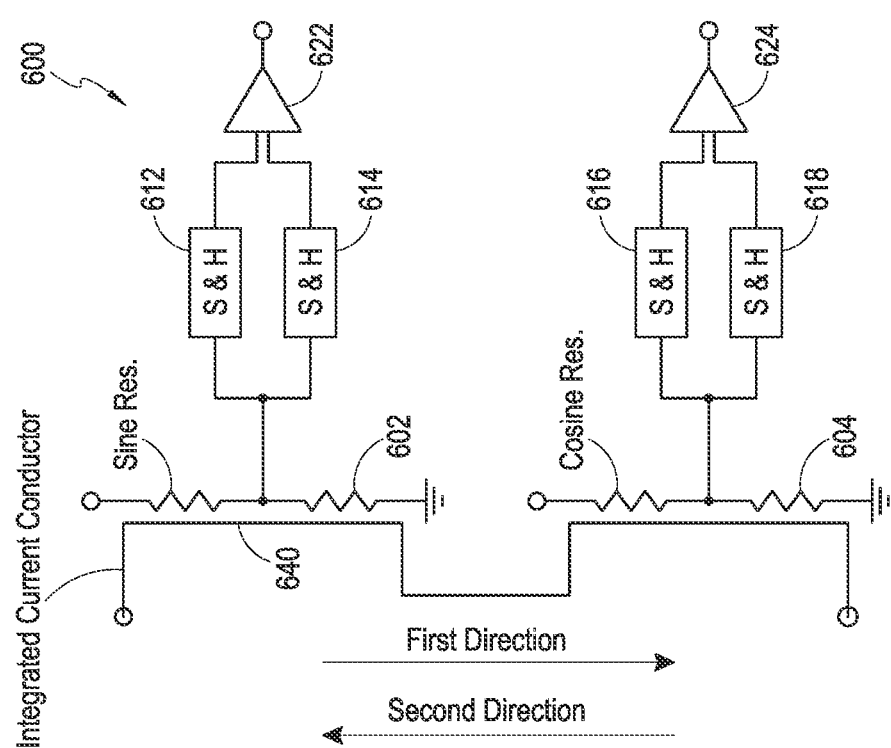

FIGS. 37 and 38 illustrate diagrams of example magnetic field detectors 600, 630 incorporating DC offset correction circuitry. Expanding upon what is discussed earlier in connection with FIG. 36, sensor offset cancellation can be implemented with the magnetoresistive sensors arranged in half bridge configurations. As illustrated in FIGS. 37 and 38, each half bridge 602, 604 of sine and cosine resistors can be coupled to sample and hold (S&H) circuits 612, 614, which are configured to sample and hold outputs of the half bridges 602, 604 in cases of positive and negative applied currents on the biasing conductor 640. For example, in a first phase, the output from the sine half bridge 602 is sampled and stored in a first sample and hold circuit 612 with a positive current at the biasing conductor 640. Then, in a second phase, the output from the sine half bridge 602 is sampled and stored in a second sample and hold circuit 614 with a negative current at the biasing conductor 640. The outputs from the sample and hold circuits 612, 614 can be subtracted by a differencing circuit 622 to produce a sine half bridge output that with the common DC offset removed.

Similarly, outputs from the cosine half bridge 604 can be sampled, stored, and processed to produce a cosine half bridge output with the common DC offset removed. Furthermore, the output signal from the sine and cosine half bridges 602, 604 can be amplified before and/or after the sample and hold circuits 612, 614, 616, 618. For example, buffers 626, 628 can be placed in a signal path between the half-bridges 602, 604, and the sample and hold circuits 612, 614, 616, 618. The DC offset correction disclosed herein can be implemented with the embodiments disclosed in the '059 Application as well as the embodiments including magnetoresistive sensors disclosed herein. In addition to the illustrated half-bridge configuration, a full bridge configuration with a differential output is also applicable and may be advantageous in certain applications. The differencing circuits 622, 624 can be implemented by analog circuits or by digital circuits. For example, for analog circuits, a differential amplifier can be used. For digital circuits, the DC offset correction can be implemented digitally by converting the two analog signals to digital values and performing the subtraction in digital domain.

The benefits of the disclosed DC offset correction techniques can be relatively large. For example, in real-world environments, there are often stray static magnetic fields that would otherwise need to be calibrated out. With the disclosed DC offset correction techniques, these static magnetic fields would automatically be compensated. In addition, one of the largest problems facing magnetic sensors is offset drift over time. With DC offset correction/cancellation, these drifts can automatically be compensated.

Figure 39:
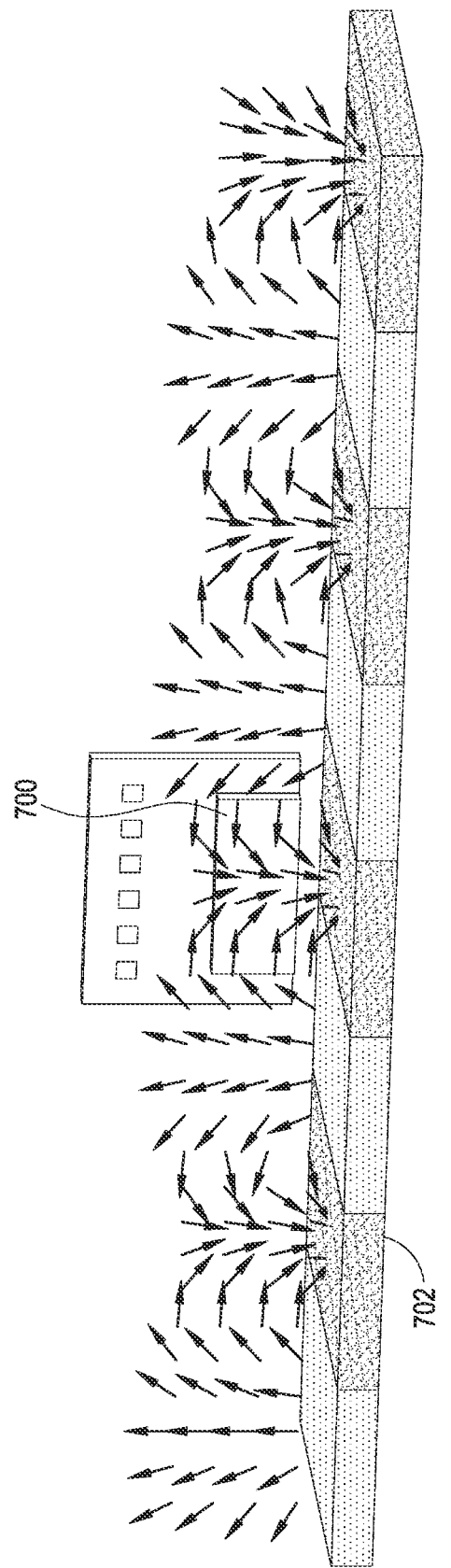
FIG. 39 illustrates a perspective view of a length detector and a magnetic scale.

FIG. 39 illustrates a perspective view of a length detector 700 and a magnetic scale 702. For the purposes of this disclosure, length, linear, and distance detecting or sensing refer to the same thing. Practical applications for such the length detector 700 include, but are not limited to, length sensing, length encoding, wheel encoding, relatively high precision linear position sensing, and the like. For example, linear sensing can be used for moving a camera lens for focusing and/or image stabilization. In another example, linear sensing can be used to determine the position of an engine valve. Other examples include sensing distance/motion for computer numerically controlled machines, conveyor belts, and the like. The magnetic scale 702 includes permanent magnets and can be integrated with or attached to an object to be measured, such as a conveyor belt. Sensing by the length detector 700 permits length or distances to be determined.

Figure 40:
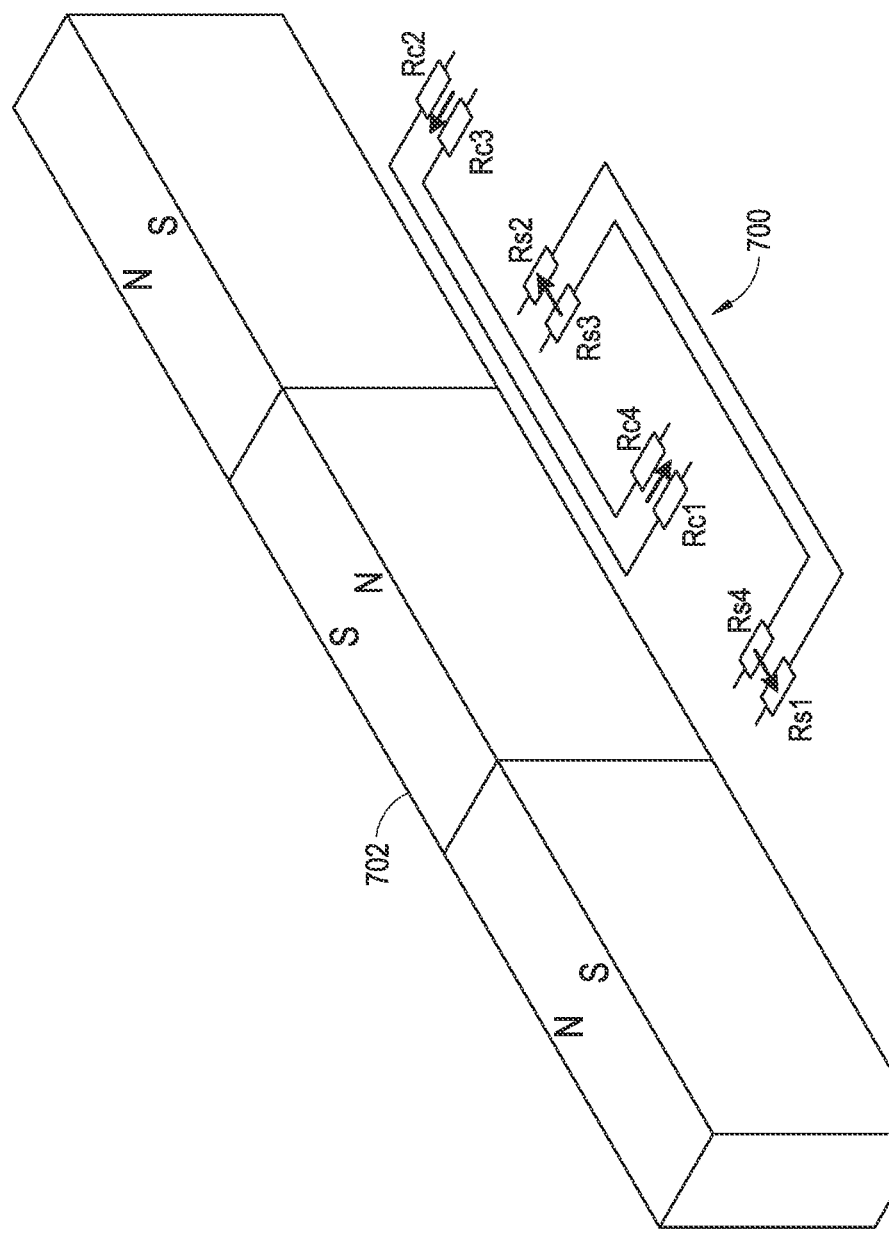
FIG. 40 illustrates a more detailed perspective view of the length detector and the magnetic scale.

FIG. 40 illustrates a more detailed perspective view of the length detector 700 and the magnetic scale 702. FIG. 40 also illustrates an example of the local magnetic fields for the magnetoresistive elements of the length detector 700. The distance between magnetoresistive elements of the length detector 700 should be matched to the pitch of the magnetic domains of the magnetic scale 702 being sensed.

Figure 41:
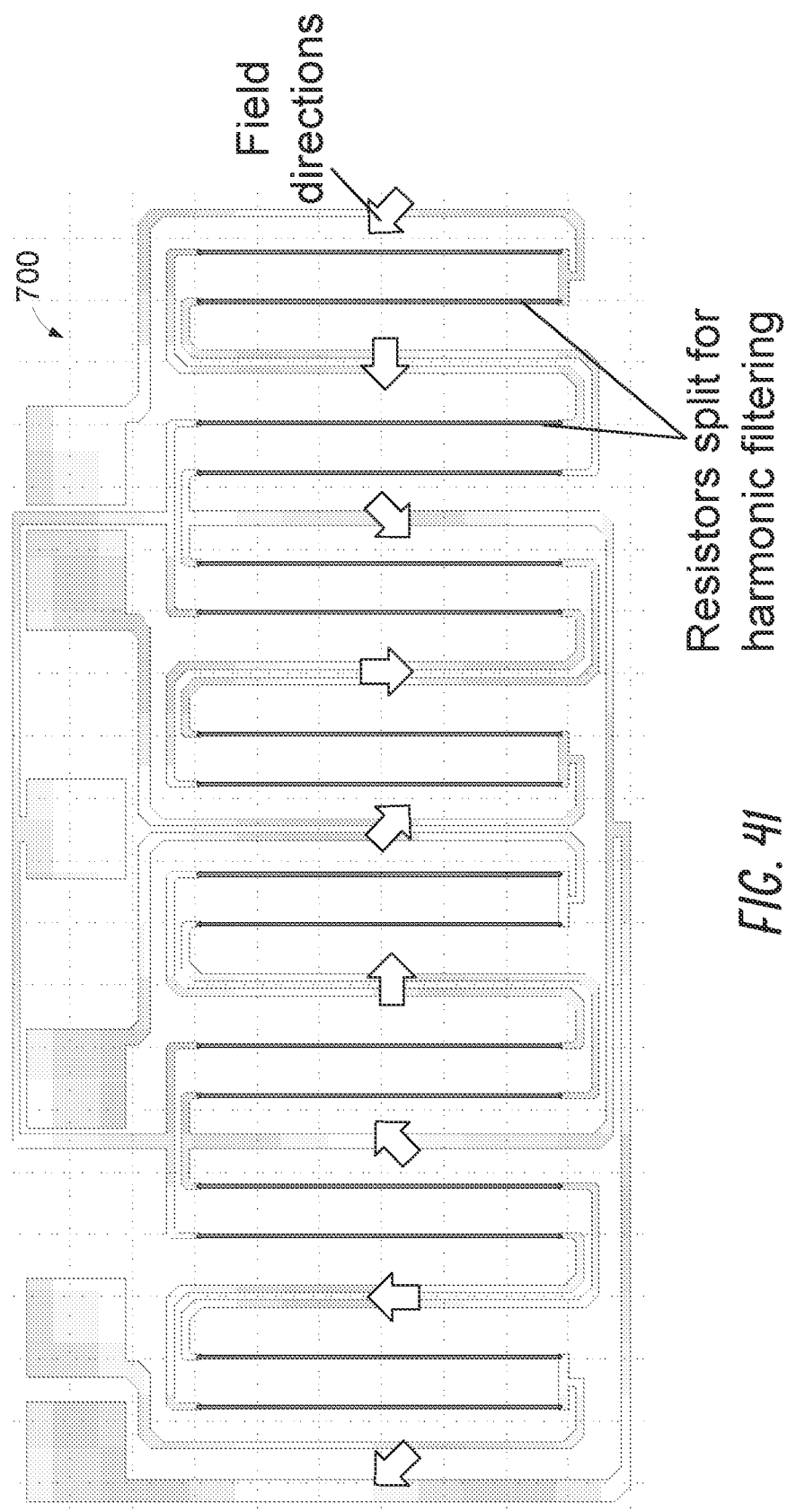
FIG. 41 illustrates an arrangement of magnetoresistive elements and example field directions for the length detector.
Figure 42:
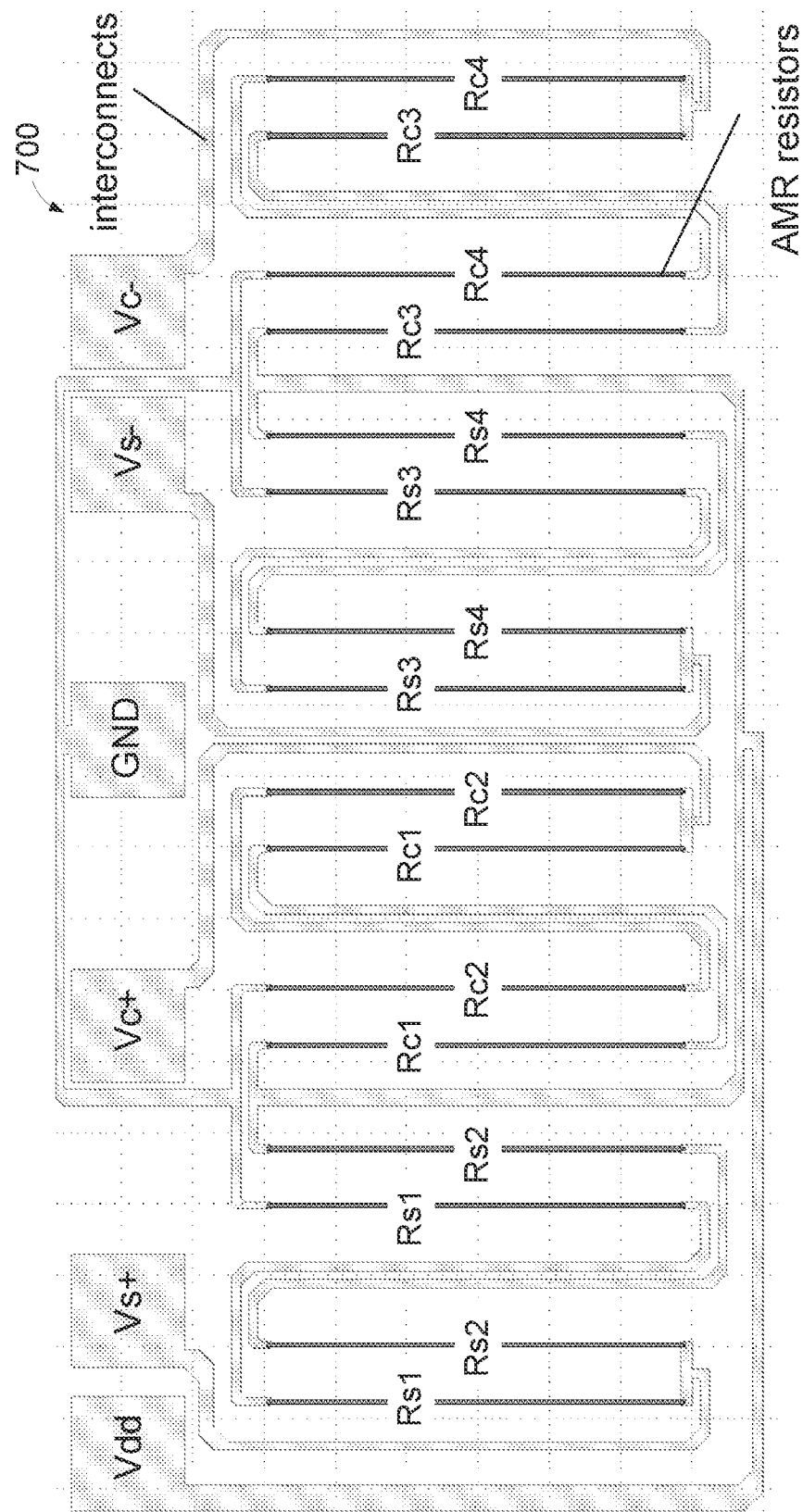
FIG. 42 illustrates an arrangement of magnetoresistive elements and associated connections for the length detector.
Figure 43:
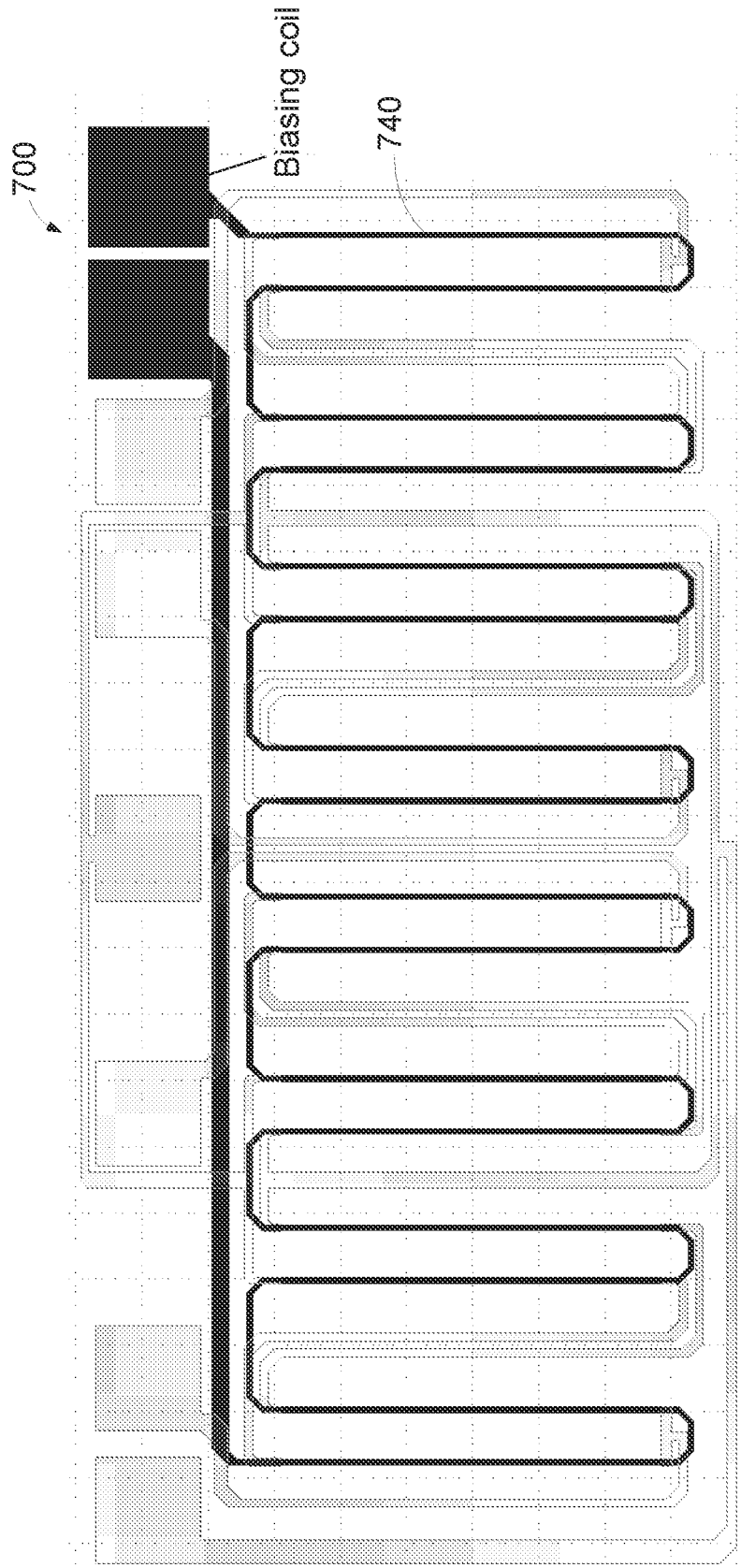
FIG. 43 illustrates a biasing conductor that can be used to generate a magnetic bias for perturbing the magnetic field for the magnetoresistive elements of the length detector.

FIGS. 41-43 shows an example application of a length or linear detector 700 implemented according to the disclosures herein. In this example, the sine and cosine magnetoresistive sensor bridges can be arranged so that half bridges of the sine and cosine bridges can be alternatingly placed along a line substantially parallel to the length detection axis. The length of the object of interest can include one or more magnetic elements (e.g., a permanent magnet) that generate magnetic fields to be detected by the alternatingly arranged sine and cosine bridges. The length detector can be implemented with a bias conductor or perturbation generator implemented in accordance with any of the principles and advantages discussed in the '059 application.

FIG. 41 illustrates an arrangement of magnetoresistive elements Rs1-Rs4, Rc1-Rc4 and example field directions for the length detector 700. Generally, the resistance for a leg of one or more bridge resistors (see FIG. 2) is split up into two or more magnetoresistive elements of a group and spaced apart to reduce undesired harmonics. In the illustrated embodiment, the resistance of each leg of a bridge or half bridge is split into a group of two or more magnetoresistive elements and spaced apart to reduce undesired harmonics. This is analogous to the splitting by angle of the magnetoresistive elements discussed earlier in connection with the magnetic field direction or angle detector 500. For example, the magnetoresistive element Rs1 is split into two portions for the length detector 700 as shown in FIG. 42.

FIG. 42 illustrates an arrangement of magnetoresistive elements Rs1-Rs4, Rc1-Rc4 and associated connections for the length detector 700. A differential configuration is shown, but the principles and advantages will also be applicable to a single-ended configuration.

FIG. 43 illustrates a biasing conductor or biasing coil 740 that can be used to generate a magnetic bias for perturbing the magnetic field for the magnetoresistive elements Rs1-Rs4, Rc1-Rc4 of the length detector 700. It should be noted that the magnetoresistive elements on opposite sides of a half-bridge have different current directions. For example, the direction of current for the magnetoresistive element Rs2 is opposite to that of the magnetoresistive element Rs1.

Figure 44:
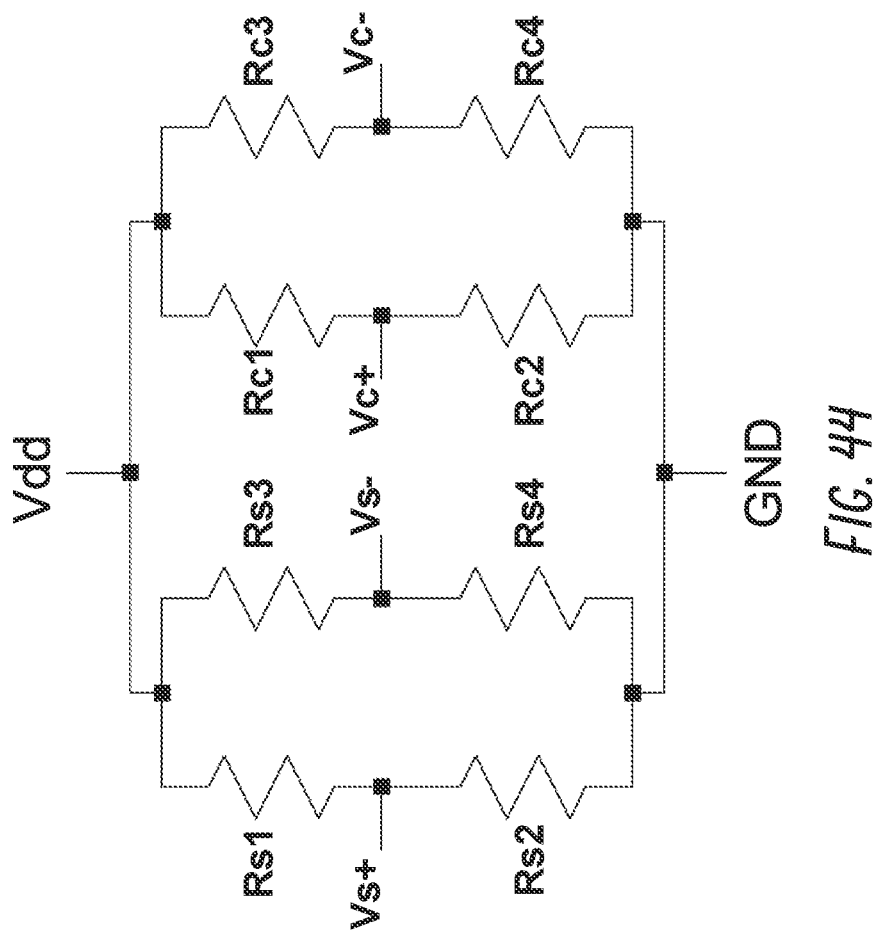
FIG. 44 illustrates a schematic diagram for the length detector.

FIG. 44 illustrates a schematic diagram for the four half bridges or two full bridges of the illustrated length detector 700. This provides differential sensing. For example, for differential sensing, a differencing circuit can subtract the output Vs− from Vs+. However, if a single-ended configuration is desired, the half bridges having outputs Vs− and Vc− can be eliminated. The differencing circuit can be implemented by a differential amplifier or can be implemented digitally by first converting the outputs Vs− and Vs+ to digital domain. After the difference results are obtained and converted to digital, the length or distance can be computed with reference to, for example, a count of the number of domains of the magnetic scale for relatively coarse distances and a lookup table for relatively fine distances between domains.

Figure 45:
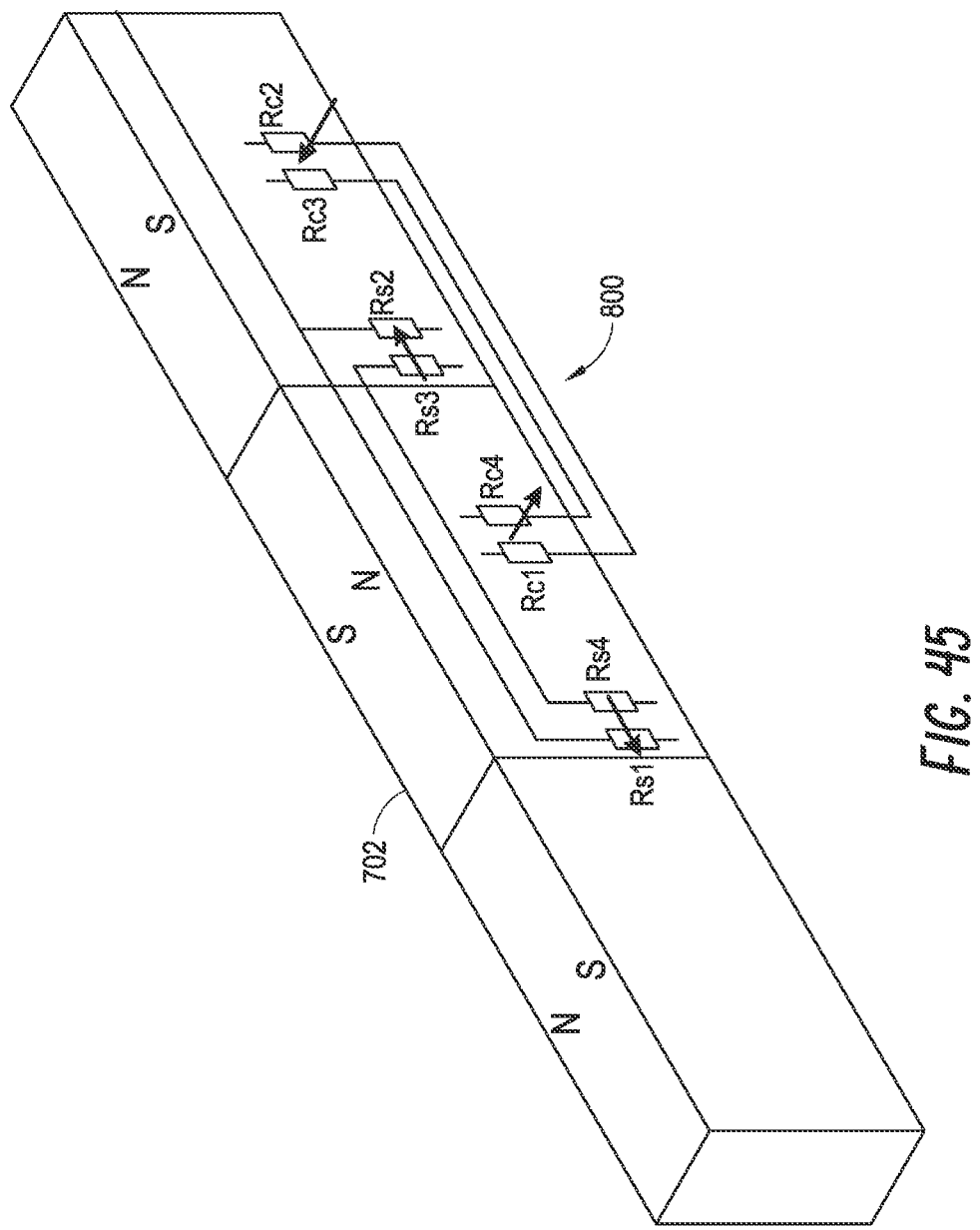
FIG. 45 illustrates a perspective view of an alternative embodiment for a length detector.

FIG. 45 illustrates a perspective view of an alternative embodiment for a length detector 800. Since the orientation of the magnetoresistive elements Rs1-Rs4, Rc1-Rc4 is different, the magnetoresistive elements Rs1-Rs4, Rc1-Rc4 respond differently than for the length detector 700. The illustrated configuration of FIG. 45 does function, however.

Figure 46:
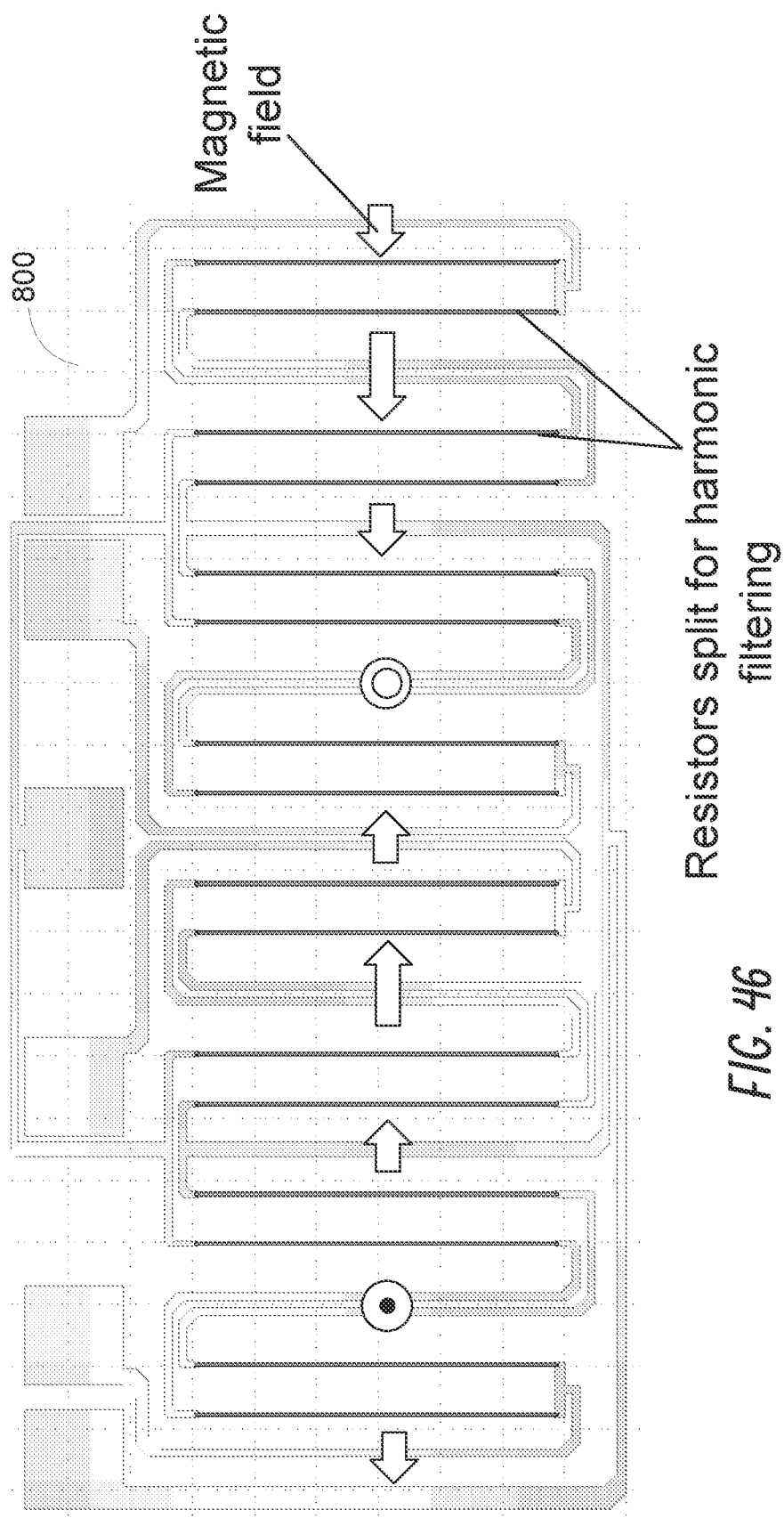
FIG. 46 illustrates an arrangement of magnetoresistive elements and example field directions for the alternative embodiment of the length detector.

FIG. 46 illustrates an arrangement of magnetoresistive elements Rs1-Rs4, Rc1-Rc4 and example field directions for the alternative embodiment of the length detector 800. The magnetic fields shown going directly through the drawing and indicated by a bullseye are out of plane. The magnetoresistive elements Rs1-Rs4, Rc1-Rc4 are relatively insensitive to out-of-plane magnetic fields.

Figure 47:
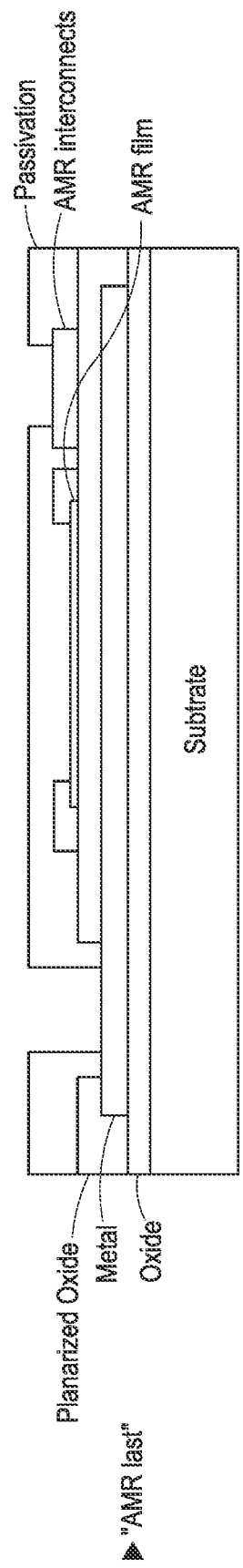
FIG. 47 illustrates a cross sectional view of one embodiment of a detector implemented in an integrated circuit.
Figure 48:
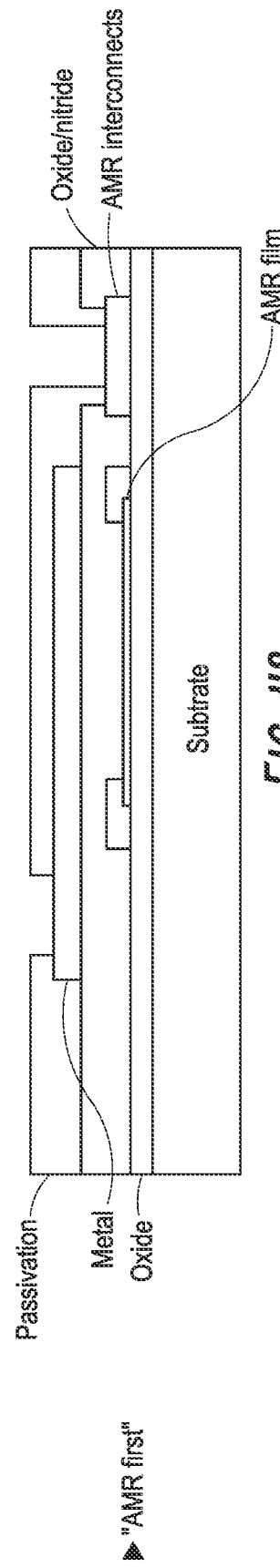
FIG. 48 illustrates a cross sectional view of an alternative embodiment of a detector implemented in an integrated circuit.

FIGS. 47 and 48 shows cross-sectional view of example detectors implemented in accordance with the disclosures herein. These cross sections show example structures that can be implemented with any of the magnetic detectors discussed herein. Any of the principles and advantages of these cross-sections can be implemented with any of the circuits discussed herein. Moreover, these cross sections illustrate that the detectors discussed herein can be monolithically integrated. As discussed above, the bias conductor or perturbation generator is isolated from the magnetoresistive elements by an insulating layer and can be placed above or below the magnetoresistive elements. The first illustrated example shows that the conductor (metal or biasing coil) is provided first or closer to the substrate, and the magnetoresistive elements (AMR) are provided later above the conductor. The second illustrated example shows that the magnetoresistive elements are provided first or closer to the substrate, and the conductor is provided later above the magnetoresistive elements. Other magnetoresistive materials, including, but not limited to GMR or TMR can alternatively be used. One embodiment includes an apparatus including at least one of a magnetic length or position detector, wherein the apparatus includes: a first differential magnetic field detector having a plurality of groups of one or more magnetoresistive elements each, wherein the plurality of groups are arranged in a bridge configuration to generate a first half-bridge output signal and a second half-bridge output signal, the plurality of groups comprising at least a first group and a second group, wherein the one or more magnetoresistive elements of the first group are placed at a first position to sense the magnetic field angle; wherein the one or more magnetoresistive elements of the second group are placed at a second position that is different from the first position to sense the magnetic field angle; and a perturbation generator configured to generate a magnetic field bias for the first differential magnetic field detector. One embodiment includes apparatus including at least one of a magnetic field distance detector or a length detector, wherein the apparatus includes: a first magnetic field detector having magnetoresistors arranged in a bridge or half-bridge configuration, wherein a resistance of at least one magnetoresistor is split up into two or more magnetoresistive elements each, wherein the two or more magnetoresistive elements are configured to carry current spaced apart from each other to reduce a presence of one or more harmonics in an output signal; and a perturbation generator configured to generate a magnetic field bias for the first magnetic field detector. In certain embodiments, each magnetoresistor of a bridge or half bridge of the first magnetic field detector can be split up into two or more magnetoresistive elements configured to carry current spaced apart from each other to reduce a presence of the one or more harmonics in the output signal. The magnetoresistive elements can be configured to carry current by being arranged in relatively elongated shapes that are spaced apart from each other, but other techniques, such as locating contacts, can be used to constrain the current flow.

Sensors or detectors implemented as disclosed herein with magnetoresistive elements, such as AMR elements, provide various advantages. For example, the configuration discussed above in FIGS. 47 and 48 provides the benefit of the output signal amplitude being a function of bias current and applied field. This functional relationship can be utilized to implement a standalone sensor to measure the magnitude of high fields in two axes, which allows relatively large field sensing. Furthermore, this functional relationship can be used to detect magnet fault by detecting field strength decay, which can be an additional functional safety feature. This safety feature can allow detecting and correcting decays resulting from, for example, demagnetization, destruction, removal, aging, and/or eccentricity of the magnet of interest. Another advantage of embodiments illustrated herein includes on-demand control of applying current to, or biasing, the conductor. For example, biasing the conductor with a current can be selectively performed (e.g., only when actual measurement is being performed) to save power. In such an example, the magnetoresistive sensors with no current on the conductor can perform its function of 180-degree sensing for certain operations, such as revolution counts, but occasionally a 360-degree sensing or detecting can be enabled by applying currents to the conductor to allow other operations, such as checking or verifying functions as well as performing safety checks.

Embodiments disclosed herein provide relatively high accuracy sensing, wide magnetic window, offset and offset drift cancelation, and magnet presence detection, can allow monolithic integration, or any combination thereof. Although AMR sensor examples are discussed regarding various example applications here, other magnetoresistive sensors, such as TMR or GMR sensors, can be used in a similar manner in implementing these various example applications. The disclosed herein can be used in various sectors, such as automotive, industrial, and instrumentation sectors that often use various sensors or detectors, such as servo motor communication sensor, servo position sensor, absolute and incremental rotary encoders, gear tooth sensors, actuator position controller, odd pole pair motor controller, absolute and incremental linear encoders, brushless DC motor controller, automotive steering wheel position sensor, camshaft angle sensors, crankshaft angle sensors, wheel sensors, and off-shaft angle sensor. In case of absolute and incremental rotary encoders, the disclosure herein allows implementation of vernier principle for absolute rotary encoder to get 360-degree off-shaft angle sensing.

Aspects of this disclosure can be implemented in various electronic devices. For instance, aspects of this disclosure can be implemented in any electronic device or electronic component that could benefit from a magnetoresistive sensor. As an example, aspects of this disclosure can be implemented in any electronic device or electronic component that could benefit from a magnetoresistive sensor. Examples of the electronic devices can include, but are not limited to, consumer electronic products, parts of the consumer electronic products, electronic test equipment, vehicular electronics systems, etc. Examples of the electronic devices can include, but are not limited to, computing devices, communications devices, electronic household appliances, automotive electronics systems, etc. Further, the electronic devices can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." Additionally, the words "herein," "above," "below," and words of similar import, when used in this application, shall refer to this application as a whole and not to any particular portions of this application. Where the context permits, words in the above Description of Certain Embodiments using the singular or plural number may also include the plural or singular number respectively. Where the context permits, the word "or" in reference to a list of two or more items is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

As used herein, the term "substantially" intends that the modified characteristic needs not be absolute, but is close enough so as to achieve the advantages of the characteristic.

The various operations of methods described above may be performed by any suitable means capable of performing the operations, such as various hardware and/or software component(s), circuits, and/or module(s). Generally, any operations illustrated in the figures may be performed by corresponding functional means capable of performing the operations.

The methods disclosed herein comprise one or more operations or actions for achieving the described method. The method steps and/or actions may be interchanged with one another without departing from the scope of the claims. In other words, unless a specific order of operations or actions is specified, the order and/or use of specific operations and/or actions may be modified without departing from the scope of the claims.

It is to be understood that the implementations are not limited to the precise configuration and components illustrated above. Various modifications, changes and variations may be made in the arrangement, operation and details of the methods and apparatus described above without departing from the scope of the implementations.

Although innovations have been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well.

Various embodiments have been described above. Although described with reference to these specific embodiments, the descriptions are intended to be illustrative and are not intended to be limiting. Various modifications and applications may occur to those skilled in the art.

The claims presented here are in single dependency format suited for presentation at the USPTO. However for other jurisdictions where multiply dependent claims can be presented without a claims fee penalty, it is to be understood that each claim may depend on any preceding claim of a same or similar claim type, except where that is clearly not technically feasible.

What is claimed is:

1. An apparatus comprising:
   a magnetic scale;
   a length detector comprising a plurality of magnetoresistive elements arranged in a first bridge and a second bridge, the first and second bridges configured to provide output signals indicative of a position of the magnetic scale; and
   a biasing conductor configured to generate a magnetic bias for perturbing a magnetic field at each of the magnetoresistive elements,
   wherein the magnetic scale comprises alternating north and south permanent magnets having a pitch, and wherein a distance between legs of the first and second bridges corresponds to the pitch.

2. The apparatus of claim 1, wherein the distance between legs of the first and second bridges matches the pitch.

3. The apparatus of claim 1, wherein each leg of the first and second bridges includes two or more of the magnetoresistive elements.

4. The apparatus of claim 3, wherein the two or more of the magnetoresistive elements in each leg of the first and second bridges are spaced apart to reduce undesired harmonics.

5. The apparatus of claim 1, wherein the first bridge includes a first half-bridge and a second half-bridge and the second bridge includes a third half-bridge and a fourth half-bridge, and wherein the first and second half-bridges are alternatingly arranged with the third and fourth half-bridges.

6. The apparatus of claim 1, wherein the magnetic scale and the length detector have a relative orientation such that a magnetic field generated by the magnetic scale varies in a range from 0° to 360° in a plane perpendicular to a plane defined by the length detector.

7. The apparatus of claim 1, wherein the first bridge is configured to generate a first positive output signal and a first negative output signal and the second bridge is configured to a second positive output signal and a second negative output signal.

8. The apparatus of claim 7, further comprising a first differencing circuit configured to subtract the first negative output signal from the first positive output signal and a second differencing circuit configured to subtract the second negative output signal from the second positive output signal.

9. The apparatus of claim 1, further comprising a length detection circuit configured to generate a measurement of a relative positioning of the magnetic scale and the length detector based on outputs of the first and second bridges.

10. The apparatus of claim 9, wherein the length detection circuit is further configured to generate the measurement of the relative positioning of the magnetic scale and the length detector based on a count of a number of domains of the magnetic scale.

11. The apparatus of claim 9, wherein the length detection circuit is further configured to generate the measurement of the relative positioning of the magnetic scale and the length detector based on a lookup table for measurements between domains of the magnetic scale.

12. The apparatus of claim 1, wherein the magnetic scale and the length detector have a relative orientation such that a magnetic field generated by the magnetic scale varies in a range from 0° to 360° in a plane defined by the length detector.

13. A method, comprising:
   generating a first half-bridge output signal, a second half-bridge output signal, a third half-bridge output signal, and a fourth half-bridge output signal from a plurality of magnetoresistive elements of a length detector, the magnetoresistive elements arranged in a first bridge including the first half-bridge and the second half-bridge and a second bridge including the third half-bridge and the fourth half-bridge;

generating a magnetic bias for perturbing a magnetic field at each of the magnetoresistive elements using a biasing conductor; and generating a measurement of a relative positioning of a magnetic scale and the length detector based on the first to fourth half-bridge output signals while the biasing conductor generates the magnetic bias, wherein each leg of the first to fourth half-bridges includes two or more of the magnetoresistive elements, and wherein the magnetic scale comprises alternating north and south permanent magnets having a pitch, and wherein a distance between the legs of the first and second bridges matches the pitch.

14. The method of claim 13, wherein the first and second half-bridges are alternatingly arranged with the third and fourth half-bridges.

15. The method of claim 13, wherein the two or more of the magnetoresistive elements in each leg of the first and second bridges are spaced apart to reduce undesired harmonics.

16. An apparatus, comprising:

a magnetic scale;

a length detector comprising a plurality of magnetoresistive elements arranged in a first bridge and a second bridge;

a biasing conductor configured to generate a magnetic bias for perturbing a magnetic field at the magnetoresistive elements; and a length detection circuit configured to generate a measurement of a relative positioning of the magnetic scale and the length detector based on outputs of the first and second bridges while the biasing conductor generates the magnetic bias, wherein each leg of the first and second bridges includes two or more of the magnetoresistive elements, wherein the magnetic scale comprises alternating north and south permanent magnets having a pitch, and wherein a distance between the legs of the first and second bridges corresponds to the pitch.

17. The apparatus of claim 16, wherein the first bridge includes a first half-bridge and a second half-bridge and the second bridge includes a third half-bridge and a fourth half-bridge, and wherein the first and second half-bridges are alternatingly arranged with the third and fourth half-bridges.

18. The apparatus of claim 16, wherein the distance between legs of the first and second bridges matches the pitch.

19. The apparatus of claim 16, wherein the length detection circuit is further configured to generate the measurement of the relative positioning of the magnetic scale and the length detector based on a count of a number of domains of the magnetic scale.

* * * * *